(12) United States Patent
Matsui et al.

(10) Patent No.: US 9,013,520 B2
(45) Date of Patent: Apr. 21, 2015

(54) DISPLAY DEVICE AND CONTROL METHOD THEREFOR

(71) Applicant: Panasonic Corporation, Osaka (JP)

(72) Inventors: Masafumi Matsui, Kyoto (JP); Shinya Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 181 days.

(21) Appl. No.: 13/778,220

(22) Filed: Feb. 27, 2013

(65) Prior Publication Data

US 2013/0335456 A1     Dec. 19, 2013

Related U.S. Application Data

(63) Continuation of application No. PCT/JP2010/005472, filed on Sep. 6, 2010.

(51) Int. Cl.
| | | |
|---|---|---|
| *G09G 5/10* | (2006.01) | |
| *G09G 3/30* | (2006.01) | |
| *G09G 3/20* | (2006.01) | |
| *H01L 27/32* | (2006.01) | |

(52) U.S. Cl.
CPC .. *G09G 3/30* (2013.01); *G09G 3/20* (2013.01); *H01L 27/3276* (2013.01)

(58) Field of Classification Search
CPC ............... G02F 1/136286; H03K 2005/00208; G09G 2300/0876; G09G 3/3655
USPC .......... 345/77, 204–215, 690; 349/39, 54, 73, 349/139, 192
See application file for complete search history.

(56) References Cited

U.S. PATENT DOCUMENTS

| | | | |
|---|---|---|---|
| 5,805,128 | A | 9/1998 | Kim et al. |
| 6,127,998 | A | 10/2000 | Ichikawa et al. |
| 7,012,586 | B2 | 3/2006 | Kageyama et al. |
| 7,907,137 | B2 | 3/2011 | Shirasaki et al. |

(Continued)

FOREIGN PATENT DOCUMENTS

| | | |
|---|---|---|
| CN | 1612192 | 5/2005 |
| CN | 1989539 | 6/2007 |

(Continued)

OTHER PUBLICATIONS

International Search Report, mailed Oct. 19, 2010, for International Application No. PCT/JP2010/005472.

(Continued)

*Primary Examiner* — Abbas Abdulselam
*Assistant Examiner* — Gerald Oliver
(74) *Attorney, Agent, or Firm* — Greenblum & Bernstein, P.L.C.

(57) ABSTRACT

A display device having pixels in a matrix where the pixels compose at least two drive blocks each including at least two pixel rows, includes a first signal line and a second signal line disposed in a pixel column direction. The first signal line is disposed in one of the left and right sides of the pixels of the corresponding column, and the second signal line is disposed in the other of the sides. Each of the pixels includes an organic EL element and a current control unit. Pixels in a kth drive block are connected to the first signal line via a first connecting line, and pixels in a (k+1)th drive block are connected to the second signal line via a second connecting line. The first signal line is disposed without crossing the second connecting line, and the second signal line is disposed without the first connecting line.

8 Claims, 29 Drawing Sheets

(56) References Cited

U.S. PATENT DOCUMENTS

| | | |
|---|---|---|
| 8,018,404 B2 | 9/2011 | Ono |
| 8,054,298 B2 | 11/2011 | Asano et al. |
| 8,248,331 B2 | 8/2012 | Ono |
| 8,258,513 B2 * | 9/2012 | Takizawa et al. ............... 257/59 |
| 8,363,192 B2 * | 1/2013 | Takahashi et al. ............ 349/139 |
| 8,432,338 B2 | 4/2013 | Ono |
| 2003/0111966 A1 | 6/2003 | Mikami et al. |
| 2005/0088103 A1 | 4/2005 | Kageyama et al. |
| 2006/0007215 A1 | 1/2006 | Tobita et al. |
| 2006/0044235 A1 | 3/2006 | Lee et al. |
| 2006/0221015 A1 | 10/2006 | Shirasaki et al. |
| 2009/0244055 A1 | 10/2009 | Asano et al. |
| 2010/0007645 A1 | 1/2010 | Ono |
| 2010/0259531 A1 | 10/2010 | Ono |
| 2011/0164024 A1 | 7/2011 | Ono |
| 2011/0181192 A1 | 7/2011 | Ono |
| 2011/0285760 A1 | 11/2011 | Ono |

FOREIGN PATENT DOCUMENTS

| | | |
|---|---|---|
| CN | 101546519 | 9/2009 |
| CN | 101548310 | 9/2009 |
| JP | 08-160468 | 6/1996 |
| JP | 09-134152 | 5/1997 |
| JP | 10-177162 | 6/1998 |
| JP | 10-253987 | 9/1998 |
| JP | 2003-186439 | 7/2003 |
| JP | 2006-003731 | 1/2006 |
| JP | 2006-284716 | 10/2006 |
| JP | 2007-304521 | 11/2007 |
| JP | 2008-122633 | 5/2008 |
| JP | 2009-237041 | 10/2009 |
| WO | 2008/152817 | 12/2008 |
| WO | 2010/041426 | 4/2010 |
| WO | 2010/100938 | 9/2010 |

OTHER PUBLICATIONS

China Office Action, mailed Dec. 3, 2014, for the corresponding Chinese Patent Application No. 201080067577.4 (together with English language translation of Search Report).

* cited by examiner

Pixel in odd block

Pixel in even block

Pixel in odd block

Pixel in even block

Pixel in odd block

Pixel in even block

Pixel in odd block

Pixel in even block

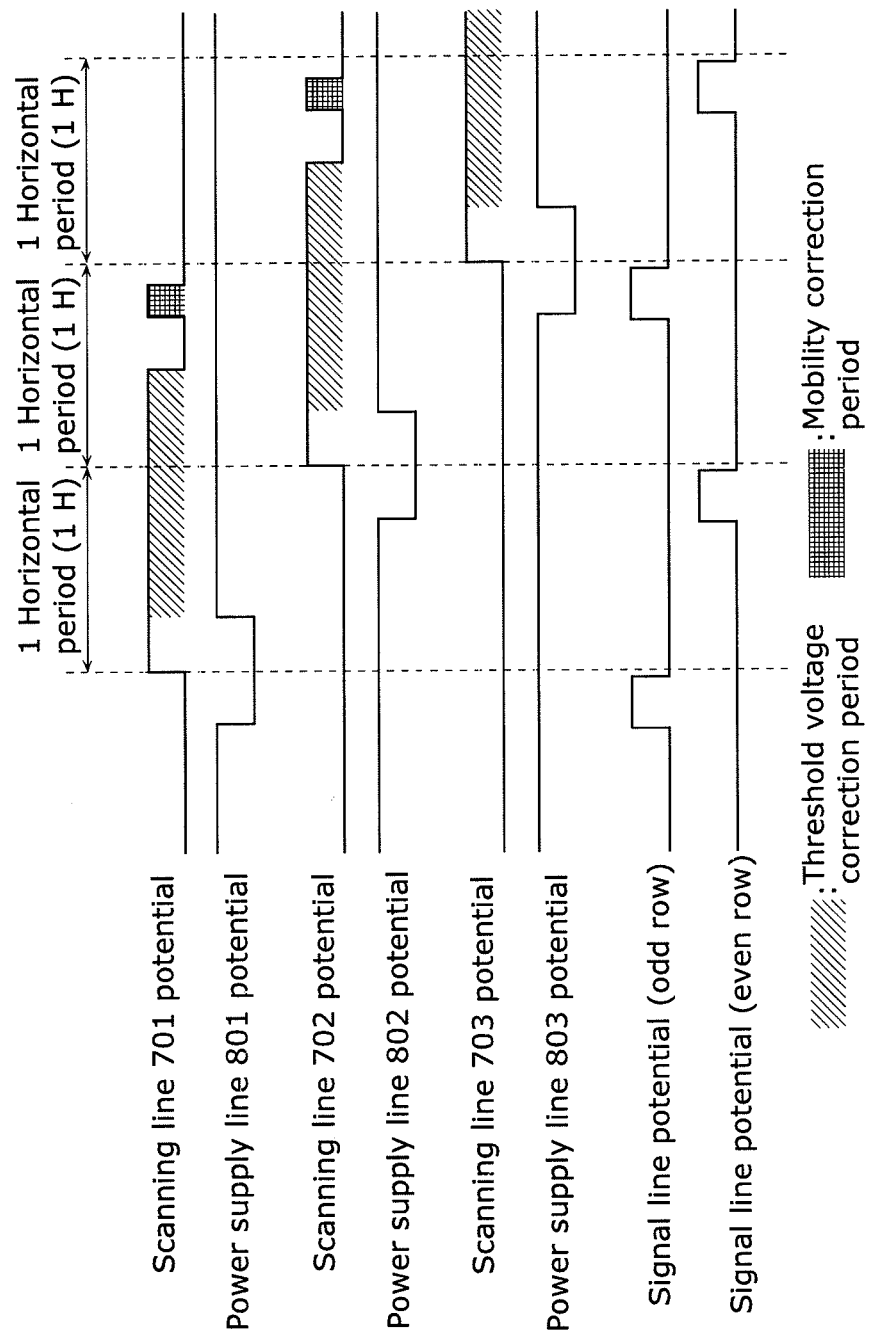

DISPLAY DEVICE AND CONTROL METHOD THEREFOR

CROSS REFERENCE TO RELATED APPLICATION

This is a continuation application of PCT Patent Application No. PCT/JP2010/005472 filed on Sep. 6, 2010, designating the United States of America. The entire disclosure of the above-identified application, including the specification, drawings and claims are incorporated herein by reference in its entirety.

FIELD

One or more exemplary embodiments disclosed herein relate generally to display devices and control methods therefore, and relate particularly to a display device using current-driven light-emitting elements and to a control method therefore.

BACKGROUND

Display devices using organic electroluminescence (EL) elements are well-known as display devices using current-driven light-emitting elements. An organic EL display device using such self-luminous organic EL elements does not require backlights needed in a liquid crystal display device and is best suited for increasing device thinness. Furthermore, since viewing angle is not restricted, practical application as a next-generation display device is expected. Furthermore, the organic EL elements used in the organic EL display device are different from liquid crystal cells which are controlled according to the voltage applied thereto, in that the luminance of the respective light-emitting elements is controlled according to the value of the current flowing thereto.

In the organic EL display device, the organic EL elements included in the pixels are normally arranged in rows and columns. In an organic EL display referred to as a passive-matrix organic EL display, an organic EL element is provided at each crosspoint between row electrodes (scanning lines) and column electrodes (data lines), and such organic EL elements are driven by applying a voltage equivalent to a data signal, between a selected row electrode and the column electrodes.

On the other hand, in an organic EL display device referred to as an active-matrix organic EL display device, a switching thin film transistor (TFT) is provided in each crosspoint between scanning lines and data lines, the gate of a drive element is connected to the switching TFT, the switching TFT is turned ON through a selected scanning line so as to input a data signal from a signal line to the drive element, and an organic EL element is driven by such drive element.

In the passive-matrix organic EL display device, only during the period in which each of the row electrodes (scanning lines) is selected does the organic EL element connected to the selected row electrode emit light. In contrast, in the active-matrix organic EL display device, it is possible to cause the organic EL element to emit light until a subsequent scan (selection). As such, a reduction in the luminance of the display is not incurred even when the number of scanning lines increases. Therefore, the active-matrix organic EL display device can be driven with low voltage and thus allows for reduced power consumption. However, in the active-matrix organic EL display device, due to variation in the characteristics of the drive transistors, the current flowing to the organic EL elements are different among the respective pixels thereby causing differences in luminance even when the same data signal is supplied, and thus there is the disadvantage of the occurrence of luminance unevenness.

In response to this problem, for example, Patent Literature (PTL) 1 discloses a method of compensating for the variation of characteristics for each pixel using a simple pixel circuit, as a method of compensating for the luminance unevenness caused by the variation in the characteristics of the drive transistors.

FIG. 26 is a block diagram showing the configuration of a conventional display device disclosed in PTL 1. A display device 500 shown in the figure includes a pixel array unit 502 and a drive unit which drives the pixel array unit 502. The pixel array unit 502 includes scanning lines 701 to 70m disposed on a row basis, and signal lines 601 to 60n disposed on a column basis, pixels 501 each of which is disposed on a part at which both a scanning line and a signal line cross, and power supply lines 801 to 80m disposed on a row basis. Furthermore, the drive unit includes a signal selector 503, a scanning line drive unit 504, and a power supply line drive unit 505.

The scanning line drive unit 504 performs line-sequential scanning of the pixels 501 on a per row basis, by sequentially supplying control signals on a horizontal cycle (1 H) to each of the scanning lines 701 to 70m. The power supply line drive unit 505 supplies, to each of the power supply lines 801 to 80m, power source voltage that switches between a first voltage and a second voltage, in accordance with the line-sequential scanning. The signal selector 503 supplies, to the signal lines 601 to 60n that are in columns, a standard voltage and a signal voltage which serves as an image signal, switching between the two voltages in accordance with the line-sequential scanning.

Here, two each of the respective signal lines 601 to 60n in columns are disposed per column; one of the signal lines supplies the standard voltage and the signal voltage to the pixels 501 in an odd row, and the other of the signal lines supplies the standard voltage and the signal voltage to the pixels 501 in an even row.

FIG. 27 is a circuit configuration diagram for a pixel included in the conventional display device disclosed in PTL 1. It should be noted that the figure shows the pixel 501 in the first row and the first column. The scanning line 701, the power supply line 801, and the signal lines 601 are provided to this pixel 501. It should be noted that one out of the two lines of the signal lines 601 is connected to this pixel 501. The pixel 501 includes a switching transistor 511, a drive transistor 512, a holding capacitive element 513, and a light-emitting element 514. The switching transistor 511 has a gate connected to the scanning line 701, one of a source and a drain connected to the signal line 601, and the other connected to the gate of the drive transistor 512. The drive transistor 512 has a source connected to the anode of the light-emitting element 514 and a drain connected to the power supply line 801. The light-emitting element 514 has a cathode connected to a grounding line 515. The holding capacitive element 513 is connected to the source and gate of the drive transistor 512.

In the above-described configuration, the power supply line drive unit 505 switches the voltage of the power supply line 801, from a first voltage (high-voltage) to a second voltage (low-voltage), when the voltage of the signal line 601 is the standard voltage. Likewise, when the voltage of the signal line 601 is the standard voltage, the scanning line drive unit 504 sets the voltage of the scanning line 701 to an "H" level and causes the switching transistor 511 to be in a conducting state so as to apply the standard voltage to the gate of the drive transistor 512 and set the source of the drive transistor 512 to the second voltage which is a reset voltage. With the above-described operation, preparation for the correction of a threshold voltage $V_{th}$ of the drive transistor 512 is completed. Next, in the correction period before the voltage of the signal line 601 switches from the standard voltage to the signal voltage, the power supply line drive unit 505 switches the voltage of the power supply line 801, from the second voltage to the first voltage, and causes a voltage equivalent to the threshold voltage $V_{th}$ of the drive transistor 512 to be held in the holding capacitive element 513. Next, the power supply line drive unit 505 sets the voltage of the switching transistor 511 to the "H" level and causes the signal voltage to be held in the holding capacitive element 513. Specifically, the signal voltage is added to the previously held voltage equivalent to the threshold voltage $V_{th}$ of the drive transistor 512, and written into the holding capacitive element 513. Then, the drive transistor 512 receives a supply of current from the power supply line 801 to which the first voltage is being applied, and supplies the light-emitting element 514 with a drive current corresponding to the held voltage.

In the above-described operation, the period of time during which the standard voltage is applied to the respective signal lines is prolonged through the placement of two of the signal lines 601 in every column. This secures the initialization period of the drive transistor 512 and the correction period for holding the voltage equivalent to the threshold voltage $V_{th}$ in the holding capacitive element 513.

FIG. 28 is an operation timing chart for the display device disclosed in PTL 1. The figure describes, sequentially from the top, the signal waveforms of: the scanning line 701 and the power supply line 801 of the first line; the scanning line 702 and the power supply line 802 of the second line; the scanning line 703 and the power supply line 803 of the third line; the signal line allocated to the pixel of an odd row; and the signal line allocated to the pixel of an even row. The scanning signal applied to the scanning lines sequentially shifts 1 line for every 1 horizontal period (1 H). The scanning signal applied to the scanning lines for one line includes two pulses. The time width of the first pulse is long at 1 H or more. The time width of the second pulse is narrow and is part of 1 H. The first pulse corresponds to the above-described initialization period and the threshold voltage correction period, and the second pulse corresponds to a signal voltage sampling period and a mobility correction period. Furthermore, the power source pulse supplied to the power supply lines also shifts 1 line for every 1 H cycle. In contrast, the signal voltage is applied once every 2 H to the respective signal lines, and thus it is possible to ensure that the period of time during which the standard voltage is applied is 1 H or more.

In this manner, in the conventional display device disclosed in PTL 1, even when there is a variation in the threshold voltage $V_{th}$ of the drive transistor 512 for each pixel, by ensuring a sufficient initialization period and threshold voltage correction period, the variation is canceled on a pixel basis, and unevenness in the luminance of an image is inhibited.

CITATION LIST

PTL

[PTL1] Japanese Unexamined Patent Application Publication No. 2008-122633

SUMMARY

Technical Problem

However, in the conventional display device disclosed in PTL 1, it is difficult to sufficiently secure a drive transistor initialization period and a period in which the threshold voltage of the drive transistor can be precisely corrected.

In view of the aforementioned problem, one non-limiting and exemplary embodiment provides (i) a display device in which the drive transistor initialization period and the period in which the threshold voltage of the drive transistor can be precisely corrected are secured, and (ii) a method of controlling the display device. In addition, one non-limiting and exemplary embodiment provides a display device in which the output load of a drive circuit is reduced, and a method of controlling the display device.

Solution to Problem

In one general aspect, the techniques disclosed herein feature a display device including pixels arranged in a matrix having m rows and n columns, m being an integer greater than or equal to 4, and n being an integer greater than or equal to 1, the display device including: a first signal line and a second signal line that are disposed, in a column direction, corresponding to every m pixels that correspond to the respective n columns in the matrix, the first signal line and the second signal line being for applying, to the pixels, a signal voltage which determines luminance of the pixels, and the m pixels being included in the pixels, a first power source line and a second power source line; and a scanning line disposed in each of the rows, wherein the pixels compose at least two drive blocks each of which includes at least two of the rows, each of the pixels includes: a light-emitting element that includes terminals, one of the terminals being connected to the second power source line, and the light-emitting element emitting light according to a flow of a signal current corresponding to the signal voltage; and a current control unit connected to the first power source line and the other of the terminals of the light-emitting element, and configured to convert the signal voltage into the signal current, each of the pixels in a kth drive block of the drive blocks further includes a first switching transistor that includes a gate connected to the scanning line, one of a source and drain connected to the first signal line via a first connecting line, and the other of the source and the drain connected to the current control unit, the first switching transistor switchably interconnecting the first signal line and the current control unit, k being a positive integer, each of the pixels in a (k+1)th drive block of the drive blocks further includes a second switching transistor that includes a gate connected to the scanning line, one of a source and a drain connected to the second signal line via a second connecting line, and the other of the source and the drain connected to the current control unit, the second switching transistor switchably interconnecting the second signal line and the current control unit, the first signal line is disposed on one of the left side and the right side of the first switching transistor and the second switching transistor included in the pixels in the corresponding column, the second signal line is disposed on the other of the left side and the right side of the first switching transistor and the second switching transistor included in the pixels in the corresponding column, the first connecting line is disposed without crossing with the second signal line, the second connecting line is disposed without crossing with the first signal line, at least one of a threshold voltage detection period and an initialization period is provided in common for the pixels in a same one of the drive blocks, and at least one of the threshold voltage detection period and the initialization period provided in common in the same one of the drive blocks is provided independently for the pixels in different ones of the drive blocks, the threshold voltage detection period being a period during which a threshold voltage of the current control unit is detected, and the initialization period being a period during which the current control unit is initialized, in an ith column in the matrix, where i is an integer satisfying $1 \leq i \leq n-1$: the first signal line is disposed on the one of the left side and the right side of the first switching transistor and the second switching transistor included in the pixels in the corresponding column; and the second signal line is disposed on the other of the left side and the right side of the first switching transistor and the second switching transistor included in the pixels in the corresponding column, and in an (i+1)th column in the matrix: the first signal line is disposed on the other of the left side and the right side of the first switching transistor and the second switching transistor included in the pixels in the corresponding column; and the second signal line is disposed on the one of the left side and the right side of the first switching transistor and the second switching transistor included in the pixels in the corresponding column.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the display device and the control method therefore according to one or more exemplary embodiments or features disclosed herein, the drive transistor initialization periods and the threshold voltage correction periods can be made uniform within a drive block, and thus the initialization period and the correction period can take a large part of a 1-frame period. With this, a precisely corrected drive current flows to the light-emitting elements, and thus image display quality improves. Furthermore, grouping into drive blocks allows the number times that the signal level outputted by the control unit is switched in the aforementioned periods to be reduced.

In addition, since there is no wire crossing between two signal lines, there is no interlayer capacitance between the signals, and power consumption accompanying the charging and discharging of signal lines can be reduced. In addition, the absence of interlayer capacitance suppresses potential fluctuation in a signal line during threshold voltage detection and in the initialization period, and improves threshold voltage detection precision. In other words, precise threshold voltage correction can be realized.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 28 is an operation timing chart for the display device disclosed in PTL 1.

DESCRIPTION OF EMBODIMENTS (Underlying Knowledge Forming Basis of the Present Disclosure)

As previously described, in response to the aforementioned problem, PTL 1 discloses a method of compensating for the variation of characteristics for each pixel using a simple pixel circuit, as a method of compensating for the luminance unevenness caused by the variation in the characteristics of the drive transistors. This is discussed in detail below.

In the conventional display device disclosed in PTL 1, there is frequent turning ON and OFF of the signal level of the scanning lines and power supply lines provided to each of the pixel rows. For example, the initialization period and the threshold voltage correction period need to be set for each of the pixel rows. Furthermore, when sampling signal voltage from a signal line via a switching transistor, light-emitting periods need to be provided successively. Therefore, the initialization period, the threshold voltage correction timing, and light-emission timing for each pixel row need to be set. As such, since the number of rows increases with an increase in the area of a display panel, the signals outputted from each drive circuit increases and the frequency for the signal switching thereof rises, and the signal output load of the scanning line drive circuit and the power supply line drive circuit increases.

Furthermore, in the conventional display device disclosed in PTL 1, the initialization period of the drive transistor and the correction period for the threshold voltage $V_{th}$ is under 2 H, and thus there is a limitation for a display device in which high-precision correction is required.

In addition, in the conventional display device disclosed in PTL 1, wire crossing occurs between one signal line and another signal line. Specifically, out of two signal lines provided corresponding to an arbitrary column, wire crossing occurs between the signal line disposed near the column and a wire connecting the signal line disposed far from the column with a pixel belonging to the column.

At this time, parasitic capacitance is generated between the one signal line and the other signal line, at the location at which the wire crossing occurs. Here, parasitic capacitance is the capacitance (hereafter also referred to as interlayer capacitance) generated between wires formed in two different layers in a multi-layer substrate.

Figure 26:
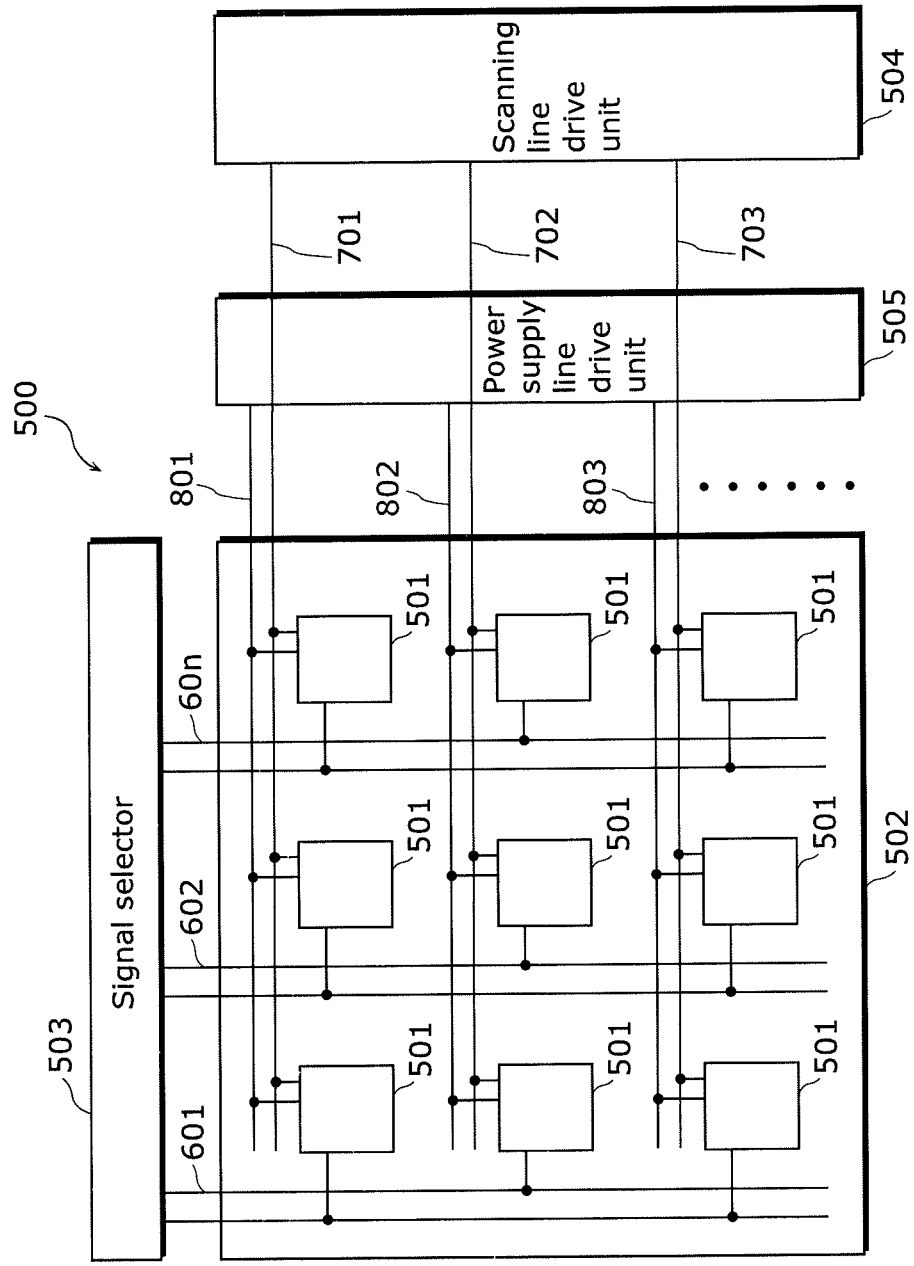
FIG. 26 is a block diagram showing the configuration of a conventional display device disclosed in PTL 1.

For example, with the display device shown in FIG. 26, in the pixels in the odd rows, such parasitic capacitance occurs between all of the signal lines corresponding to such pixels and the other signal lines. As such, for example, when the number of pixels is doubled, the total capacitance of the parasitic capacitance is also doubled. In other words, when the area of the display panel is increased, the total capacitance of the parasitic capacitance also increases.

In the display device disclosed in PTL 1, in order to supply a desired signal voltage to each pixel, it is necessary to charge and discharge the aforementioned parasitic capacitance on a per horizontal period basis. Therefore, in the display device disclosed in PTL 1, it is necessary to charge and discharge an extremely large amount of parasitic capacitance per horizontal period.

As a result, the conventional display device disclosed in PTL 1 has the problem that power consumption increases.

Furthermore, in the conventional display device disclosed in PTL 1, the standard voltage fluctuates due to the parasitic capacitance generated between the one signal line and the other signal line described above. Specifically, in a period in which the standard voltage is supplied to the one signal line and the signal voltage is supplied to the other signal line, that is, when the pixels connected to the one signal line are in the threshold voltage correction period and pixels connected to the other signal line are in a writing period, the voltage fluctuation of the other signal line is transmitted to the one signal line via the aforementioned parasitic capacitance.

As a result, since the voltage level of the standard voltage fluctuates in the one signal line, there is the problem of deterioration of threshold voltage detection precision in the pixels connected to the one signal line.

In order to solve the aforementioned problems, the display device according to an exemplary embodiment disclosed herein is a display device including pixels arranged in a matrix having m rows and n columns, m being an integer greater than or equal to 4, and n being an integer greater than or equal to 1, the display device including: a first signal line and a second signal line that are disposed, in a column direction, corresponding to every m pixels that correspond to the respective n columns in the matrix, the first signal line and the second signal line being for applying, to the pixels, a signal voltage which determines luminance of the pixels, and the m pixels being included in the pixels, a first power source line and a second power source line; and a scanning line disposed in each of the rows, wherein the pixels compose at least two drive blocks each of which includes at least two of the rows, each of the pixels includes: a light-emitting element that includes terminals, one of the terminals being connected to the second power source line, and the light-emitting element emitting light according to a flow of a signal current corresponding to the signal voltage; and a current control unit connected to the first power source line and the other of the terminals of the light-emitting element, and configured to convert the signal voltage into the signal current, each of the pixels in a kth drive block of the drive blocks further includes a first switching transistor that includes a gate connected to the scanning line, one of a source and drain connected to the first signal line via a first connecting line, and the other of the source and the drain connected to the current control unit, the first switching transistor switchably interconnecting the first signal line and the current control unit, k being a positive integer, each of the pixels in a (k+1)th drive block of the drive blocks further includes a second switching transistor that includes a gate connected to the scanning line, one of a source and a drain connected to the second signal line via a second connecting line, and the other of the source and the drain connected to the current control unit, the second switching transistor switchably interconnecting the second signal line and the current control unit, the first signal line is disposed on one of the left side and the right side of the first switching transistor and the second switching transistor included in the pixels in the corresponding column, the second signal line is disposed on the other of the left side and the right side of the first switching transistor and the second switching transistor included in the pixels in the corresponding column, the first connecting line is disposed without crossing with the second signal line, the second connecting line is disposed without crossing with the first signal line, at least one of a threshold voltage detection period and an initialization period is provided in common for the pixels in a same one of the drive blocks, and at least one of the threshold voltage detection period and the initialization period provided in common in the same one of the drive blocks is provided independently for the pixels in different ones of the drive blocks, the threshold voltage detection period being a period during which a threshold voltage of the current control unit is detected, and the initialization period being a period during which the current control unit is initialized.

According to this aspect, the drive transistor initialization periods as well as the threshold voltage correction periods can be made uniform within the drive block, and thus the initialization period and the threshold voltage correction period can occupy a large part of a 1 frame period. With this, a precisely corrected drive current flows to the light-emitting elements, and thus image display quality improves. Furthermore, grouping into drive blocks allows the number times that the signal level outputted by the control unit is switched in the aforementioned periods to be reduced.

In addition, since there is no wire crossing between two signal lines, there is no interlayer capacitance between the signals, and power consumption accompanying the charging and discharging of signal lines can be reduced. In addition, the absence of interlayer capacitance suppresses potential fluctuation in a signal line during threshold voltage detection and in the initialization period, and improves threshold voltage detection precision. In other words, precise threshold voltage correction can be realized.

For example, in the display device, in an ith column in the matrix, where i is an integer satisfying $1 \leq i \leq n-1$: the first signal line may be disposed on the one of the left side and the right side of the first switching transistor and the second switching transistor included in the pixels in the corresponding column; and the second signal line may be disposed on the other of the left side and the right side of the first switching transistor and the second switching transistor included in the pixels in the corresponding column, and in an (i+1)th column in the matrix: the first signal line may be disposed on the other of the left side and the right side of the first switching transistor and the second switching transistor included in the pixels in the corresponding column; and the second signal line may be disposed on the one of the left side and the right side of the first switching transistor and the second switching transistor included in the pixels in the corresponding column.

According to this aspect, two first signal lines or two second signal lines are disposed between adjacent columns. Stated differently, a first signal line and a second signal line are never disposed side by side in between adjacent columns. Accordingly, since the parasitic capacitance generated between the first signal line and the second signal line can be further reduced, the effect of potential fluctuation in the signal line supplying the signal voltage on the signal line supplying the voltage for detecting the threshold voltage is further reduced. Therefore, the threshold voltage can be corrected even more precisely.

For example, the display device may further include a first control line disposed in each of the rows, and connected to the current control unit, wherein the first control line may be connected to the pixels in the same one of the drive blocks and not connected to the pixels in the different ones of the drive blocks.

According to this aspect, the timings for the signals of the respective first control lines can be made uniform within a drive block. Therefore, the load on the drive circuit outputting the signals for controlling the drive current flowing to the light-emitting elements is reduced. Furthermore, through the above-described grouping into drive blocks and the two signal lines provided for each pixel column, the control operation period of the current control unit performed through the first control lines can occupy a large part of a 1-frame period, and thus a highly precise drive current flows to the light-emitting elements and image display quality can be improved.

For example, the display device may further include a second control line disposed in each of the rows, and connected to the current control unit, wherein the current control unit may include: a drive transistor that includes a gate, a source, and a drain, one of the source and the drain being connected to the other of the terminals of the light-emitting element, and the drive transistor converting the signal voltage applied between the gate and the source of the drive transistor into the signal current which is a drain current of the drive transistor; a first capacitive element that includes terminals, one of the terminals being connected to the gate of the drive transistor, and the other of the terminals being connected to the source of the drive transistor; a second capacitive element that includes terminals, one of the terminals being connected to the source of the drive transistor, and the other of the terminals being connected to the first control line; and a third switching transistor that includes a gate connected to the second control line, and a source and a drain that are inserted between and connected to the first power source line and the other of the terminals of the light-emitting element, and switches between ON and OFF states of the drain current of the drive transistor, the gate of the first switching transistor may be connected to the scanning line, the one of the source and the drain of the first switching transistor may be connected to the first signal line, and the other of the source and the drain of the first switching transistor may be connected to the gate of the drive transistor, and the gate of the second switching transistor may be connected to the scanning line, the one of the source and the drain of the second switching transistor may be connected to the second signal line, and the other of the source and the drain of the second switching transistor may be connected to the gate of the drive transistor.

According to this aspect, the current control unit includes a drive transistor which converts a signal voltage to a signal current, a first capacitive element which holds a voltage corresponding to the signal voltage, a second capacitive element which stabilizes gate and source potentials of the drive transistor, and a third switching transistor which switches drain current ON and OFF. Through the above-described circuit configuration of the current control unit as well as the disposition of the control lines, scanning lines, and signal lines to the respective pixels that are grouped into drive blocks, the drive transistor threshold voltage correction periods and the timings thereof can be made uniform within the same drive block. Therefore, the load on the drive circuit which outputs signals for controlling current paths, and controls signal voltages is reduced. In addition, through the above-described grouping into drive blocks and the two signal lines arranged for every pixel column, the threshold voltage correction period of the drive transistor can occupy a large part of a 1 frame period Tf which is the time in which all the pixels are refreshed. This is because the threshold voltage correction period is provided in the (k+1)th drive block in the period in which the luminance signal is sampled in the kth drive block. Therefore, the threshold voltage correction period is not divided on a per pixel row basis, but is divided on a per drive block basis. Therefore, as the display area is increased, a long relative threshold voltage correction period can be set with respect to 1 frame period, without allowing light emission duty to decrease with the increase in the display area. With this, a drive current based on a precisely corrected signal voltage flows to the light-emitting elements, and thus display quality improves. In addition, the third switching transistor allows the light emission operation of the light-emitting element to be controlled independently of the timing for applying the signal voltage to the drive transistor.

For example, in the display device, the second control line may be connected to the pixels in the same one of the drive blocks and not connected to the pixels in the different ones of the drive blocks.

According to this aspect, by simultaneous controlling the third switching transistors within the same block through the second control lines, simultaneous light emission within the same block can be implemented, and the load on the drive circuit outputting the signal from the second control lines is reduced.

For example, the display device may further include a second control line disposed in each of the rows, and connected to the current control unit, wherein the current control unit may include: a drive transistor that includes a gate, a source, and a drain, one of the source and the drain being connected to the other of the terminals of the light-emitting element, and the drive transistor converting the signal voltage applied between the gate and the source of the drive transistor into the signal current which is a drain current of the drive transistor; a third capacitive element that includes terminals, one of the terminals being connected to the gate of the drive transistor, and the other of the terminals being connected to the source of the drive transistor; a fourth capacitive element that includes terminals, one of the terminals being connected to the source of the drive transistor, and the other of the terminals being connected to the first control line; and a fourth switching transistor that includes a gate connected to the second control line, one of a source and a drain connected to the other of the terminals of the third capacitive element, and the other of the source and drain connected to the source of the drive transistor, the gate of the first switching transistor may be connected to the scanning line, the one of the source and the drain of the first switching transistor may be connected to the first signal line, and the other of the source and the drain of the first switching transistor may be connected to the gate of the drive transistor, and the gate of the second switching transistor may be connected to the scanning line, the one of the source and the drain of the second switching transistor may be connected to the second signal line, and the other of the source and the drain of the second switching transistor may be connected to the gate of the drive transistor.

According to this aspect, the current control unit includes a drive transistor which converts a signal voltage to a signal current, a third capacitive element which holds a voltage corresponding to the signal voltage, a fourth capacitive element which stabilizes gate and source potentials of the drive transistor, and a fourth switching transistor which switches between conduction and non-conduction between the drive transistor and the third capacitive element. Through the above-described circuit configuration of the current control unit as well as the disposition of the control lines, scanning lines, and signal lines to the respective pixels that are grouped into drive blocks, the drive transistor threshold voltage correction periods and the timings thereof can be made uniform within the same drive block. Therefore, the load on the drive circuit which outputs signals for controlling current paths, and controls signal voltages is reduced. In addition, through the above-described grouping into drive blocks and the two signal lines arranged for every pixel column, the threshold voltage correction period of the drive transistor can occupy a large part of a 1 frame period Tf which is the time in which all the pixels are refreshed. With this, a drive current based on a precisely corrected signal voltage flows to the light-emitting elements, and thus display quality improves. Furthermore, the fourth switching transistor enables a precise voltage corresponding to the signal voltage to be held in the third capacitive element.

For example, in the display device, the current control unit may include: a drive transistor that includes a gate, a source, and a drain, one of the source and the drain being connected to the first power source line, the other of the source and the drain being connected to the other of the terminals of the light-emitting element, and the drive transistor converting the signal voltage applied between the gate and the source of the drive transistor into the signal current; a fifth capacitive element that includes terminals, one of the terminals being connected to the gate of the drive transistor; a fifth switching transistor that includes a gate connected to the scanning line, one of a source and a drain connected to the one of the terminals of the fifth capacitive element, and the other of the source and drain connected to a reference power source line; and a sixth switching transistor that includes a gate connected to the first control line, one of a source and a drain connected to the other of the terminals of the fifth capacitive element, and the other of the source and drain connected to the source of the drive transistor, the gate of the first switching transistor may be connected to the scanning line, the one of the source and the drain of the first switching transistor may be connected to the other of the terminals of the fifth capacitive element, and the other of the source and the drain of the first switching transistor may be connected to the first signal line, and the gate of the second switching transistor may be connected to the scanning line, the one of the source and the drain of the second switching transistor may be connected to the other of the terminals of the fifth capacitive element, and the other of the source and the drain of the second switching transistor may be connected to the second signal line.

According to this aspect, the current control unit includes a drive transistor which converts a signal voltage to a signal current, a fifth capacitive element which holds a voltage corresponding to the signal voltage, a fifth switching transistor for applying a reference voltage to the gate of the drive transistor, and a sixth switching transistor which switches between conduction and non-conduction between the drive transistor and the fifth capacitive element. Through the above-described circuit configuration of the current control unit as well as the disposition of the control lines, scanning lines, and signal lines to the respective pixels that are grouped into drive blocks, the drive transistor initialization periods and the timings thereof can be made uniform within the same drive block. Therefore, the load on the drive circuit which outputs signals for controlling current paths, and controls signal voltages is reduced. In addition, through the above-described grouping into drive blocks and the two signal lines arranged for every pixel column, the initialization period of the drive transistor can occupy a large part of a 1 frame period Tf which is the time in which all the pixels are refreshed. With this, a drive current based on a precisely corrected signal voltage flows to the light-emitting elements, and thus display quality improves. Furthermore, the sixth switching transistor enables a precise voltage corresponding to the signal voltage to be held in the fifth capacitive element.

For example, in the display device, the first power source line may be disposed in each of the rows, and applies a first voltage and a second voltage, the first voltage being a voltage lower than a standard voltage for initializing the current control unit, and the second voltage being a voltage higher than the standard voltage, the current control unit may include: a drive transistor that includes a gate, a source, and a drain, one of the source and the drain being connected to the other of the terminals of the light-emitting element, the other of the source and the drain being connected to the first power source line, and the drive transistor converting the signal voltage applied between the gate and the source of the drive transistor into the signal current which is a drain current of the drive transistor; a sixth capacitive element that includes terminals, one of the terminals being connected to the gate of the drive transistor, the other of the terminals being connected to the one of the source and the drain of the drive transistor, the sixth capacitive element holding at least a voltage corresponding to the signal voltage or the standard voltage, the gate of the first switching transistor may be connected to the scanning line, the one of the source and the drain of the first switching transistor may be connected to the first signal line, and the other of the source and the drain of the first switching transistor may be connected to the gate of the drive transistor, the gate of the second switching transistor may be connected to the scanning line, the one of the source and the drain of the second switching transistor may be connected to the second signal line, and the other of the source and the drain of the second switching transistor may be connected to the gate of the drive transistor, and the display device may further include a voltage control unit configured to control application of the first voltage and the second voltage in at least one of the threshold voltage detection period and the initialization period with a first timing which is the same for the pixels in the same one of the drive blocks, and control the application of the first voltage and the second voltage with a second timing different from the first timing for the pixels in different ones of the drive blocks.

According to this aspect, the current control unit includes a drive transistor which converts a signal voltage to a signal current, and a sixth capacitive element which holds a voltage corresponding to the signal voltage and the standard voltage. Through the above-described circuit configuration of the current control unit as well as the disposition of the control lines, scanning lines, signal lines, and power source lines to the respective pixels that are grouped into drive blocks, the drive transistor threshold voltage correction periods and the timings thereof can be made uniform within the same drive block. Therefore, the load on the drive circuit which outputs signals for controlling current paths, and controls signal voltages is reduced. In addition, through the above-described grouping into drive blocks and the two signal lines arranged for every pixel column, the threshold voltage correction period of the drive transistor can occupy a large part of a 1 frame period Tf which is the time in which all the pixels are refreshed. With this, a drive current based on a precisely corrected signal voltage flows to the light-emitting elements, and thus display quality improves.

For example, in the display device, the light-emitting element may be an electroluminescence (EL) element that emits light according to the signal voltage.

According to this aspect, in an active-matrix organic EL display panel, there is no wire crossing between two signal lines, and thus there is no interlayer capacitance between such signal lines, and power consumption associated with the charging and discharging of signal lines can be reduced. In addition, the absence of interlayer capacitance suppresses potential fluctuation in a signal line during threshold voltage detection and in the initialization period, and improves threshold voltage detection precision. In other words, precise threshold voltage correction can be realized. Furthermore, grouping into drive blocks allows the initialization period and the threshold voltage correction period to occupy a large part of a 1 frame period, and thus the output load on the drive circuit and cost of the drive circuit can be reduced and the manufacturing yield can be improved.

Furthermore, one or more exemplary embodiments disclosed herein can be implemented, not only as a display device including such characteristic units, but also as display device control method having the characteristic units included in the display device as steps.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment 1

Hereinafter, Embodiment 1 shall be described with reference to the Drawings.

The display device in this embodiment is a display device including pixels arranged in a matrix having m rows (m being an integer greater than or equal to 4) and n columns (n being an integer greater than or equal to 1), the display device including a first signal line and a second signal line that are disposed, in a column direction, corresponding to every m pixels that correspond to the respective n columns in the matrix, among the pixels, for applying, to the pixels, a signal voltage which determines luminance of the pixels, wherein the first signal line is disposed on one of the left side and the right side of a first switching transistor and a second switching transistor included in the pixels in the corresponding column, the second signal line is disposed on the other of the left side and the right side of the first switching transistor and the second switching transistor included in the pixels in the corresponding column, a first connecting line connecting the first signal line and the pixels of the corresponding column is disposed without crossing the second signal line, a second connecting line connecting the second signal line and the pixels of the corresponding column is disposed without crossing the first signal line, a threshold voltage detection period during which a threshold voltage of a current control unit is detected is provided in common for all the pixels in the same one of the drive blocks and provided independently in different ones of the drive blocks.

Accordingly, in the display device in this embodiment, the drive transistor threshold voltage correction periods can be made uniform within a drive block, and thus the correction period can take a large part of a 1-frame period. With this, a precisely corrected drive current flows to the light-emitting elements, and thus image display quality improves. Furthermore, the load of the circuit that drives the circuit of a pixel in the threshold voltage correction period can be reduced.

In addition, since there is no wire crossing between two signal lines, there is no interlayer capacitance between the signals, and power consumption accompanying the charging and discharging of signal lines can be reduced. In addition, the absence of interlayer capacitance suppresses potential fluctuation in a signal line during threshold voltage detection and in the initialization period, and improves threshold voltage detection precision. In other words, precise threshold voltage correction can be realized.

It should be noted that providing the threshold voltage detection period in common means that the period and the timing are shared in common, and provided independently means that the periods do not overlap. Stated differently, providing the threshold voltage detection period in common means making the start time and end time of such period uniform for all pixels in the same one of the drive blocks. Furthermore, providing the threshold voltage detection periods independently between different ones of the drive blocks means that the start time and end time of such period is different between the respective pixels of different drive blocks, and such period does not overlap between different drive blocks.

Hereinafter, certain exemplary embodiments shall be described with reference to the Drawings.

Figure 1:
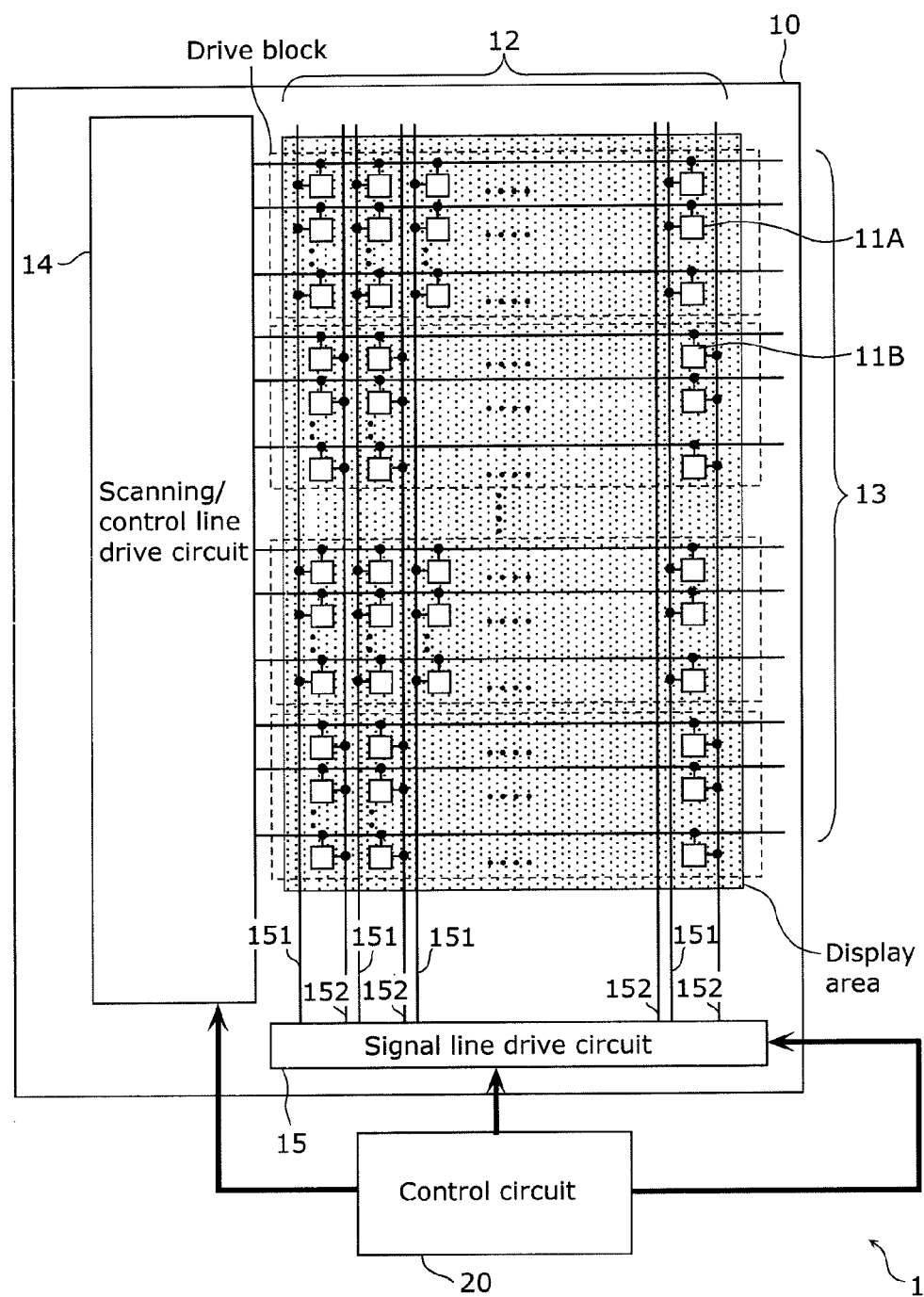
FIG. 1 is a block diagram showing the electrical configuration of a display device according to Embodiment 1.

FIG. 1 is a block diagram showing the electrical configuration of a display device according to Embodiment 1. It should be noted that the layout of plural pixels 11A and 11B, the first signal lines 151 and second signal lines 152 shown in the figure simulates the arrangement when a display panel 10 is seen from a top face.

A display device 1 in the figure includes the display panel 10 and a control circuit 20. The display panel 10 includes the pixels 11A and 11B, a signal line group 12, a control line group 13, a scanning/control line drive circuit 14, and a signal line drive circuit 15.

The pixels 11A and 11B are arranged in a matrix on the display panel 10. Here, the pixels 11A and 11B compose two or more drive blocks each of which is one drive block made up of plural pixel rows. The pixels 11A compose odd drive blocks and the pixels 11B compose even drive blocks.

The signal line group 12 includes the first signal lines 151 and second signal lines 152 disposed in each of the pixel columns. Here, two signal lines (first signal line 151 and second signal line 152) are disposed in each of the pixel columns, the pixels 11A of odd drive blocks are connected to the first signal line 151, and the pixels 11B of even drive blocks are connected to the second signal line 152.

Specifically, the first signal line 151 and the second signal line 152 are disposed, for every m pixels 11A and 11B that correspond to respective n columns in a matrix of m rows and n columns, in the column direction and corresponding to the m pixels 11A and 11B, among the pixels 11A and 11B, and apply the signal voltage which determines the luminance of the m pixels 11A and 11B to the m pixels 11A and 11B. As shown in FIG. 1, the first signal line 151 is disposed on the left side of the pixels 11A and 11B of a corresponding column, and the second signal line 152 is disposed on the right side of the pixels 11A and 11B of a corresponding column. Furthermore, the two signal lines (first signal line 151 and second signal line 152) further apply, to the pixels 11A and 11B, the standard voltage for initializing the drive transistor included in the pixels 11A and 11B.

It should be noted that the arrangement of the first signal line 151 and the second signal line 152 is not limited to the foregoing. For example, the first signal line 151 may be disposed on the right side of the pixels 11A and 11B of the corresponding column, and the second signal line 152 may be disposed on the left side of the pixels 11A and 11B of the corresponding column.

The control line group 13 includes scanning lines and control lines, with each of the scanning lines and each of the control lines disposed on a per pixel basis.

The scanning/control line drive circuit 14 drives the circuit element of each pixel by outputting a scanning signal to the respective scanning lines of the control line group 13 and outputting a control signal to the respective control lines of the control line group 13.

The signal line drive circuit 15 drives the circuit element of each pixel by outputting, to the respective signal lines of the signal line group 12, the signal voltage which determines the light-emitting intensity or the standard voltage for detecting the threshold voltage of the drive transistor.

The control circuit 20 controls the output timing and voltage level of scanning signals and control signals outputted from the scanning/control line drive circuit 14. Furthermore, the control circuit 20 controls the timing for the outputting of signal voltage or standard voltage outputted from the signal line drive circuit 15.

It should be noted that the control circuit 20, the scanning/control line drive circuit 14, and the signal line drive circuit 15 make up a control unit which controls the operation of the respective pixels.

Figure 2A:
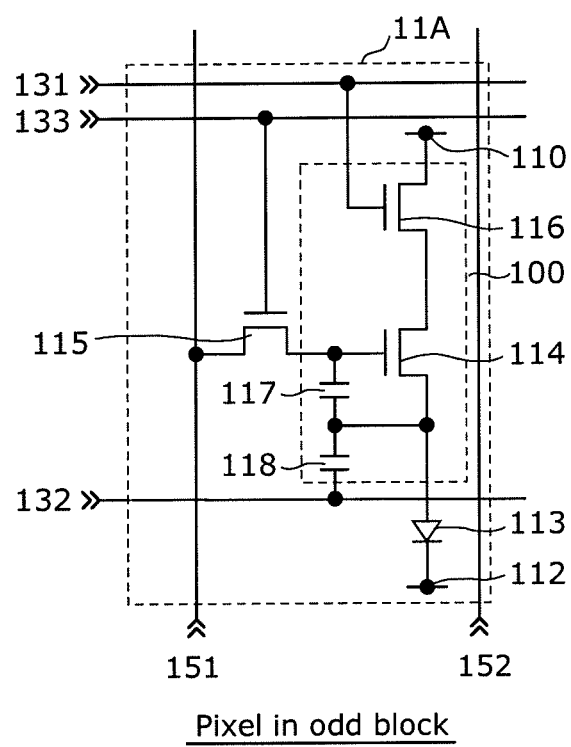
FIG. 2A is a circuit configuration diagram of a pixel in an odd drive block in the display device according to Embodiment 1.
Figure 2B:
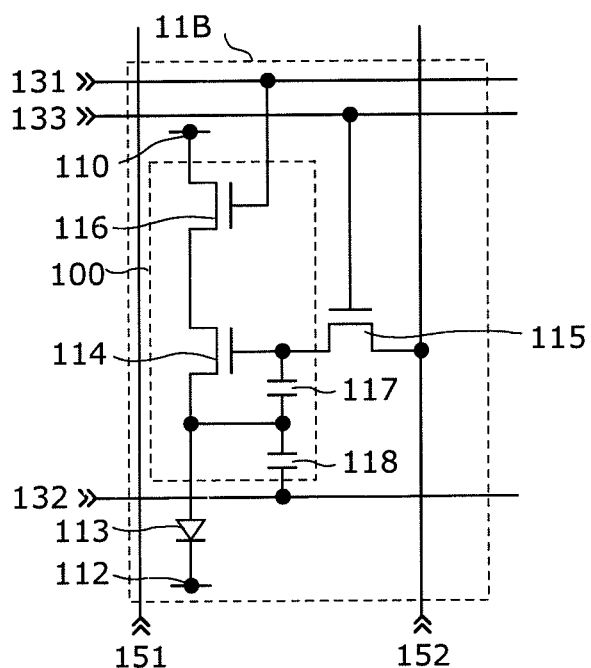
FIG. 2B is a circuit configuration diagram of a pixel in an even drive block in the display device according to Embodiment 1.

FIG. 2A is a specific circuit configuration diagram of a pixel of an odd drive block in the display device according to Embodiment 1, and FIG. 2B is a specific circuit configuration diagram of a pixel of an even drive block in the display device according to Embodiment 1. Each of the pixels 11A and 11B shown in FIG. 2A and FIG. 2B, respectively, include: an organic electroluminescence (EL) element 113; a drive transistor 114; switching transistors 115 and 116; electrostatic holding capacitors 117 and 118; a second control line 131; a first control line 132, a scanning line 133; a first signal line 151; and a second signal line 152.

The organic EL element 113 is, for example, a light-emitting element having a cathode connected to a power source line 112 which is a second power source line, and an anode connected to the source of the drive transistor 114. The organic EL element 113 emits light according to the flow of the drive current of the drive transistor 114.

Through the application of a voltage corresponding to a signal voltage, between the source and the drain, the drive transistor 114 converts such voltage to a corresponding drain current. Subsequently, the drive transistor 114 supplies this drain current, as a drive current, to the organic EL element 113. The drive transistor 114 is configured of, for example, an n-type thin film transistor (n-type TFT).

The switching transistor 115 has a gate connected to the scanning line 133, and one of a source and a drain connected to the gate of the drive transistor 114. Furthermore, in a pixel 11A in an odd drive block, the other of the source and the drain is connected to the first signal line 151, and the switching transistor 115 of the pixel 11A corresponds to a first switching transistor. Furthermore, in a pixel 11B in an even drive block, the other of the source and the drain is connected to the second signal line 152, and the switching transistor 115 of the pixel 11B corresponds to a second switching transistor.

It should be noted that the wire connecting the switching transistor 115 and the first signal line 151 corresponds to the first connecting line, and the wire connecting the switching transistor 115 and the second signal line 152 corresponds to the second connecting line. Specifically, the switching transistor 115 included in the pixel 11A has a gate connected to the scanning line 133, one of a source and a drain connected to the first signal line 151 via the first connecting line, and the other of the source and the gain connected to a current control unit 100 described later, and switches between conduction and non-conduction between the first signal line 151 and the current control unit 100. On the other hand, the switching transistor 115 included in the pixel 11B has a gate connected to the scanning line 133, one of a source and a drain connected to the second signal line 152 via the second connecting line, and the other of the source and the gain connected to a current control unit 100, and switches between conduction and non-conduction between the second signal line 152 and the current control unit 100.

Here, the first connecting line is disposed so as not to cross with the second signal line 152, and the second connecting line is disposed so as not to cross with the first signal line 151.

According to the above configuration, in this embodiment, the first signal line 151 and the first connecting lines connected to the first signal line do not cross with the second signal line 152 and the second connecting lines connected to the second signal line 152. Accordingly, parasitic capacitance generated due to the crossing of signal lines as in the display device 500 in FIG. 26 for example is not generated in the display device 1 according to this embodiment.

As a result, in the display device 1, the need to charge and discharge the parasitic capacitance when performing the control for causing the pixels 11A and 11B to emit light is eliminated, and thus unnecessary power consumption can be suppressed. In other words, the display device 1 is capable of reducing power consumption.

The switching transistor 116 is a third switching transistor having a gate connected to the second control line 131, and the other of a source and a drain connected to a power source line 110 which is a positive power source line. The switching transistor 116 has a function of turning ON and OFF the drain current of the drive transistor 114.

It should be noted that it is sufficient that the source and the drain of the switching transistor 116 are connected between the power source line 110 and the anode of the organic EL element. With this arrangement, the drain current of the drive transistor 114 can be turned ON and OFF. The drive transistors 115 and 116 are each configured of, for example, an n-type thin film transistor (n-type TFT).

The electrostatic holding capacitor 117 is a first capacitive element having one of terminals connected to the gate of the drive transistor 114 and the other of the terminals connected to the source of the drive transistor 114. The electrostatic holding capacitor 117 has a function of holding a charge corresponding to the signal voltage supplied from the first signal line 151 or the second signal line 152, and controlling a signal current supplied from the drive transistor 114 to the organic EL element 113 after the switching transistor 115 is turned OFF for example.

The electrostatic holding capacitor 118 is a second capacitive element connected between the other of the terminals of the electrostatic holding capacitor 117 and the first control line 132. The electrostatic holding capacitor 118 first holds the source potential of the drive transistor 114 in the steady state. The information of such source potential remains in a node between the electrostatic holding capacitor 117 and the electrostatic holding capacitor 118 even when a signal voltage is applied from the switching transistor 115. It should be noted that the source potential at this timing is the threshold voltage of the drive transistor 114. Subsequently, even when the timing from the holding of the aforementioned signal voltage to the emission of light is different for each of the pixel rows, the potential of the other of the terminals of the electrostatic holding capacitor 117 is fixed, and thus the gate voltage of the drive transistor 114 is fixed. Meanwhile, since the source potential of the drive transistor 114 is already steady, the electrostatic holding capacitor 118 consequently has a function of holding the source potential of the drive transistor 114.

It should be noted that the drive transistor 114, the switching transistor 116, and the electrostatic holding capacitors 117 and 118 make up the current control unit 100.

The current control unit 100 is connected to the power source lien 110, the other terminal of the organic EL element 113, and the first control line 132, and converts signal voltage to signal current. Specifically, the current control unit 100 is connected to the power source line 110, the anode of the organic EL element 113, the second control line 131, the first control line 132, and a terminal of one of the source and the drain of the switching transistor 115. According to this configuration, the current control unit 100 has a function of converting the signal voltage supplied from the first signal line 151 or the second signal line 152 into a signal current which is a drain current of the drive transistor 114.

Second control lines 131 are disposed on a per pixel row basis, and are provided in common for all of the pixels in a same one of the drive blocks, and are independent of another between different ones of the drive blocks. Specifically, the second control line 131 is connected to the scanning/control line drive circuit 14, and is connected to the respective pixels belonging to the pixel row including the pixel 11A or 11B. With this, the second control line 131 has a function of supplying the timing for turning ON/OFF the drain current of the drive transistor 114. Here, second control lines 131 are provided in common for all pixels in the same one of the drive blocks means that a single control signal outputted from the scanning/control line drive circuit 14 is simultaneously supplied to the second control lines 131 in the same one of the drive blocks. For example, in the same one of the drive blocks, a single control line connected to the scanning/control line drive circuit 14 branches out to the second control lines 131 which are disposed on a per pixel row basis. Furthermore, second control lines 131 are independent of another between different ones of the drive blocks means that separate control signals outputted from the scanning/control line drive circuit 14 are supplied to the drive blocks. For example, the second control lines 131 are individually connected to the scanning/control line drive circuit 14 on a per drive block basis.

First control lines 132 are disposed on a per pixel row basis, and are provided in common for all of the pixels in a same one of the drive blocks, and are independent of another between different ones of the drive blocks. Specifically, the first control line 132 is connected to the scanning/control line drive circuit 14, and is connected to the respective pixels belonging to the pixel row including the pixel 11A or 11B. With this, the first control line 132 has a function of adjusting the environment for detecting the threshold voltage of the drive transistor 114, by switching voltage levels.

The scanning line 133 has a function of supplying the respective pixels belonging to the pixel row including the pixel 11A or 11B with the timing for writing a signal voltage or the standard voltage for detecting the threshold voltage of the drive transistor 114.

Each of the first signal line 151 and the second signal line 152 is connected to the signal line drive circuit 15 and the respective pixels belonging to the pixel column including the pixel 11A or 11B, and has a function of supplying: the standard voltage for detecting the threshold voltage of the drive TFT; and the signal voltage which determines light-emitting intensity.

It should be noted that, although not shown in FIG. 2A to FIG. 2B, each of the power source line 110 and the power source line 112 is also connected to other light-emitting pixels, and to a voltage source.

Next, the inter-pixel connection relationship of the second control line 131, the first control line 132, the scanning line 133, the first signal line 151, and the second signal line 152 shall be described.

Figure 3:
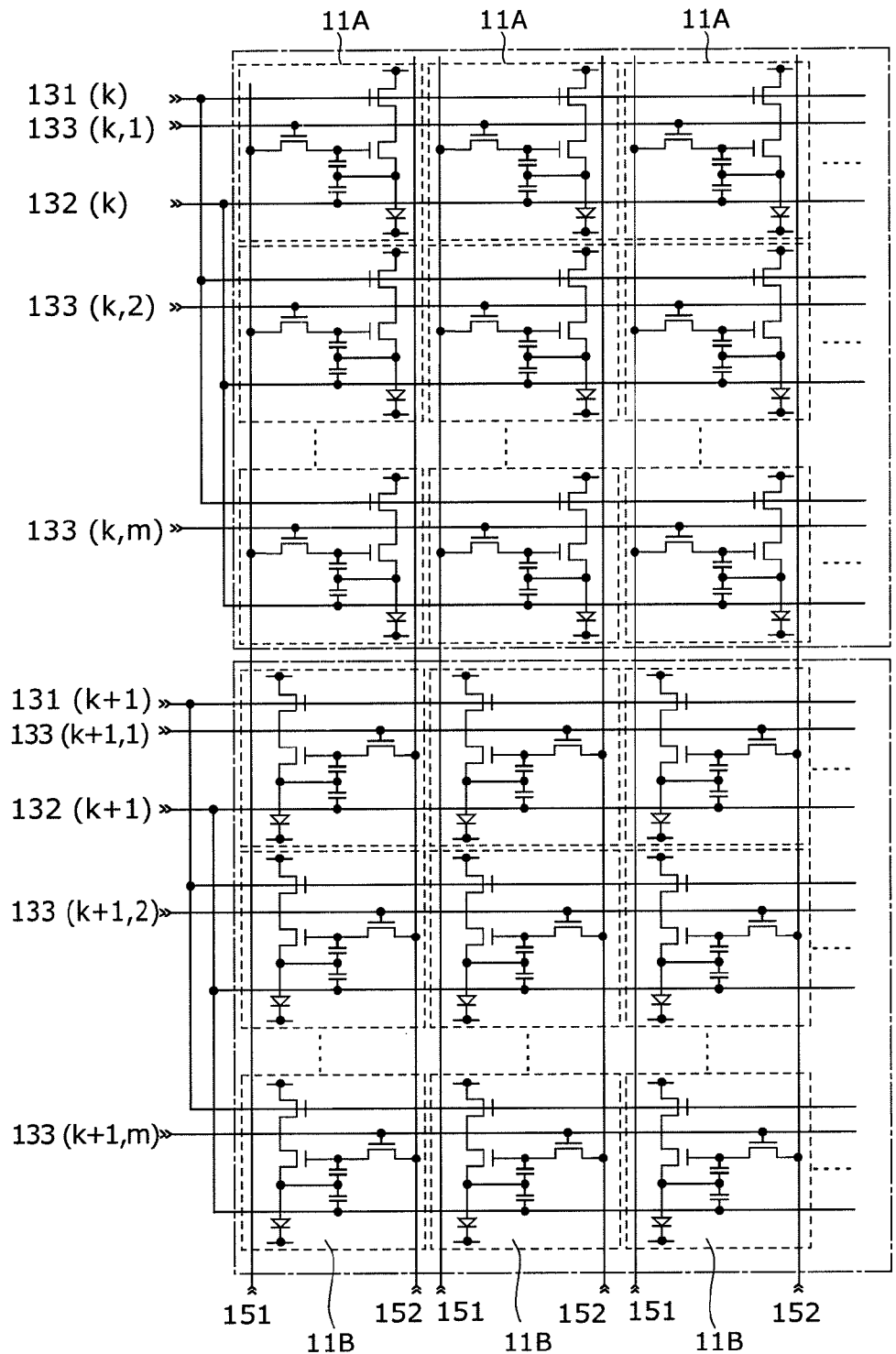
FIG. 3 is a circuit configuration diagram showing part of a display panel included in the display device according to Embodiment 1.

FIG. 3 is a circuit configuration diagram showing part of the display panel included in the display device according to Embodiment 1. The figure shows two adjacent drive blocks and respective control lines, respective scanning lines, and respective signal lines. In the figure and the subsequent description, the respective control lines, respective scanning lines, and respective signal lines shall be represented by "reference number (block number; row number of the block)" or "reference number (block number)".

As previously described, a drive block includes plural pixel rows, and there are two or more drive blocks within the display panel 10. For example, each of the drive blocks shown in FIG. 3 includes m rows of pixel rows.

In the kth drive block shown at the top stage of FIG. 3, the second control line 131($k$) is connected in common to the gates of the respective switching transistors 116 included in all the pixels 11A in the drive block. Furthermore, the first control line 132($k$) is connected in common to the respective electrostatic holding capacitors 118 included in all the pixels 11A in the drive block. Meanwhile, each of the scanning lines 133 ($k$, 1) to 133 ($k$, $m$) are separately connected on a per pixel row basis. Furthermore, the same connections as those in the kth drive block are also adopted for the (k+1)th drive block shown in the bottom stage of FIG. 4. However, the second control line 131($k$) connected to the kth drive block and the second control line 131($k$+1) connected to the (k+1)th drive block are different control lines, and separate control signals are outputted from the scanning/control line drive circuit 14. Furthermore, the first control line 132($k$) connected to the kth drive block and the first control line 132($k$+1) connected to the (k+1)th drive block are different control lines, and separate control signals are outputted from the scanning/control line drive circuit 14.

Furthermore, in the kth drive block, the first signal line 151 is connected to the other of the source and drain of the respective switching transistors 115 included in all of the pixels 11A in the drive block. Meanwhile, in the (k+1)th drive block, the second signal line 152 is connected to the other of the source and drain of the respective switching transistors 115 included in all of the pixels 11B in the drive block.

As described above, with the grouping into drive blocks, the number of second control lines 132 for controlling the turning ON and OFF of the voltage application to the drain of the respective drive transistors 114 is reduced. Furthermore, the number of first control lines 132 for controlling respective $V_{th}$ detection circuits which detect the threshold voltage $V_{th}$ of the drive transistor 114 is reduced. Therefore, the number of outputs of the scanning/control line drive circuit 14 which outputs drive signals to these control lines is reduced, thus allowing a reduction in circuit size.

Figure 4:
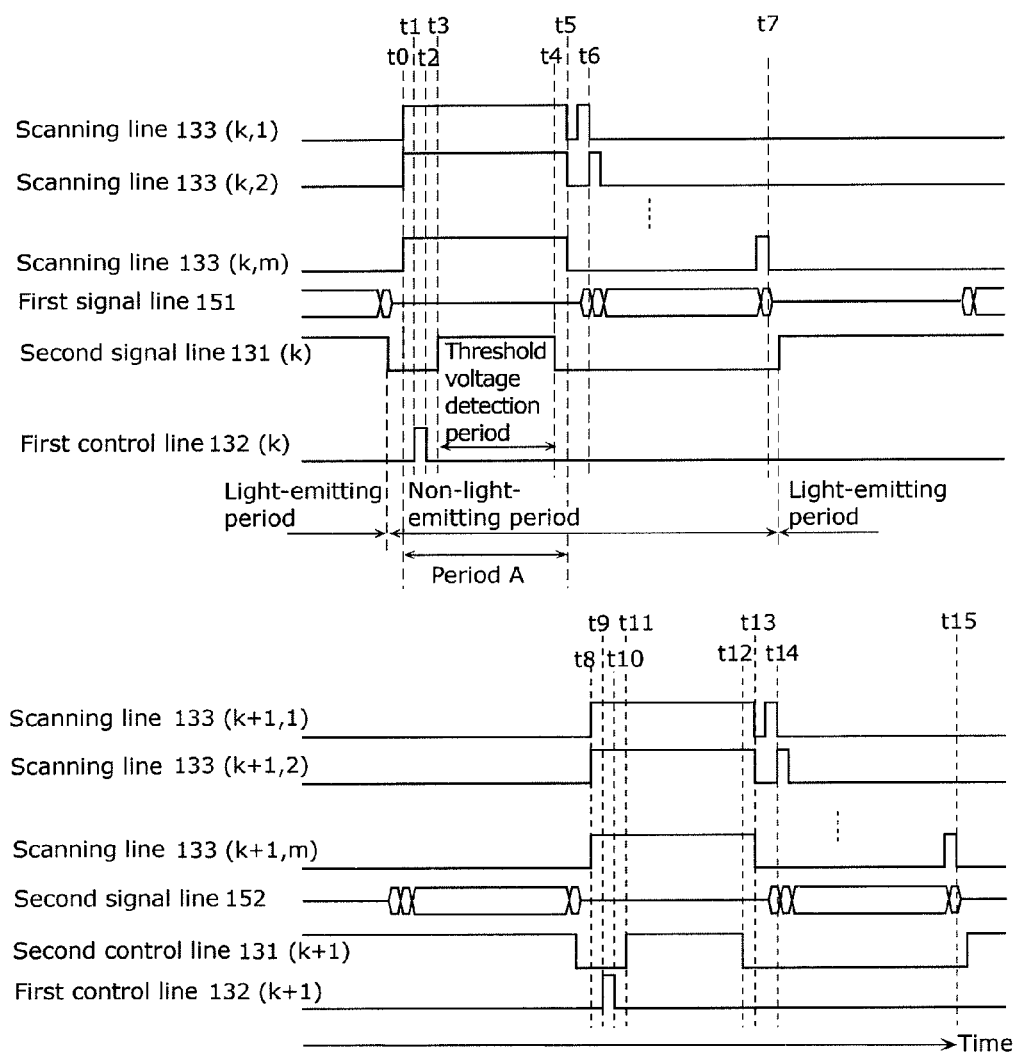
FIG. 4 is an operation timing chart for the driving method of the display device according to Embodiment 1.

Next, the driving method of the display device 1 according to this embodiment shall be described using FIG. 4. It should be noted that, here, the driving method of the display device including the specific circuit configuration shown in FIG. 2A and FIG. 2B shall be described in detail.

Figure 5:
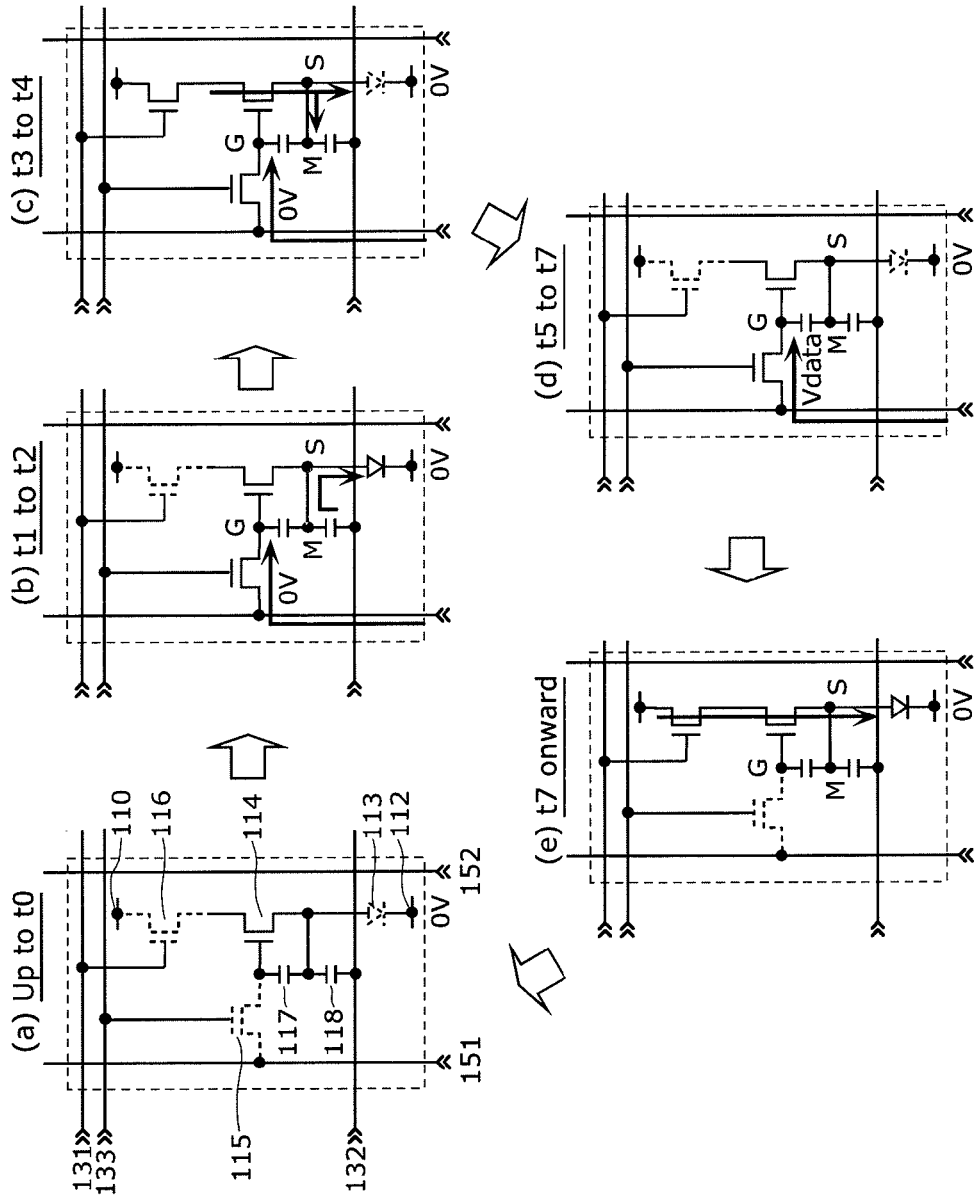
FIG. 5 is a state transition diagram for a pixel included in the display device according to Embodiment 1.

FIG. 4 is an operation timing chart for the driving method of the display device according to Embodiment 1. In the figure, the horizontal axis denotes time. Furthermore, in the vertical direction, the waveform diagrams of the voltage generated in the scanning lines 133 ($k$, 1), 133 ($k$, 2), and 133 ($k$, $m$), the first signal line 151, the second control line 131($k$), and the first control line 132($k$) of the kth drive block are shown in sequence from the top. Furthermore, continuing therefrom, the waveform diagrams of the voltage generated in the scanning lines 133 ($k$+1, 1), 133 ($k$+1, 2), and 133 ($k$+1, $m$), the second signal line 152, the second control line 131 ($k$+1), and the first control line 132($k$+1) of the (k+1)th drive block are shown. Furthermore, FIG. 5 is a state transition diagram for a pixel included in the display device according to Embodiment 1. Furthermore, FIG. 6 is an operation flowchart for the display device according to the Embodiment 1.

First, immediately before a time t0, all the voltage levels of the scanning lines 133 ($k$, 1) to 133 ($k$, $m$) are LOW, and the voltage levels of the first control line 132($k$) and the second control line 131($k$) are also LOW. As shown in (a) in FIG. 5, from the moment that the voltage level of the second control line 131($k$) is LOW, the switching transistor 116 turns ON. With this, the organic EL element 113 stops emitting light, and the concurrent light-emission of the pixels in the kth drive block ends. At the same time, the non-light-emitting period of the kth drive block begins.

Next, at the time t0, the scanning/control line drive circuit 14 causes the voltage levels of the scanning lines 133 ($k$, 1) to 133 ($k$, $m$) to simultaneously change from LOW to HIGH so as to turn ON the switching transistor 115. Furthermore, at this time, the voltage level of the second control line 131($k$) is already at LOW and the switching transistor 116 is already OFF (S11 in FIG. 6), and the signal line drive circuit 15 causes the voltage of the first signal line 151 to change from the signal voltage to the standard voltage with which the drive transistor 114 turns OFF (S12 in FIG. 6). With this, the signal voltage is applied to the gate of the drive transistor 114.

Figure 6:
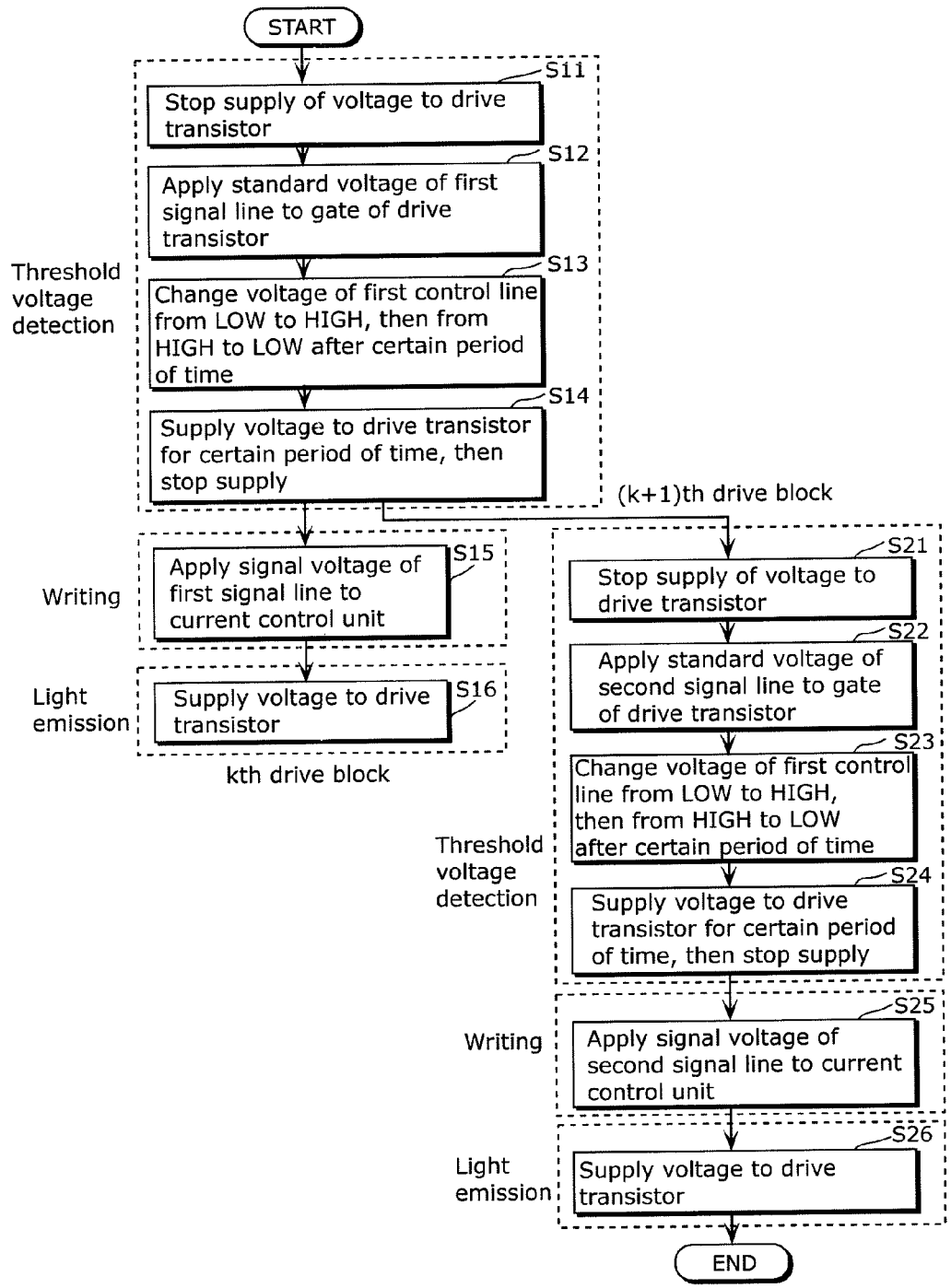
FIG. 6 is an operation flowchart for the display device according to Embodiment 1.

Next, at a time t1, the scanning/control line drive circuit 14 causes the voltage level of the first control line 132($k$) to change from LOW to HIGH, then causes the voltage level to change to LOW at a time t2 after a certain period of time has passed (S13 in FIG. 6). Furthermore, at this time, since the voltage level of the second control line 131($k$) is maintained at LOW, the potential difference between the source electrode S(M) of the drive transistor 114 and the cathode electrode of the organic EL element 113 becomes asymptotic to the threshold voltage of the organic EL element 113. Here, for example, it is assumed that the potential of the reference signal voltage and the power source line 112 is 0 V, the potential difference (VgH–VgL) between the HIGH voltage level and the LOW voltage level of the first control line 132($k$) is $\Delta V_{reset}$, the electrostatic capacitance of the electrostatic holding capacitor 118 is C2, and the electrostatic capacitance and threshold voltage of the organic EL element 113 are $C_{EL}$ and $V_T(EL)$, respectively. At this time, at the moment when the scanning/control line drive circuit 14 changes the scanning voltage level of the first control line 132($k$) from LOW to HIGH, the potential Vs of the source electrode S(M) of the drive transistor 114 is approximately equal to the sum of $V_T(EL)$ and the voltage distributed between C2 and $C_{EL}$, and is obtained as below.

[MATH. 1]

$$V_S \approx \frac{C_2}{C_2 + C_{EL}} \Delta V_{reset} + V_{T(EL)} \qquad \text{Expression 1}$$

Subsequently, as shown in (b) in FIG. 5, due to the self-discharging of the organic EL element 113, the aforementioned Vs becomes asymptotic to $V_T(EL)$, in the steady state. In other words, Vs→$V_T(EL)$.

Subsequently, at the time t2, the scanning/control line drive circuit 14 causes the voltage level of the first control line 132(k) to change from HIGH to LOW, and thereby Vs is biased and is obtained as below.

[MATH. 2]

$$V_S = V_{T(EL)} - \frac{C_2}{C_1 + C_2 + C_{EL}} \Delta V_{reset} < -V_{th} \qquad \text{Expression 2}$$

Through the changing of the voltage level of the first control line 132(k) from HIGH to LOW, $\Delta V_{reset}$ is set to Vgs which is the gate-source voltage of the drive transistor 114 so that a voltage higher than the threshold voltage $V_{th}$ of the drive transistor 114 is generated therein. Specifically, the potential difference generated in the electrostatic holding capacitor 117 is set to be a potential difference which allows for the detection of the threshold voltage of the drive transistor 114, thereby completing the preparation for the threshold voltage detection process.

Next, at a time t3, the scanning/control line drive circuit 14 causes the voltage level of the second control line 131(k) to change from LOW to HIGH so as to turn ON the switching transistor 116. With this, as shown in (c) in FIG. 5, the drive transistor 114 turns ON and supplies the drain-source current to the electrostatic holding capacitors 117 and 118, and to the organic EL element 113 which is OFF. At this time, Vs defined in Expression 2 becomes asymptotic to $-V_{th}$. With this, the gate-source voltage of the drive transistor 114 is recorded in the electrostatic holding capacitors 117 and 118 and the organic EL element 113. It should be noted that since, at this time, the anode electrode potential of the organic EL element 113, that is, the source electrode potential of the drive transistor 114 is a potential lower than $-V_{th}$ (<0), and the cathode electrode potential of the organic EL element 113 is 0 V, the organic EL element 113 becomes inversely-biased, and thus the organic EL element 113 functions as an electrostatic capacitor $C_{EL}$ without emitting light.

In the period from the time t3 to a time t4, the circuit of the pixel 11A becomes steady, and a voltage equivalent to the threshold voltage $V_{th}$ of the drive transistor 114 is held in the electrostatic holding capacitors 117 and 118. It should be noted that, since the flowing current for causing the voltage equivalent to the threshold voltage $V_{th}$ to be held in the electrostatic holding capacitors 117 and 118 is minute, reaching the steady state takes time. Therefore, the longer this period is, the more stable the voltage held in the electrostatic holding capacitor 117 becomes, and by ensuring that this period is sufficiently long, voltage compensation having high-precision is realized.

Next, at the time t4, the scanning/control line drive circuit 14 causes the voltage level of the second control line 131(k) to change from HIGH to LOW (S14 in FIG. 6). With this, the current supply to the drive transistor 114 is stopped. At this time, the voltage equivalent to the threshold voltage $V_{th}$ of the drive transistor 114 is simultaneously held in the respective electrostatic holding capacitors 117 and 118 included in all of the pixels 11A of the kth drive block.

Meanwhile, in the period from the time t3 to time t4, a signal voltage is applied to the second signal line 152 connected to the pixel 11B connected to the (k+1)th drive block. Here, in the display device 1 in this embodiment, as described above, the first signal line 151 and the second signal line 152 are disposed, for every m pixels 11A and 11B that correspond to the respective n columns, in the column direction and corresponding to the m pixels 11A and 11B. The first signal line 151 is disposed on the left side of the pixels 11A and 11B of a corresponding column, and the second signal line 152 is disposed on the right side of the pixels 11A and 11B of a corresponding column. Specifically, the first signal line 151 is disposed on the left side of the switching transistor 115 of the pixels 11A and 11B of a corresponding column, and the second signal line 152 is disposed on the right side of the switching transistor 115 of the pixels 11A and 11B of a corresponding column. In addition, the first connecting line is disposed so as not to cross with the second signal line 152, and the second connecting line is disposed so as not to cross with the first signal line 151. With this, parasitic capacitance generated due to the crossing of signal wires, as in the display device 500 in FIG. 26 for example, is not generated in the display device 1. It should be noted that the parasitic capacitance (signal line parasitic capacitance) generated due to the crossing of signal wires described in the present specification refers to at least one of the parasitic capacitance generated between the first signal line 151 and the second signal line 152, the parasitic capacitance generated between the first connecting line and the second signal line 152, and the parasitic capacitance generated between the second connecting line and the first signal line 151.

Therefore, in the period from the time t3 to the time t4, that is, in the threshold voltage detection period of the pixel 11A, the standard voltage supplied to the first signal line 151 is not affected by the signal voltage supplied to the second signal line 152, via the parasitic capacitance generated due to crossing of signal lines. Stated differently, fluctuation of the potential of the first signal line 151 which supplies the standard voltage for detecting the threshold voltage can be suppressed.

Therefore, the display device 1 according to this embodiment is capable of improving threshold voltage detection precision.

Specifically, if the potential of the first signal line 151 to which the standard voltage is supplied fluctuate due to the signal voltage supplied to the second signal line 152, the source potential of the drive transistor 114 determined by the gate potential and the threshold voltage of the drive transistor 114 fluctuates. As a result, the potential $V_M$ at the connection point M between the electrostatic holding capacitors 117 and 118 fluctuates. Therefore, the electrostatic holding capacitors 117 and 118 are unable to hold the precise threshold voltage.

In contrast, in the display device 1 according to this embodiment, by reducing the parasitic capacitance generated due to the crossing of signal lines, it is possible to suppress the fluctuation of the standard voltage in the threshold voltage detection period. Therefore, it is possible to hold the precise threshold voltage in the electrostatic holding capacitors 117 and 118. In other words, threshold voltage detection precision is improved.

Next, at a time t5, the scanning/control line drive circuit 14 causes the voltage levels of the scanning lines 133 (k, 1) to 133 (k, m) to simultaneously change from HIGH to LOW so as to turn OFF the switching transistor 115.

As described thus far, in a period from the time t0 to the time t5, the correction of the threshold voltage $V_{th}$ of the drive transistor 114 is executed simultaneously in the kth drive block.

Next, in a period from the time t5 to a time t7, the scanning/control line drive circuit 14 causes the voltage levels of the scanning lines 133 (k, 1) to 133 (k, m) to sequentially change from LOW to HIGH to LOW so as to sequentially turn ON the switching transistors 115 on a per pixel row basis. Furthermore, at this time, the signal line drive circuit 15 causes the voltage of the first signal line 151 to change from the standard voltage to the signal voltage Vdata (S15 in FIG. 6).

With this, as shown in (d) in FIG. 6, the signal voltage Vdata is applied to the gate of the drive transistor 114. At this time, the potential $V_M$(=Vs) in the connection point M between the electrostatic holding capacitors 117 and 118 becomes the sum of the voltage resulting from the distribution of the signal voltage change amount ΔVdata between C1 and C2, and $-V_{th}$ which is the Vs potential at the time t4, and is obtained as below.

[MATH. 3]

$$V_M = \frac{C_1}{C_1 + C_2 + C_{EL}} \Delta V_{data} - V_{th} = \frac{C_1}{C_1 + C_2 + C_{EL}} V_{data} - V_{th} \quad \text{Expression 3}$$

In other words, the potential difference Vgs held in the electrostatic holding capacitor 117 is the difference between Vdata and the potential defined in aforementioned Expression 3.

[MATH. 4]

$$V_{gs} = \frac{C_2 + C_{EL}}{C_1 + C_2 + C_{EL}} V_{data} + V_{th} \quad \text{Expression 4}$$

In other words, a summed voltage obtained by adding a voltage corresponding to this signal voltage Vdata and the voltage equivalent to the previously held threshold voltage $V_{th}$ of the drive transistor 114 is written into the electrostatic holding capacitor 117.

As described thus far, in the period from the time t5 to the time t7, the writing of the corrected signal voltage is sequentially executed in the kth drive block on a per pixel row basis.

Next, at a time t7 onward, the voltage level of the second control line 131(k) is caused to change from LOW to HIGH (S16 in FIG. 6). With this, a drive current corresponding to the aforementioned summed voltage flows to the organic EL element 113. In other words, light-emission begins simultaneously in all the pixels 11A in the kth drive block.

As described thus far, in a period from the time t7 onward, light-emission by the organic EL elements 113 is executed simultaneously in the kth drive block. Here, a drain current $i_d$ flowing in the drive transistor 114 is expressed below by using a voltage value obtained by deducting the threshold voltage $V_{th}$ of the drive transistor 114 from the Vgs defined in Expression 4.

[MATH. 5]

$$i_d = \frac{\beta}{2}\left(\frac{C_2 + C_{EL}}{C_1 + C_2 + C_{EL}} V_{data}\right)^2 \quad \text{Expression 5}$$

Here, β is a characteristic parameter regarding mobility. It can be seen from Expression 5 that the drain current $i_d$ for causing the organic EL element 113 to emit light is a current that is not dependent on the threshold voltage $V_{th}$ of the drive transistor 114.

As described thus far, grouping the pixel rows into drive blocks allows the compensation of the threshold voltage $V_{th}$ of the drive transistors 114 to be executed simultaneously in the respective drive blocks. Furthermore, the light-emission by the organic EL elements 113 is executed simultaneously in the respective drive blocks. With this, the control for turning the drive current of the drive transistors 114 ON and OFF can be synchronized in the respective drive blocks, and the control of the current path from the source of such drive current onward can be synchronized in the respective drive blocks. Therefore, the first control line 132 and the second control line 131 can be provided in common within each of the drive blocks.

Furthermore, although the scanning lines 133 (k, 1) to 133 (k, m) are separately connected to the scanning/control line drive circuit 14, the timing of the drive pulse in the threshold voltage correction period is the same. Therefore, the scanning/control line drive circuit 14 can suppress the rising of the frequency of the pulse signals to be outputted, and thus the output load on the drive circuit can be reduced. In addition, the first signal line 151 and the first connecting lines connected to the first signal line 151 and the second signal line 152 and the second connecting lines connected to the second signal line 152 do not cross. Accordingly, parasitic capacitance generated due to the crossing of signal lines is not generated in the display device 1 according to this embodiment. As a result, the signal line drive circuit 15 does not need to charge the parasitic capacitance when supplying the standard voltage and a signal voltage to the first signal line 151 and the second signal line 152, and thus unnecessary power consumption does not occur. In other words, the display device 1 is capable of reducing power consumption.

Figure 27:
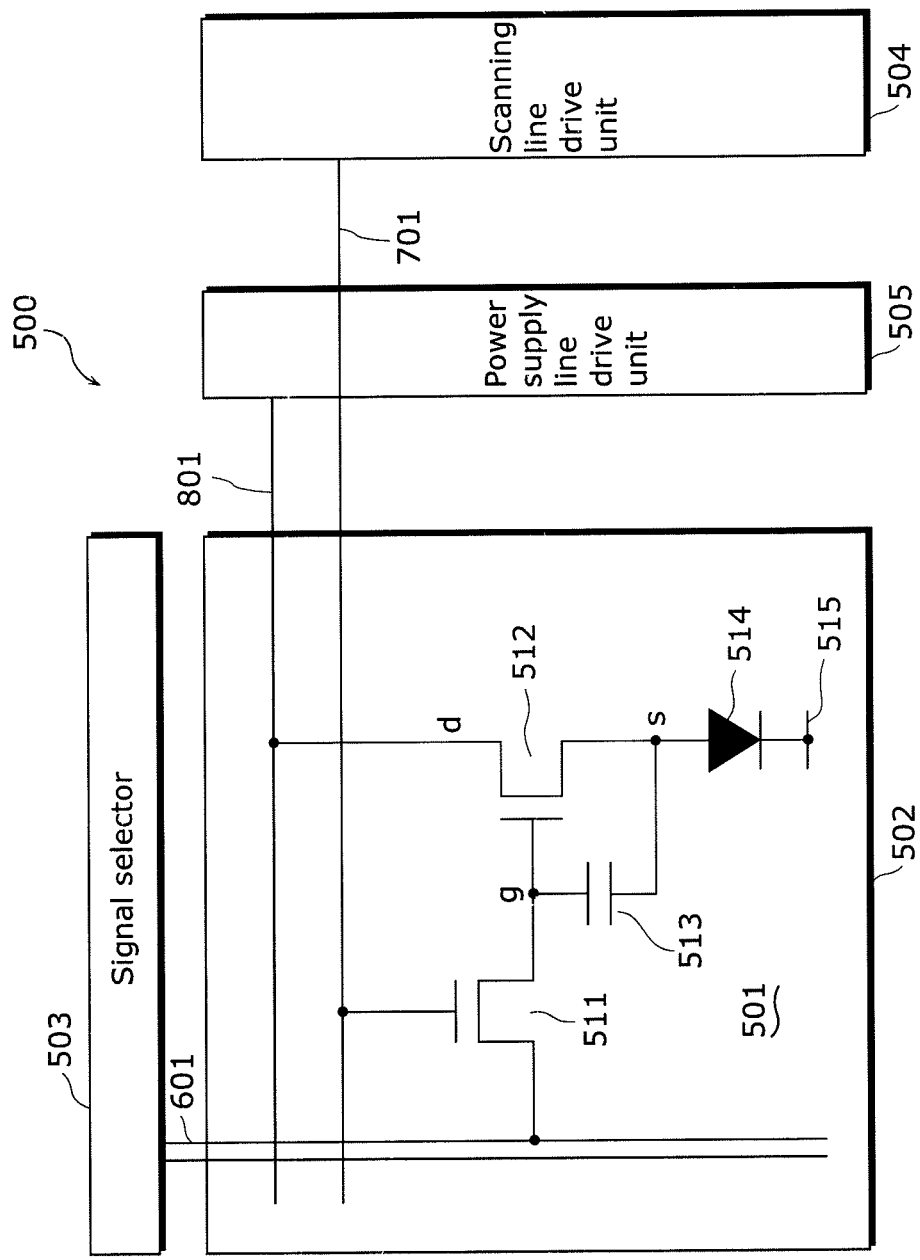
FIG. 27 is a circuit configuration diagram for a pixel included in the conventional display device disclosed in PTL 1.

Meanwhile, the above-described driving method having little output load on the drive circuit is difficult to realize with the conventional display device 500 disclosed in PTL 1. Even in the pixel circuit diagram shown in FIG. 27, although the threshold voltage $V_{th}$ of the drive transistor 512 is compensated, the source potential of the drive transistor 512 fluctuates and is not fixed after a voltage equivalent to such threshold voltage is held in the holding capacitor 513. As such, in the display device 500, after the threshold voltage $V_{th}$ is held, the writing of a summed voltage obtained by adding the signal voltage to the threshold voltage $V_{th}$ must subsequently be executed immediately. Furthermore, since the aforementioned summed voltage is influenced by the fluctuation of the source potential, the light-emission operation must subsequently be executed immediately. Specifically, in the conventional display device 500, the above-described threshold voltage compensation, signal voltage writing, and light-emission must be executed on a per pixel row basis, and the grouping into drive blocks is not possible with the pixels 501 shown in FIG. 27.

In contrast, in each of the pixels 11A and 11B included in the display device 1 according to the present disclosure, the switching transistor 116 is connected to the drain of the drive transistor 114 as previously described. With this, the potential in the gate and source of the drive transistor 114 is stabilized, and thus the time from the writing of voltage due to threshold voltage correction up to the additional writing of the signal voltage, or the time from the additional writing up to the light-emission can be arbitrarily set on a per pixel row basis. With this circuit configuration, grouping into drive blocks becomes possible, and the threshold voltage correction periods as well as the light-emitting periods can be made uniform within the same drive block.

Here, the comparison of light emission duty defined according to the threshold voltage detection period is performed in the conventional display device using the two signal lines described in PTL 1, and the display device having the drive blocks according to the present disclosure.

Figure 7:
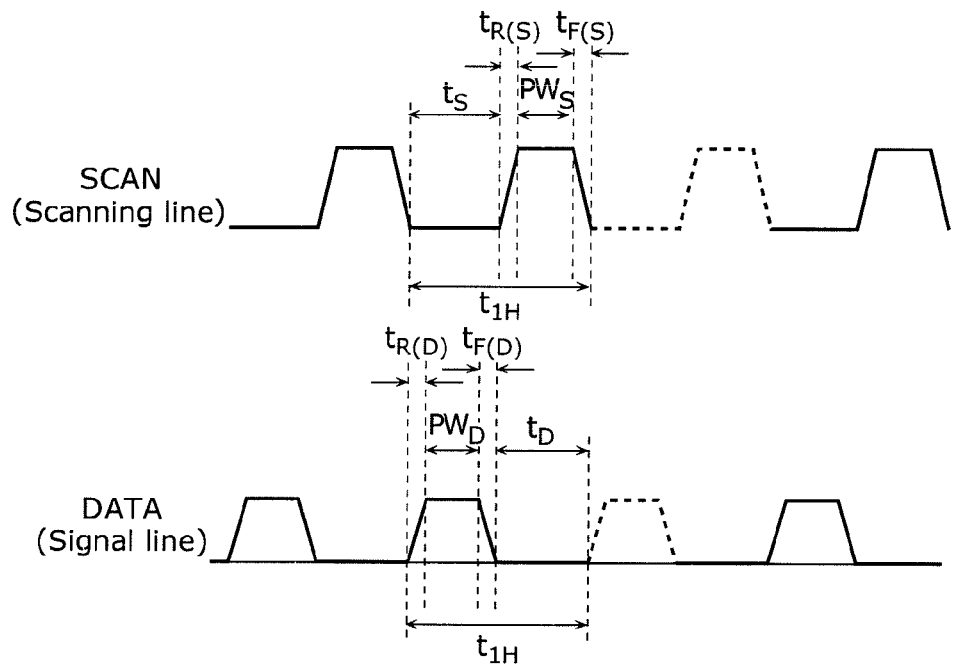
FIG. 7 is a diagram for describing the waveform characteristics of a scanning line and a signal line.

FIG. 7 is a diagram for describing the waveform characteristics of a scanning line and a signal line. In the figure, the period for detecting the threshold voltage $V_{th}$ in one horizontal period t1H for each pixel row is equivalent to $PW_S$ which is the period in which the scanning line is ON. Furthermore, for a signal line, one horizontal period $t_{1H}$ includes $PW_D$ which is a period in which signal voltage is supplied and $t_D$ which is a period in which the standard voltage is supplied. Furthermore, assuming the rise time and fall time of $PW_S$ to be $t_{R(S)}$ and $t_{F(S)}$, respectively, and the rise time and fall time of $PW_D$ to be $t_{R(D)}$ and $t_{F(D)}$, respectively, one horizontal period $t_{1H}$ is expressed as below.

[MATH. 6]

$$t_{1H}=t_D+PW_D+t_{R(D)}+t_{F(D)} \qquad \text{Expression 6}$$

In addition, assuming $PW_D=t_D$, the subsequent equation is obtained.

[MATH. 7]

$$t_D+PW_D+t_{R(D)}+t_{F(D)}=2t_D+t_{R(D)}+t_{F(D)} \qquad \text{Expression 7}$$

According to Expression 6 and Expression 7, $t_D$ is expressed as below.

[MATH. 8]

$$t_D=(t_{1H}-t_{R(D)}-t_{F(D)})/2 \qquad \text{Expression 8}$$

Furthermore, since the $V_{th}$ detection period must begin and end within the standard voltage generation period, $t_D$ is expressed as below when a maximum $V_{th}$ detection period is secured.

[MATH. 9]

$$t_D=PW_S+t_{R(S)}+t_{F(S)} \qquad \text{Expression 9}$$

According to Expression 8 and Expression 9, the subsequent equation is obtained.

[MATH. 10]

$$PW_S=(t_{1H}-t_{R(D)}-t_{F(D)}-2t_{R(S)}-2t_{F(S)})/2 \qquad \text{Expression 10}$$

With respect to Expression 10, as an example, the light emission duty of a panel having a vertical resolution of 1,080 scanning lines (+30 lines for blanking) and which is driven at 120 Hz shall be compared.

In the conventional display device, one horizontal period $t_{1H}$ in the case of having two signal lines is twice that of the case of having one signal line, and is thus expressed through the subsequent expression.

$$t1H=\{1\text{ sec.}/(120\text{ Hz}\times 1110\text{ lines})\}\times 2=7.5\text{ μS}\times 2=15\text{ μS}$$

Here, $t_{R(D)}=t_{F(D)}=2$ μS and $t_{R(S)}=t_{F(S)}=1.5$ μS are assumed, and when these are substituted into Expression 10, the resetting period $PW_S$ which is the $V_{th}$ detecting period becomes 2.5 μS.

Here, assuming that 1000 μS is required for a $V_{th}$ detection period to have sufficient precision, at least 1000 μS/2.5 μS=400 of horizontal period is needed as a non-light-emitting period in the horizontal period required for such $V_{th}$ detection. Therefore, the light emission duty of the conventional display device using two signal lines becomes (1110 horizontal period−400 horizontal period)/1110 horizontal period=64% or less.

Next, the light emission duty of the display device having the drive blocks according to one or more exemplary embodiments shall be calculated. Assuming that 1000 μS is required for a $V_{th}$ detection period to have sufficient precision as in the above described condition, in the case of block driving, a period A (threshold voltage detection preparation period+ threshold voltage detection period) shown in FIG. 5A is equivalent to the aforementioned 1000 μS. In this case, the non-light-emitting period for one frame becomes at least 1000 μS×2=2000 μS since the aforementioned period A and a writing period are included. Therefore, the light emission duty of the display device having the drive blocks according to one or more exemplary embodiments is (1 frame time− 2000 μS)/1 frame time, and by substituting (1 sec./120 Hz) as the 1 frame time, is 76% or less.

According to the above comparison result, compared to the conventional display device using two signal lines, combining block driving as in the present disclosure ensures a longer light emission duty even when the same threshold voltage detection period is set. Therefore, it is possible to realize a display device that ensures sufficient light-emitting luminance and has long operational life due to reduced output load on drive circuits.

Conversely, it can be seen that when the same light emission duty is set to the conventional display device using two signal lines and the display device combining block driving as in the present disclosure, the display device according to one or more exemplary embodiments ensures a longer threshold voltage detection period.

The driving method of the display device 1 according to the present embodiment shall be described once again.

Meanwhile, at a time t8, the correction of the threshold voltage of the drive transistors 114 in the (k+1)th drive block begins.

First, immediately before the time t8, all the voltage levels of the scanning lines 133 (k+1, 1) to 133 (k+1, m) are LOW, and the voltage levels of the first control line 132(k+1) and the second control line 131(k+1) are also LOW. From the moment that the voltage level of the second control line 131(k+1) is LOW, the switching transistor 116 turns ON. With this, the organic EL element 113 stops emitting light, and the concurrent light-emission of the pixels in the (k+1)th drive block ends. At the same time, the non-light-emitting period of the (k+1)th drive block begins.

First, at the time t8, the scanning/control line drive circuit 14 causes the voltage levels of the scanning lines 133 (k+1, 1) to 133 (k+1, m) to simultaneously change from LOW to HIGH so as to turn ON the switching transistor 115. Furthermore, at this time, the voltage level of the second control line 131(k+1) is already at LOW and the switching transistor 116 is already OFF (S21 in FIG. 6), and the signal line drive circuit 15 causes the voltage of the second signal line 152 to change from the signal voltage to the standard voltage (522 in FIG. 6). With this, the reference signal voltage is applied to the gate of the drive transistor 114.

Next, at a time t9, the scanning/control line drive circuit 14 causes the voltage level of the first control line 132(k+1) to change from LOW to HIGH, then causes the voltage level to change to LOW at a time t10 after a certain period of time has passed (S23 in FIG. 6). Furthermore, at this time, since the voltage level of the second control line 131(k+1) is maintained at LOW, the potential difference between the source electrode S(M) of the drive transistor 114 and the cathode electrode of the organic EL element 113 becomes asymptotic to the threshold voltage of the organic EL element 113. With this, the potential difference that is accumulated in the electrostatic holding capacitor 117 of the current control unit 100 is set to the potential difference which allows for the detection of the threshold voltage of the drive transistor, thereby completing the preparation for the threshold voltage detection process.

Next, at a time t11, the scanning/control line drive circuit 14 causes the voltage level of the second control line 131(k+1) to change from LOW to HIGH so as to turn ON the switching transistor 116. With this, the drive transistor 114 turns ON and supplies the drain current to the electrostatic holding capacitors 117 and 118, and to the organic EL element 113 which is OFF. At this time, the gate-source voltage of the drive transistor 114 is recorded in the electrostatic holding capacitors 117 and 118 and the organic EL element 113. It should be noted that since, at this time, the anode electrode potential of the organic EL element 113, that is, the source electrode potential of the drive transistor 114 is a potential lower than $-V_{th}$ (<0), and the cathode electrode potential of the organic EL element 113 is 0 V, the organic EL element 113 becomes inversely-biased, and thus the organic EL element 113 functions as an electrostatic capacitor $C_{EL}$ without emitting light.

In a period from the time t11 to a time t12, the circuit of the pixel 11B becomes steady, and a voltage equivalent to the threshold voltage Vth of the drive transistor 114 is held in the electrostatic holding capacitors 117 and 118. It should be noted that the precision of the detection of the threshold voltage $V_{th}$ held in the electrostatic holding capacitors 117 and 118 improves as this period becomes longer. Therefore, by ensuring that this time is sufficiently long, highly-precise voltage compensation is realized.

Next, at the time t12, the scanning/control line drive circuit 14 causes the voltage levels of the scanning lines 133 (k+1, 1) to 133(k+1, m) to simultaneously change from HIGH to LOW so as to turn OFF the switching transistor 115 (S24 in FIG. 6). With this, the drive transistor 114 turns OFF. At this time, the voltage equivalent to the threshold voltage $V_{th}$ of the drive transistor 114 is simultaneously held in the respective electrostatic holding capacitors 117 included in all of the pixels 11B of the (k+1)th drive block.

Next, at a time t13, the scanning/control line drive circuit 14 causes the voltage level of the second control line 131(k+1) to change from HIGH to LOW.

As described thus far, in the period from the time t11 to the time t12, the correction of the threshold voltage Vth of the drive transistor 114 is performed simultaneously in the (k+1) th drive block.

Next, at the time t13 and onward, the scanning/control line drive circuit 14 causes the voltage levels of the scanning lines 133 (k+1, 1) to 133 (k+1, m) to sequentially change from LOW to HIGH to LOW so as to sequentially turn ON the switching transistors 115 on a per pixel row basis. Furthermore, at this time, the signal line drive circuit 15 causes the voltage of the second signal line 152 to change from the standard voltage to the signal voltage (S25 in FIG. 6). With this, the signal voltage is applied to the gate of the drive transistor 114. At this time, a summed voltage obtained by adding a voltage corresponding to this signal voltage Vdata and the voltage equivalent to the previously held threshold voltage $V_{th}$ of the drive transistor 114 is written into the electrostatic holding capacitor 117.

As described thus far, in the period from the time t13 onward, the writing of the corrected signal voltage is sequentially executed in the (k+1)th drive block on a per pixel row basis.

Next, at a time t15 onward, the voltage level of the second control line 131(k+1) is caused to change from LOW to HIGH (S26 in FIG. 6). With this, a drive current corresponding to the aforementioned summed voltage flows to the organic EL element 113. In other words, light emission begins concurrently in all the pixels 11B in the (k+1)th drive block.

As described thus far, in the period from the time t15 onward, the light emission in the organic EL elements 113 is executed simultaneously in the (k+1)th drive block.

The operations described thus far are also executed sequentially in the (k+2)th drive block onward in the display panel 10.

Figure 8:
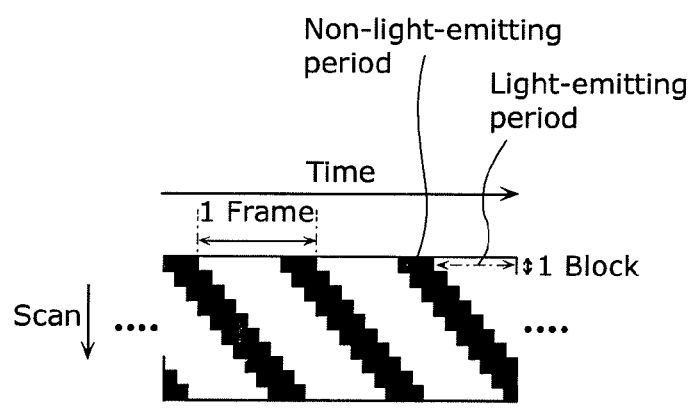
FIG. 8 is a state transition diagram of drive blocks which emit light according to the driving method according to Embodiment 1.

FIG. 8 is a state transition diagram of drive blocks which emit light according to the driving method according to Embodiment 1. In the figure, the light-emitting periods and the non-light-emitting periods of each drive block in a certain pixel column are shown. Plural drive blocks are shown in the vertical direction, and the horizontal axis shows time. Here, the non-light-emitting period includes the above-described threshold voltage correction period and the signal voltage writing period. According to the driving method of the display device according to Embodiment 1, light-emitting periods are concurrently set in the same drive block. Therefore, among the drive blocks, the light-emitting periods appear in a staircase pattern with respect to the row scanning direction.

As described thus far, the drive transistor 114 threshold voltage correction periods as well as the timings thereof can be made uniform within the same drive block through the pixel circuits in which the switching transistor 116 and the electrostatic holding capacitor 118 are provided, the disposition of the control lines, scanning lines, and signal lines to the respective pixels that are grouped into drive blocks, and the above-described driving method. In addition, the light-emitting periods as well as the timings thereof can be made uniform within the same drive block. Therefore, the load on the scanning/control line drive circuit 14 which outputs signals for controlling the conduction and non-conduction of respective switching transistors and signals for controlling current paths, and on the signal line drive circuit 15 which controls signal voltages is reduced. In addition, through the above-described grouping into drive blocks and the two signal lines arranged for every pixel column, the threshold voltage correction period of the drive transistor 114 can occupy a large part of a 1 frame period Tf which is the time in which all the pixels are refreshed. This is because the threshold voltage correction period is provided in the (k+1)th drive block in the period in which the luminance signal is sampled in the kth drive block. Therefore, the threshold voltage correction period is not divided on a per pixel row basis, but is divided on a per drive block basis. Thus, even when the display area is increased, a long relative threshold voltage correction period with respect to a 1 frame period can be set without a significant increase in the number of outputs of the scanning/control line drive circuit 14 and without reducing light emission duty. With this, a drive current based on a precisely corrected signal voltage flows to the light-emitting elements, and thus display quality improves.

For example, in the case where the display panel 10 is divided into N drive blocks, the threshold voltage correction period allocated to each pixel is at most Tf/N. In contrast, in the case where the threshold voltage correction period is set at a different timing for each of the pixel rows, and it is assumed that there are M rows of pixel rows (M>>N), the threshold voltage correction period allocated to each pixel is at most Tf/M. Furthermore, even in the case where two signal lines are disposed for each pixel column as disclosed in PTL 1, the threshold voltage correction period allocated to each pixel is at most 2 Tf/M.

Furthermore, the display device 1 in this embodiment includes the first signal line 151 and the second signal line 152 which are disposed, for every m pixels 11A and 11B that correspond to respective n columns in a matrix of m rows and n columns, in the column direction and corresponding to the m pixels 11A and 11B, among the pixels 11A and 11B, and apply the signal voltage which determines the luminance of the m pixels 11A and 11B to the m pixels 11A and 11B Specifically, the first signal line 151 is disposed on the left side of a corresponding column, and the second signal line 152 is disposed on the right side of a corresponding column. Specifically, the first signal line 151 is disposed on the left side of the switching transistor 115 of the pixels 11A and 11B of a corresponding column, and the second signal line 152 is disposed on the right side of the switching transistor 115 of the pixels 11A and 11B of a corresponding column. Furthermore, the two signal lines (first signal line 151 and second signal line 152) further apply, to the pixels 11A and 11B, the standard voltage for initializing the drive transistor included in the pixels 11A and 11B. Furthermore, the first signal line 151 is disposed so as not to cross with the second connecting lines, and the second signal line 152 is disposed so as not to cross with the first connecting lines.

Accordingly, parasitic capacitance generated due to the crossing of signal lines as in the display device 500 in FIG. 26 for example is not generated in the display device 1 according to this embodiment. As a result, in the display device 1, the need to charge and discharge the parasitic capacitance when performing the control for causing the pixels 11A and 11B to emit light is eliminated, and thus unnecessary power consumption can be suppressed. In other words, the display device 1 is capable of reducing power consumption. In addition, since the fluctuation of the standard voltage in the threshold voltage detection period can be suppressed, it is possible to hold the precise threshold voltage in the electrostatic holding capacitors 117 and 118. In other words, threshold voltage detection precision is improved.

Furthermore, by grouping into drive blocks, the second control line for controlling the turning ON and OFF of the voltage application to the drive transistor 114 and the first control line for controlling the current path of the drive current from the source onward can be provided in common within a drive block. Therefore, the number of control lines outputted from the scanning/control line drive circuit 14 is reduced. Therefore, the load on the drive circuit is reduced.

For example, in the conventional display device 500 disclosed in PTL 1, two control lines (a power supply line and a scanning line) are disposed per pixel row. Assuming that the display device 500 includes M rows of pixel rows, the control lines would total 2M lines.

In contrast, in the display device 1 according to Embodiment 1, one scanning line per pixel row and two control lines per drive block are outputted from the scanning/control line drive circuit 14. Therefore, assuming that the display device 1 includes M rows of pixel rows, the control lines (including scanning lines) would total (M+2N) lines.

Since M>>N is realized in the case where surface area is enlarged and the number of pixel rows is large, in such case, the number of control lines in the display device 1 according to one or more exemplary embodiments can be reduced to approximately half compared to the number of control lines in the conventional display device 500.

Modification of Embodiment 1

Compared to the display device 1 according to Embodiment 1, in a display device according to a modification of Embodiment 1, the circuit configuration for the respective pixels is the same but the arrangement of the first signal line 151 and the second signal line 152 is different. Specifically, in an ith column (i is an integer satisfying: $1 \leq i \leq n-1$) of pixels 11A and 11B arranged in a matrix of m rows and n columns, the first signal line 151 is disposed on one of the left side and the right side of the switching transistor 115 included in the pixels 11A and 11B of the corresponding column, and the second signal line 152 is disposed on the other of the left side and the right side of the switching transistor 115 included in the pixels 11A and 11B of the corresponding column. In an (i+1)th column, the first signal line 151 is disposed on the other of the left side and the right side of the switching transistor 115 included in the pixels 11A and 11B of a corresponding column, and the second signal line 152 is disposed on the one of the left side and the right side of the switching transistor 115 included in the pixels 11A and 11B of a corresponding column.

Hereinafter, only the points of difference of the modification of Embodiment 1 shall be described with reference to the Drawings, and description of points that are the same as in the display device 1 according to Embodiment 1 shall be omitted.

Figure 9:
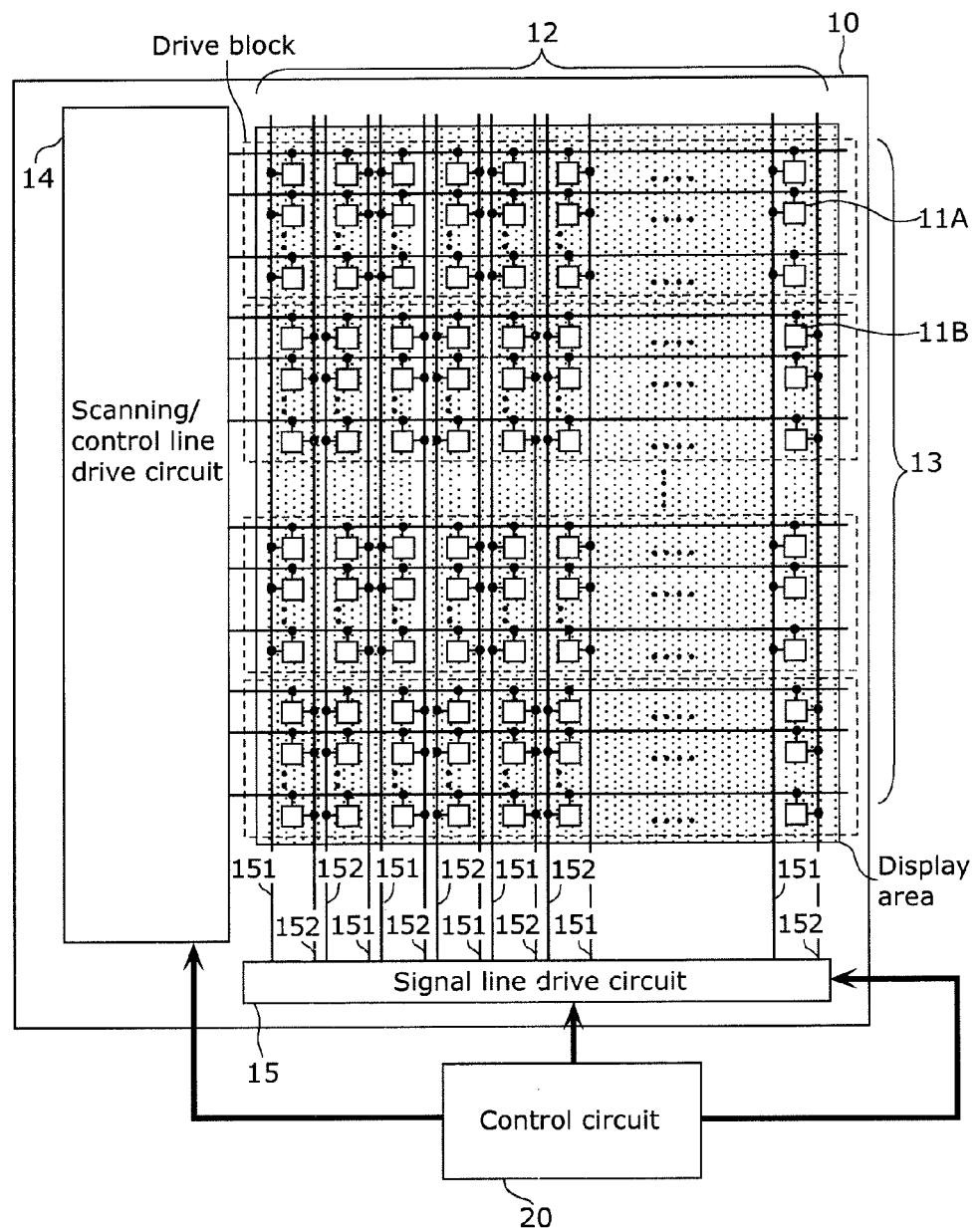
FIG. 9 is a block diagram showing the electrical configuration of a display device according to a modification of Embodiment 1.

FIG. 9 is a block diagram showing the electrical configuration of a display device according to the modification of Embodiment 1. It should be noted that the layout of plural pixels 11A and 11B, the first signal lines 151 and second signal lines 152 shown in the figure simulates the arrangement when a display panel 10 is seen from a top face.

As described above, compared to the display device 1 according to Embodiment 1, in the display device shown in the figure, in an ith column (i is an integer satisfying: $1 \leq i \leq n-1$) of pixels 11A and 11B arranged in a matrix of m rows and n columns, the first signal line 151 is disposed on one of the left side and the right side of the switching transistor 115 included in the pixels 11A of the corresponding column, and the second signal line 152 is disposed on the other of the left side and the right side of the switching transistor 115 included in the pixels 11B of the corresponding column. Furthermore, in an (i+1)th column, the first signal line 151 is disposed on the other of the left side and the right side of the switching transistor 115 included in the pixels 11A of a corresponding column, and the second signal line 152 is disposed on the one of the left side and the right side of the switching transistor 115 included in the pixels 11B of a corresponding column. For example, in this modification, the ith column corresponds to all the odd columns and the (i+1)th column corresponds to all the even columns.

Stated differently, the first signal line 151 and the second signal line 152 are never disposed side by side in between adjacent columns. Accordingly, since the parasitic capacitance generated between the first signal line 151 and second signal line 152 can be further reduced, the effect of potential fluctuation in the signal lines supplying the signal voltage on the signal lines supplying the voltage for detecting the threshold voltage is further reduced.

Therefore, the display device according to this modification can more precisely correct the threshold voltage compared to the display device 1 according to Embodiment 1.

Specifically, since two signal lines (two first signal lines or two second signal lines) disposed between adjacent columns are supplied with the signal voltage and the standard voltage at the same timing and period, the effect of potential fluctuation in the signal lines supplying the signal voltage on the signal lines supplying the voltage for detecting the threshold voltage is further reduced, in the same manner as described above.

Embodiment 2

Hereinafter, Embodiment 2 shall be described with reference to the Drawings.

Figure 10:
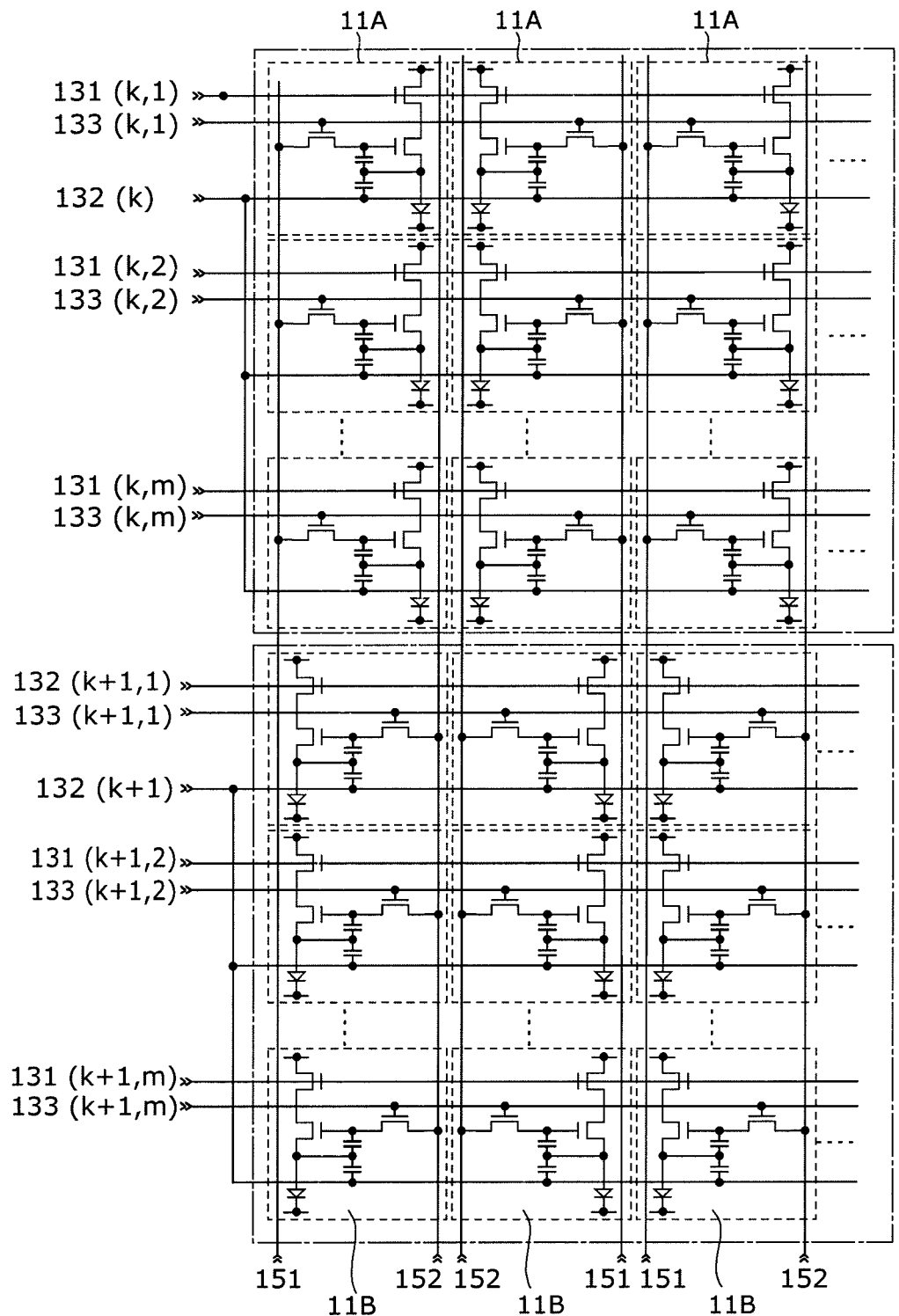
FIG. 10 is a circuit configuration diagram showing part of a display panel included in a display device according to Embodiment 2.

FIG. 10 is a circuit configuration diagram showing part of a display panel included in a display device according to Embodiment 2. The figure shows two adjacent drive blocks and respective control lines, respective scanning lines, and respective signal lines. In the figure and the subsequent description, the respective control lines, respective scanning lines, and respective signal lines shall be represented by "reference number (block number; row number of the block)" or "reference number (block number)".

Compared to the display device 1 according to Embodiment 1, the display device shown in the figure has the same circuit configuration for the respective pixels but is different only in that the second control line 131 is not provided in common on a drive block basis and is connected on a per pixel row basis to the scanning/control line drive circuit 14 not shown in the figure. Description of points identical to those in the display device 1 according to Embodiment 1 shall be omitted and only the points of difference shall be described hereafter.

In the kth drive block shown at the top stage of FIG. 10, each of the second control lines 131(k, 1) to 131(k, m) are disposed to a corresponding one of the pixel rows in the drive block and is separately connected to the gates of the respective switching transistors 116 included in the corresponding pixels 11A in the drive block. Furthermore, the first control line 132(k) is connected in common to the respective electrostatic holding capacitors 118 included in all the pixels 11A in the drive block. On the other hand, each of the scanning lines 133 (k, 1) to 133 (k, m) are separately connected on a per pixel row basis. Furthermore, the same connections as those in the kth drive block are also adopted for the (k+1)th drive block shown in the bottom stage of FIG. 10. However, the first control line 132(k) connected to the kth drive block and the first control line 132(k+1) connected to the (k+1)th drive block are different control lines, and separate control signals are outputted from the scanning/control line drive circuit 14.

Furthermore, in the kth drive block, the first signal line 151 is connected to the other of the source and drain of the respective switching transistors 115 included in all of the pixels 11A in the drive block. Meanwhile, in the (k+1)th drive block, the second signal line 152 is connected to the other of the source and drain of the respective switching transistors 115 included in all of the pixels 11B in the drive block.

As described above, with the above-described grouping into drive blocks, the number of first control lines 132 for controlling the respective $V_{th}$ detection circuits is reduced. Therefore, the load on the scanning/control line drive circuit 14 which outputs drive signals to these control lines is reduced.

Figure 11:
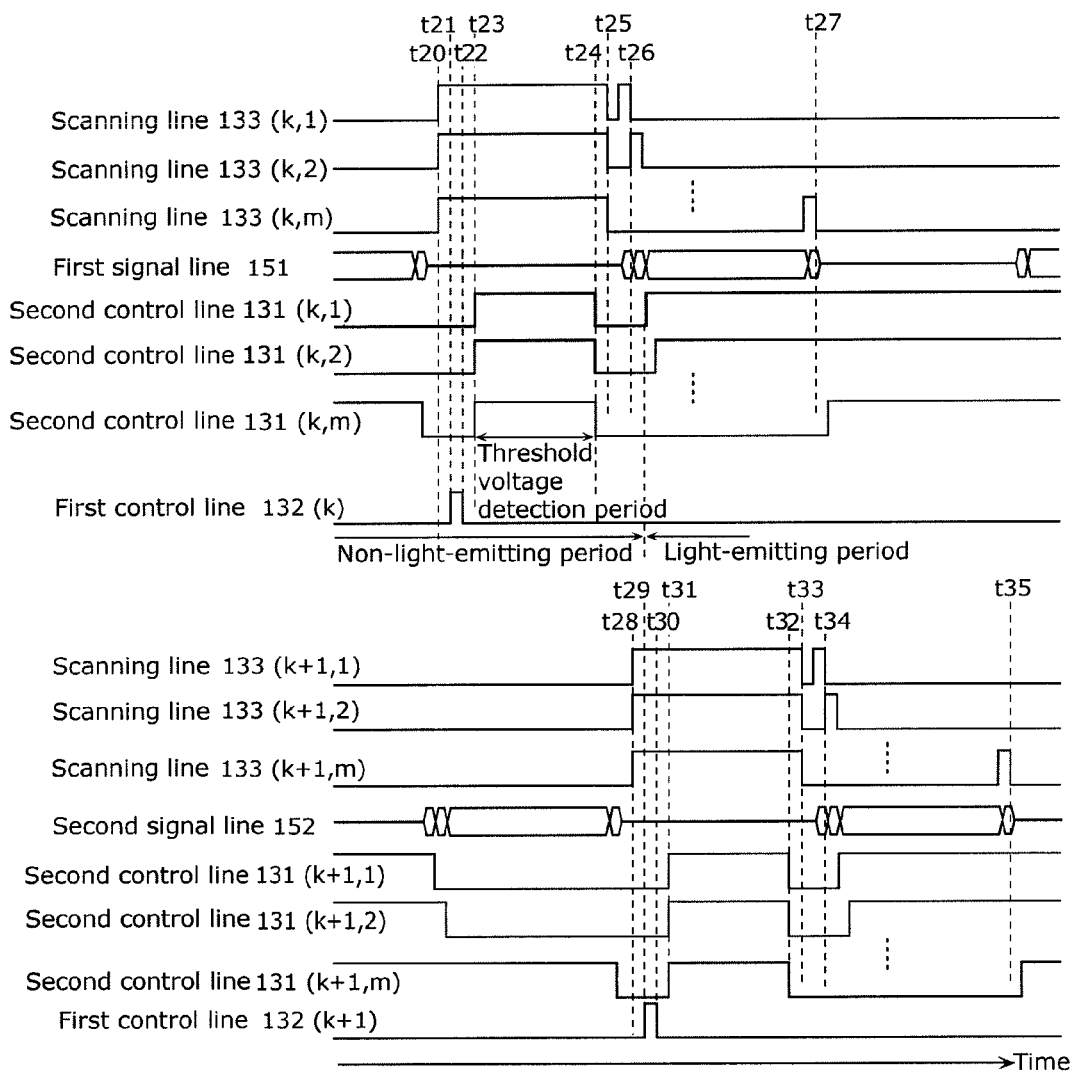
FIG. 11 is an operation timing chart for the driving method of the display device according to Embodiment 2.

Next, the driving method of the display device according to this embodiment shall be described using FIG. 11.

FIG. 11 is an operation timing chart for the driving method of the display device according to Embodiment 2. In the figure, the horizontal axis denotes time. Furthermore, in the vertical direction, the waveform diagrams of the voltage generated in the scanning lines 133 (k, 1), 133 (k, 2), and 133 (k, m), the first signal line 151, the second control lines 131(k, 1), 131(k, 2), and 131(k, m), and the first control line 132(k) of the kth drive block are shown in sequence from the top. Furthermore, continuing therefrom, the waveform diagrams of the voltage generated in the scanning lines 133 (k+1, 1), 133 (k+1, 2), and 133 (k+1, m), the second signal line 152, the second control lines 131(k+1, 1), 131(k+1, 2), and 131(k+1, m), and the first control line 132(k+1) of the (k+1)th drive block are shown.

Compared to the driving method according to Embodiment 1 shown in FIG. 4, the driving method according to this embodiment is different only in that the signal voltage writing periods as well as the light-emitting periods are set on a per pixel row basis, without the light-emitting periods being made uniform within a drive block.

First, immediately before a time t20, all the voltage levels of the scanning lines 133 (k, 1) to 133 (k, m) are LOW, and the voltage levels of the first control line 132(k) and the second control lines 131(k, 1) to 131(k, m) are also LOW. As shown in (a) in FIG. 5, from the moment that the voltage level of the second control lines 131(k, 1) to 131(k, m) are LOW, the switching transistors 116 turn OFF. With this, the organic EL element 113 stops emitting light, and the concurrent light emission in each of the pixel rows in the kth block ends. At the same time, the non-light-emitting period of the kth drive block begins.

Next, at the time t20, the scanning/control line drive circuit 14 causes the voltage levels of the scanning lines 133 (k, 1) to 133 (k, m) to simultaneously change from LOW to HIGH so as to turn ON the switching transistor 115. It should be noted that, at this time, the voltage levels of the second control lines 131(k, 1) to 131(k, m) are already at LOW and the switching transistor 116 is already OFF (S11 in FIG. 6). Furthermore, at this time, the signal line drive circuit 15 causes the voltage of the first signal line 151 to change from the signal voltage to the standard voltage (S12 in FIG. 6). With this, the reference signal voltage is applied to the gate of the drive transistor 114.

Next, at a time t21, the scanning/control line drive circuit 14 causes the voltage level of the first control line 132(k) to change from LOW to HIGH, then causes the voltage level to change to LOW at a time t22 after a certain period of time has passed (S13 in FIG. 6). It should be noted that, at this time, since the voltage level of the second control lines 131(k, 1) to 131(k, m) are maintained at LOW, the potential difference between the source electrode S(M) of the drive transistor 114 and the cathode electrode of the organic EL element 113 becomes asymptotic to the threshold voltage of the organic EL element 113. At this time, at the time t22, the potential Vs of the source electrode S(M) of the drive transistor 114 is defined by Expression 2 described in Embodiment 1. With this, the potential difference that is accumulated in the electrostatic holding capacitor 117 of the current control unit 100 is set to the potential difference which allows for detection of the threshold voltage of the drive transistor. In this manner, the preparation for the threshold voltage detection process is completed.

Next, at a time t23, the scanning/control line drive circuit 14 causes the voltage levels of the second control lines 131(k, 1) to 131(k, m) to concurrently change from LOW to HIGH so as to turn ON the respective switching transistors 116. With this, the drive transistor 114 turns ON and supplies the drain current to the electrostatic holding capacitors 117 and 118, and to the organic EL element 113 which is OFF. At this time, Vs defined in Expression 2 becomes asymptotic to $-V_{th}$. With this, the gate-source voltage of the drive transistor 114 is recorded in the electrostatic holding capacitors 117 and 118 and the organic EL element 113. It should be noted that since, at this time, the anode electrode potential of the organic EL element 113, that is, the source electrode potential of the drive transistor 114 is a potential lower than $-V_{th}$ (<0), and the cathode electrode potential of the organic EL element 113 is 0 V, the organic EL element 113 becomes inversely-biased, and thus the organic EL element 113 functions as an electrostatic capacitor $C_{EL}$ without emitting light.

Then, in the period from the time t23 to a time t24, the circuit of the pixel 11A becomes steady, and a voltage equivalent to the threshold voltage $V_{th}$ of the drive transistor 114 is held in the electrostatic holding capacitors 117 and 118. It should be noted that, since the flowing current for causing the voltage equivalent to the threshold voltage $V_{th}$ to be held in the electrostatic holding capacitors 117 and 118 is minute, reaching the steady state takes time. Therefore, the longer this period is, the more stable the voltage held in the electrostatic holding capacitors 117 and 118 becomes, and by ensuring that this period is sufficiently long, voltage compensation having high-precision is realized.

Meanwhile, in the period from the time t23 to the time t24, a signal voltage is applied to the second signal line 152 connected to the pixel 11B included in the (k+1)th drive block. Here, the first signal line 151 and the second signal line 152 are disposed, for every column that includes m pixels and corresponds to a different one of n columns, in the column direction and corresponding to m pixels 11A and 11B. The first signal line 151 is disposed on the left side of the switching transistor 115 included in the pixels 11A and 11B of the corresponding column, and the second signal line 152 is disposed on the right side of the switching transistor 115 included in the pixels 11A and 11B of the corresponding column. In addition, the first connecting line is disposed so as not to cross with the second signal line 152, and the second connecting line is disposed so as not to cross with the first signal line 151.

Accordingly, as in the display device 1 according to Embodiment 1, parasitic capacitance generated due to the crossing of signal lines is not generated in the display device according to this embodiment.

Therefore, in the period from the time t23 to the time t24, that is, in the threshold voltage detection period of the pixel 11A, the standard voltage supplied to the first signal line 151 is not affected by the signal voltage supplied to the second signal line 152, via the parasitic capacitance generated due to crossing of signal lines. Stated differently, fluctuation of the potential of the first signal line 151 which supplies the standard voltage for detecting the threshold voltage can be suppressed.

Therefore, the display device according to this embodiment is capable of improving threshold voltage detection precision in the same manner as the display device 1 according to Embodiment 1.

Next, at the time t24, the scanning/control line drive circuit 14 causes the voltage levels of the second control lines 131(k, 1) to 131(k, m) to concurrently change from HIGH to LOW (S14 in FIG. 6). With this, the current supply to the drive transistor 114 is stopped. At this time, the voltage equivalent to the threshold voltage $V_{th}$ of the drive transistor 114 is simultaneously held in the respective electrostatic holding capacitors 117 and 118 included in all of the pixels 11A of the kth drive block.

Next, at a time t25, the scanning/control line drive circuit 14 causes the voltage levels of the scanning lines 133 (k, 1) to 133 (k, m) to simultaneously change from HIGH to LOW so as to turn OFF the switching transistor 115.

As described thus far, in the period from the time t20 to the time t25, the correction of the threshold voltage $V_{th}$ of the drive transistor 114 is executed simultaneously in the kth drive block.

Next, at the time t25 and onward, the scanning/control line drive circuit 14 causes the voltage levels of the scanning lines 133 (k, 1) to 133 (k, m) to sequentially change from LOW to HIGH to LOW so as to sequentially turn ON the switching transistors 115 on a per pixel row basis. Furthermore, at this time, the signal line drive circuit 15 causes the voltage of the first signal line 151 to change from the standard voltage to the signal voltage Vdata (S15 in FIG. 6). With this, the signal voltage Vdata is applied to the gate of the drive transistor 114. At this time, the potential difference Vgs held in the electrostatic holding capacitor 117 is the difference between Vdata and the potential defined in Expression 3 described in Embodiment 1, and is defined by the relationship in Expression 4. In other words, a summed voltage obtained by adding a voltage corresponding to this signal voltage Vdata and the voltage equivalent to the previously held threshold voltage $V_{th}$ of the drive transistor 114 is written into the electrostatic holding capacitor 117.

Furthermore, after the voltage level of the scanning line 133 (k, 1) changes from LOW to HIGH to LOW, the scanning/control line drive circuit 14 next causes the voltage level of the second control line 131(k, 1) to change from LOW to HIGH. This operation is sequentially repeated on a per pixel row basis.

As described thus far, from the time t25 onward, the writing of the corrected luminance signal voltage and the emission of light are sequentially executed in the kth drive block on a per pixel row basis.

As described thus far, in a period from the time t26 onward, the light emission by the organic EL elements 113 is executed in the kth drive block on a per pixel row basis. Here, the drain current id flowing in the drive transistor 114 is defined by Expression 5, using a voltage value obtained by deducting the threshold voltage $V_{th}$ of the drive transistor 114 from the Vgs defined in Expression 4 in Embodiment 1. It can be seen from Expression 5 that the drain current id for causing the organic EL element 113 to emit light is a current that is not dependent on the threshold voltage $V_{th}$ of the drive transistor 114.

As described thus far, grouping the pixel rows into drive blocks allows the correction of the threshold voltage $V_{th}$ of the drive transistors 114 to be executed simultaneously in the respective drive blocks. With this, the control of the current path from the source of such drive current onward can be synchronized in the respective drive blocks. Therefore, the first control line 132 can be provided in common in each of the drive blocks.

Furthermore, although the scanning lines 133 (k, 1) to 133 (k, m) are separately connected to the scanning/control line drive circuit 14, the timing of the drive pulse in the threshold voltage correction period is the same. Therefore, the scanning/control line drive circuit 14 can suppress the rising of the frequency of the pulse signals to be outputted, and thus the output load on the drive circuit can be reduced.

From the same perspective as Embodiment 1, this embodiment also has the advantage that light emission duty can be secured longer compared to the conventional display device using two signal lines disclosed in PTL 1.

Therefore, it is possible to realize a display device that ensures sufficient light-emitting luminance and has long operational life due to reduced output load on drive circuits.

Furthermore, it can be seen that when the same light emission duty is set to the conventional display device using two signal lines and the display device combining block driving as in the present disclosure, the display device according to one or more exemplary embodiments ensures a longer threshold voltage detection period.

It should be noted that the operation of the (k+1)th block from a time t28 to a time 35 is the same as the above-described operation of the kth drive block, and thus description thereof shall be omitted.

The operations described thus far are also executed sequentially in the (k+2)th drive block onward in the display panel 10.

Figure 12:
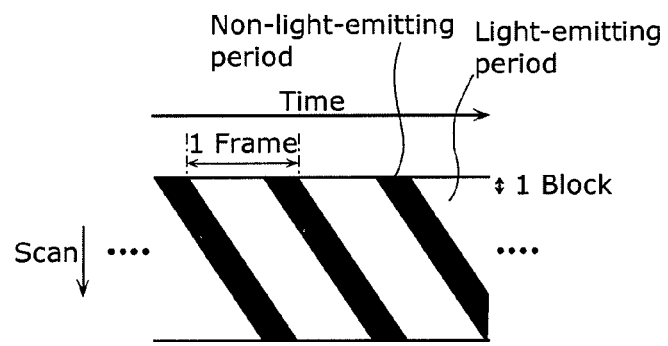
FIG. 12 is a state transition diagram of drive blocks which emit light according to the driving method according to Embodiment 2.

FIG. 12 is a state transition diagram of drive blocks which emit light according to the driving method according to Embodiment 2. In the figure, the light-emitting periods and the non-light-emitting periods of each drive block in a certain pixel column are shown. Plural drive blocks are shown in the vertical direction, and the horizontal axis shows time. Here, the non-light-emitting production period includes the above-described threshold voltage correction period.

According to the driving method of the display device according to Embodiment 2, the light-emitting periods are also sequentially set on a per pixel row basis within the same drive block. Therefore, even within a drive block, the light-emitting periods appear in a continuous manner with respect to the row scanning direction.

As described thus far, the drive transistor 114 threshold voltage correction periods as well as the timings thereof can also be made uniform within the same drive block in Embodiment 2 through the pixel circuit provided with the switching transistor 116 and the electrostatic holding capacitor 118, and through the disposition of control lines, scanning lines, and signal lines to the respective pixels that have been grouped into drive blocks. Therefore, the load on the scanning/control line drive circuit 14 which outputs signals for controlling current paths, and on the signal line drive circuit 15 which controls signal voltages is reduced. In addition, through the above-described grouping into drive blocks and the two signal lines arranged for every pixel column, the threshold voltage correction period of the drive transistor 114 can occupy a large part of a 1 frame period Tf which is the time in which all the pixels are refreshed. This is because the threshold voltage correction period is provided in the (k+1)th drive block in the period in which the luminance signal is sampled in the kth drive block. Therefore, the threshold voltage correction period is not divided on a per pixel row basis, but is divided on a per drive block basis. Therefore, as the display area is increased, a long relative threshold voltage correction period can be set with respect to 1 frame period, without allowing light emission duty to decrease with the increase in the display area. With this, a drive current based on a precisely corrected signal voltage flows to the light-emitting elements, and thus display quality improves.

For example, in the case where the display panel 10 is divided into N drive blocks, the threshold voltage correction period allocated to each pixel is at most Tf/N.

Furthermore, since parasitic capacitance generated due to the crossing of signal lines is likewise not generated, Embodiment 2 is also capable of suppressing unnecessary power consumption and realizing precise threshold voltage correction in the same manner as Embodiment 1.

Embodiment 3

Hereinafter, Embodiment 3 shall be described with reference to the Drawings.

The electrical configuration of the display device according to this embodiment is the same as the configuration shown in FIG. 1 except for the circuit configuration of the pixels. Specifically, the display device according to this embodiment includes the display panel 10, and the control circuit 20. The display panel 10 includes plural pixels 21A and 21B which are to be described later, the signal line group 12, the control line group 13, the scanning/control line drive circuit 14, and the signal line drive circuit 15.

Description of configurations overlapping with those in Embodiments 1 and 2 shall be omitted, and only those configurations related to the pixels 21A and 21B shall be described hereinafter.

The pixels 21A and 21B are arranged in a matrix on the display panel 10. Here, the pixels 21A and 21B compose two or more drive blocks each of which is one drive block made up of plural pixel rows. The pixels 21A compose odd drive blocks and the pixels 21B compose even drive blocks.

Figure 13A:
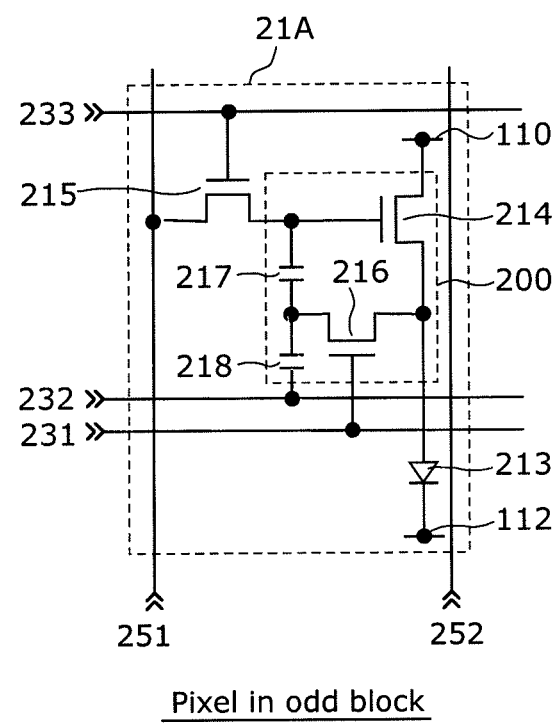
FIG. 13A is a specific circuit configuration diagram of a pixel in an odd drive block in a display device according to Embodiment 3.
Figure 13B:
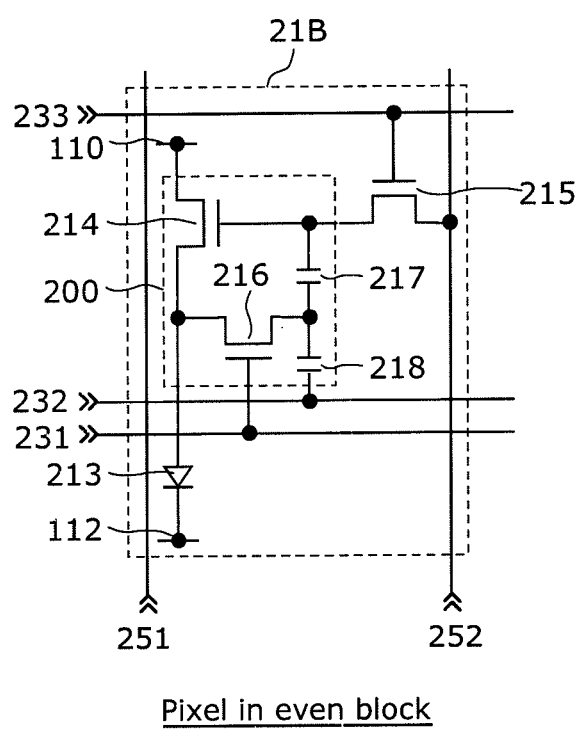
FIG. 13B is a specific circuit configuration diagram of a pixel of an even drive block in the display device according to Embodiment 3.

FIG. 13A is a specific circuit configuration diagram of a pixel of an odd drive block in a display device according to Embodiment 3, and FIG. 13B is a specific circuit configuration diagram of a pixel of an even drive block in the display device according to Embodiment 3. Compared with the pixel circuits in FIG. 2A and FIG. 2B in Embodiment 1, pixels circuits respectively shown in FIG. 13A and FIG. 13B are different in that a switching transistor 216 is added in place of the switching transistor 116. In the same manner, a current control unit 200 is different in configuration from the current control unit 100 in Embodiment 1 in having the switching transistor 216 added in place of the switching transistor 116. Hereinafter, description of points that overlap with the configuration of the display device shown in FIG. 2A and FIG. 2B shall be omitted.

In FIG. 13A and FIG. 13B, an organic EL element 213 is for example a light-emitting element having a cathode connected to the power source line 112 which is a negative power source line, and an anode connected to the source of a drive transistor 214. The organic EL element 213 emits light according to the flow of the drive current of the drive transistor 214.

The switching transistor 216, which corresponds to the fourth switching transistor, has a gate connected to a second control line 231, one of a source and a drain connected to the other of terminals of the electrostatic holding capacitor 217, and the other of the source and the drain connected to the source of the drive transistor 214. By turning OFF in the period for writing the signal voltage from the signal line, the switching transistor 216 has a function of causing a voltage corresponding to a precise signal voltage to be held in the electrostatic holding capacitor 217. Meanwhile, by turning ON in the threshold voltage detection period and the light-emitting period, the switching transistor 216 has a function of connecting the source of the drive transistor 214 to the electrostatic holding capacitors 217 and 218, causing a voltage corresponding to the threshold voltage and the signal voltage to be held in the electrostatic holding capacitor 217, and to cause the drive transistor 214 to supply the light-emitting element with a drive current reflecting the voltage held in the electrostatic holding capacitor 217. It should be noted that the electrostatic holding capacitor 217 corresponds to the third capacitive element, and the electrostatic holding capacitor 218 corresponds to the fourth capacitive element.

The second control line 231 is connected to the scanning/control line drive circuit 14, and is connected to the respective pixels belonging to the pixel row including either the pixel elements 21A or 21B. With this, the second control line 231 has a function of causing conduction or non-conduction between the source of the drive transistor 214 and the node between the electrostatic holding capacitor 217 and the electrostatic holding capacitor 218.

The first control line 232 is connected to the scanning/control line drive circuit 14, and is connected to the respective pixels belonging to the pixel row including either the pixel elements 21A or 21B. With this, the first control line 232 has a function of adjusting the environment for detecting the threshold voltage of the drive transistor 214, by switching voltage levels.

Next, the inter-pixel connection relationship of the second control line 231, the first control line 232, the scanning line 233, the first signal line 251, and the second signal line 252 shall be described.

Figure 14:
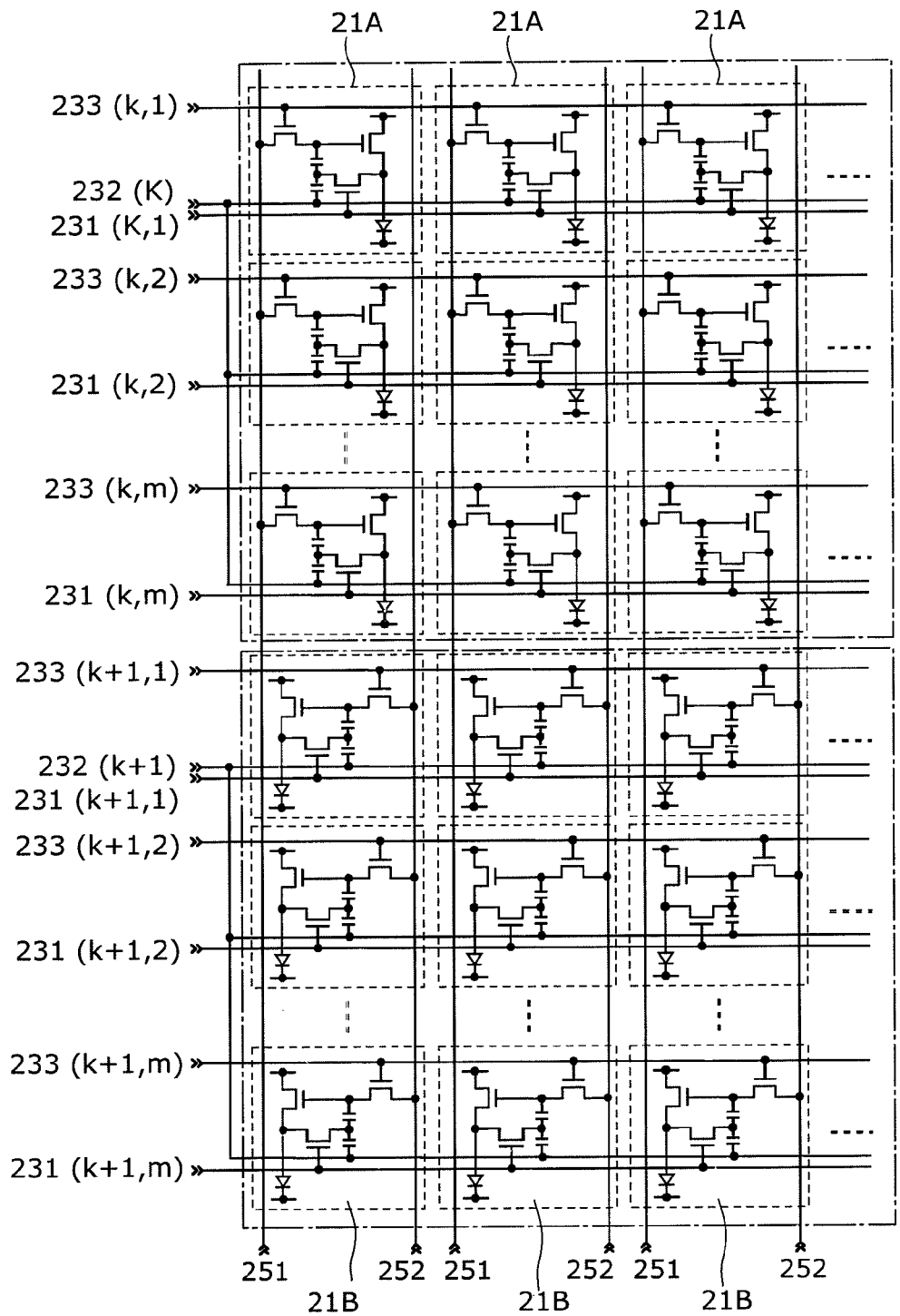
FIG. 14 is a circuit configuration diagram showing part of the display panel included in the display device according to Embodiment 3.

FIG. 14 is a circuit configuration diagram showing part of the display panel included in the display device according to Embodiment 3. The figure shows two adjacent drive blocks and respective control lines, respective scanning lines, and respective signal lines. In the figure and the subsequent description, the respective control lines, respective scanning lines, and respective signal lines shall be represented by "reference number (block number; row number of the block)" or "reference number (block number)".

As previously described, a drive block includes plural pixel rows, and there are two or more drive blocks within the display panel 10. For example, each of the drive blocks shown in FIG. 14 includes m rows of pixel rows.

In the kth drive block shown at the top stage of FIG. 14, each of the second control lines 231(k, 1) to 231(k, m) are disposed to a corresponding one of the pixel rows in the drive block and is separately connected to the gates of the switching transistors 216 included in the respective pixels 21A. Furthermore, the first control line 232(k) is connected in common to the respective electrostatic holding capacitors 218 included in all the pixels 21A in the drive block. Meanwhile, each of the scanning lines 233 (k, 1) to 233 (k, m) are separately connected on a per pixel row basis.

Furthermore, the same connections as those in the kth drive block are also adopted for the (k+1)th drive block shown in the bottom stage of FIG. 14. However, the first control line 232(k) connected to the kth drive block and the first control line 232(k+1) connected to the (k+1)th drive block are different control lines, and separate control signals are outputted from the scanning/control line drive circuit 14.

Furthermore, in the kth drive block, the first signal line 251 is connected to the other of the source and drain of the respective switching transistors 215 included in all of the pixels 21A in the drive block. Meanwhile, in the (k+1)th drive block, the second signal line 252 is connected to the other of the source and drain of the respective switching transistors 215 included in all of the pixels 21B in the drive block. It should be noted that the switching transistor 215 included in the pixel 21A corresponds to the first switching transistor, and the switching transistor 215 included in the pixel 21B corresponds to the second switching transistor.

As described above, with the above-described grouping into drive blocks, the number of first control lines 232 for controlling the respective $V_{th}$ detection circuits is reduced. Therefore, the load on the scanning/control line drive circuit 14 which outputs drive signals to these control lines is reduced. Furthermore, a long $V_{th}$ detection period can be secured, $V_{th}$ detection precision becomes higher, and the consequent display quality improves.

Figure 15:
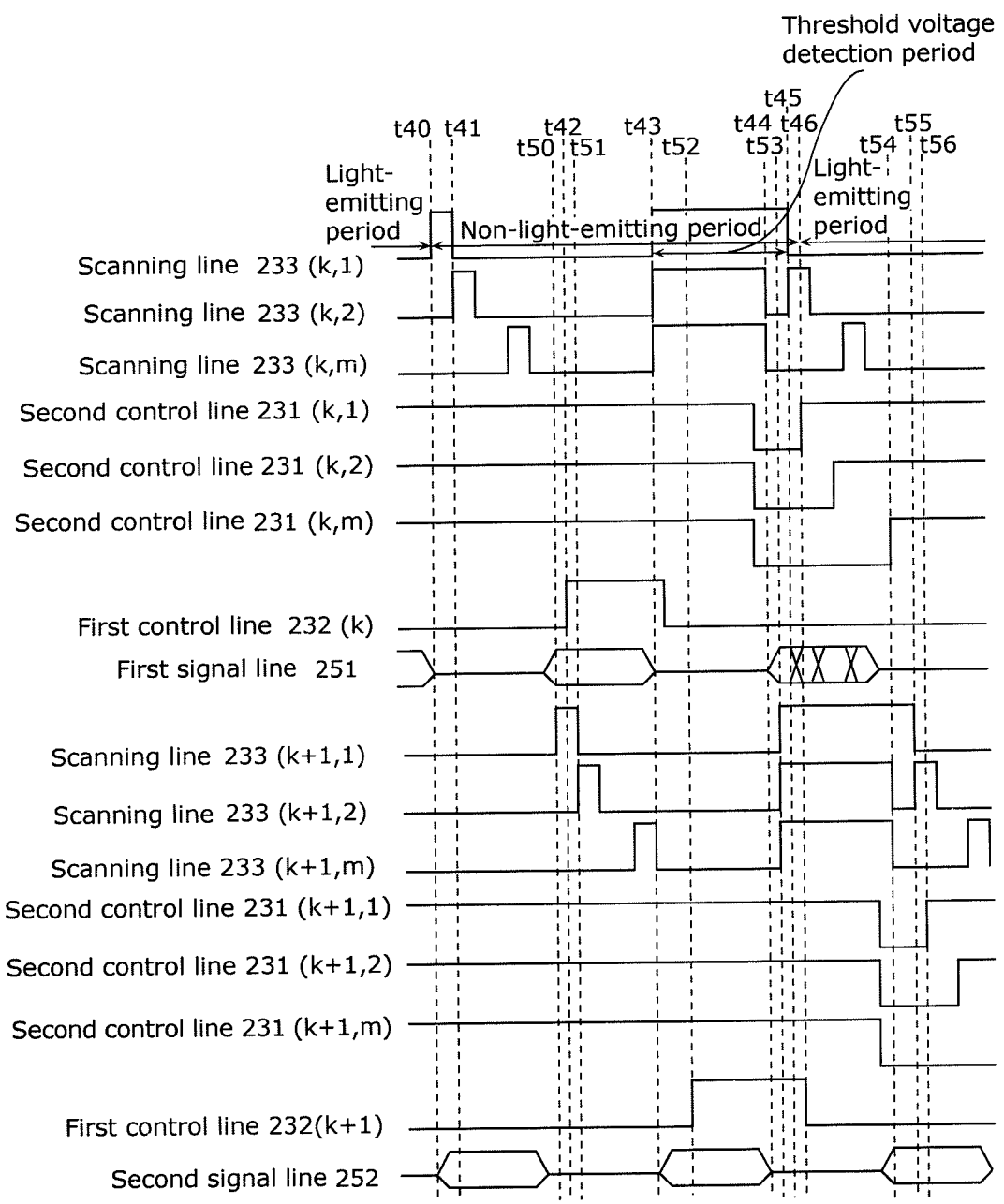
FIG. 15 is an operation timing chart for a driving method of the display device according to Embodiment 3.

Next, the driving method of the display device according to this embodiment shall be described using FIG. 15. It should be noted that, here, the driving method of the display device including the specific circuit configurations shown in FIG. 13A and FIG. 13B shall be described in detail.

FIG. 15 is an operation timing chart for the driving method of the display device according to Embodiment 3. In the figure, the horizontal axis denotes time. Furthermore, in the vertical direction, the waveform diagrams of the voltage generated in the scanning lines 233 (k, 1), 233 (k, 2), and 233 (k, m), the second control lines 231(k, 1), 231(k, 2), and 231(k, m), the first control line 232(k), and the first signal line 251 of the kth drive block are shown in sequence from the top. Furthermore, continuing therefrom, the waveform diagrams of the voltage generated in the scanning lines 233 (k+1, 1), 233 (k+1, 2), and 233 (k+1, m), the second control lines 231(k+1, 1), 231(k+1, 2), and 231(k+1, m), the first control line 232(k+1), and the second signal line 252 of the (k+1)th drive block are shown.

Figure 16:
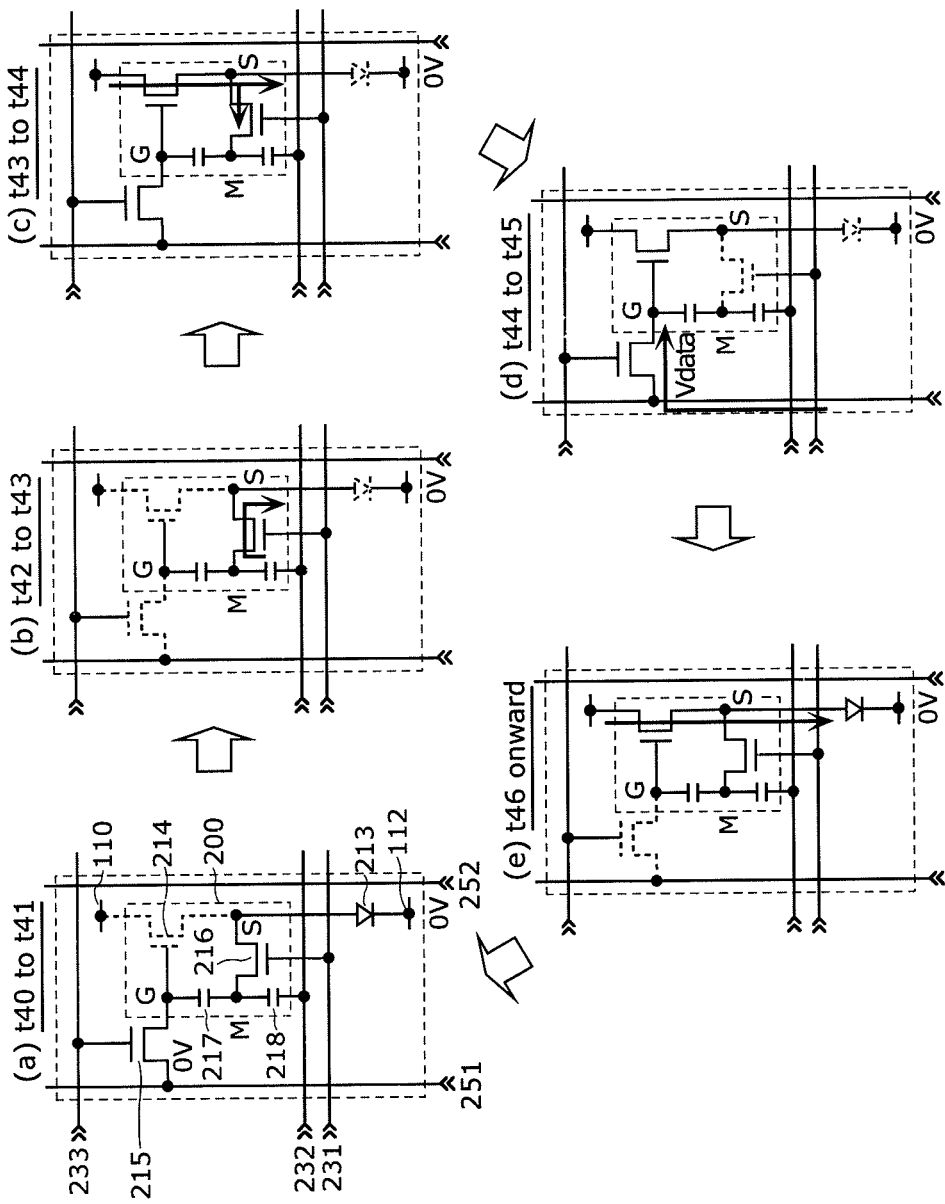
FIG. 16 is a state transition diagram for a pixel included in the display device according to Embodiment 3.

Furthermore, FIG. 16 is a state transition diagram for a pixel included in the display device according to Embodiment 3. Furthermore, FIG. 17 is an operation flowchart for the display device according to the Embodiment 3.

Figure 17:
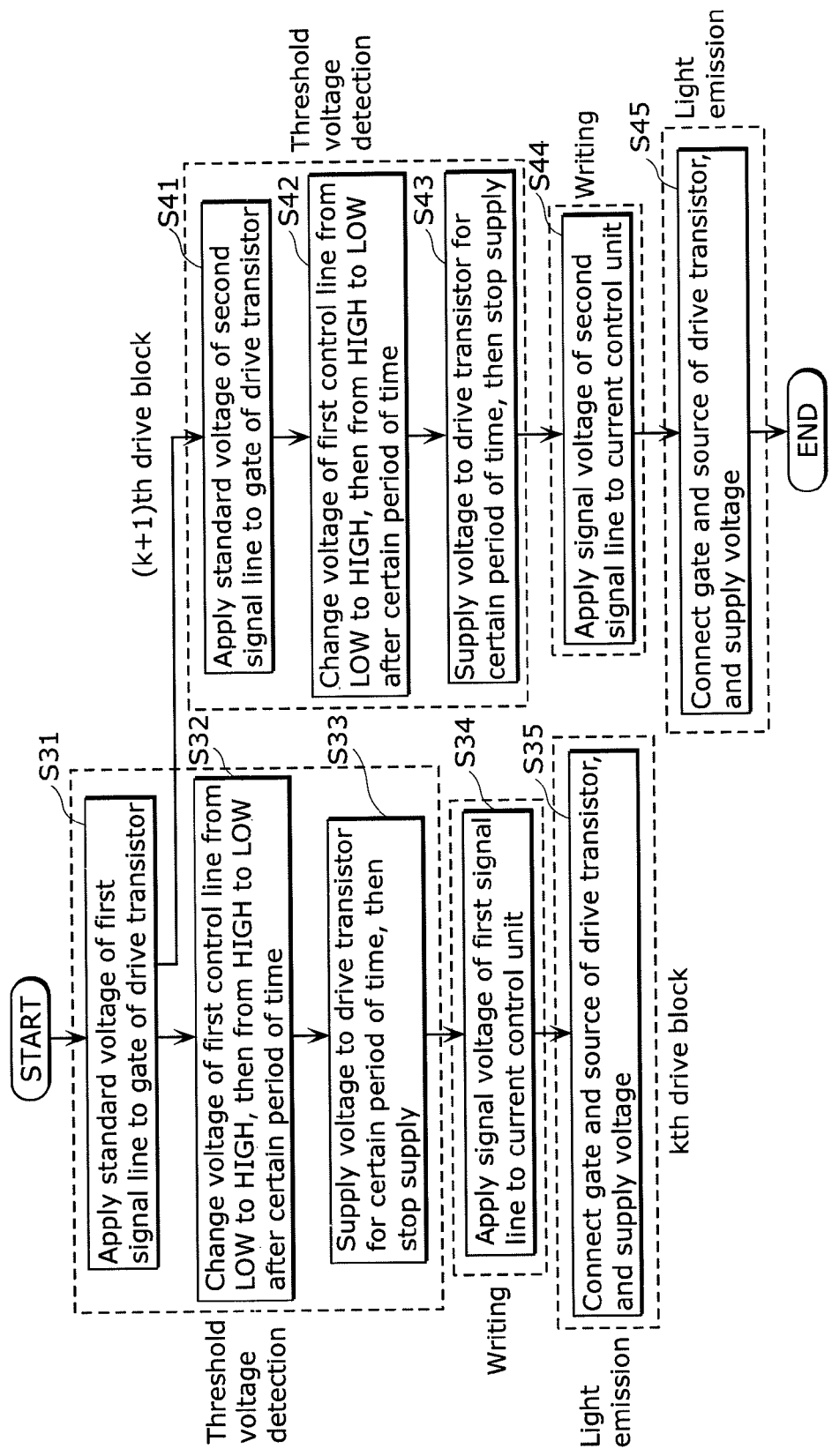
FIG. 17 is an operation flowchart for the display device according to Embodiment 3.

First, at a time t40, the scanning/control line drive circuit 14 causes the voltage level of the scanning line 233 (k, 1) to change to HIGH, and the standard voltage is applied from the first signal line 251 to the gate of the drive transistor 214 (S31 in FIG. 17).

At this time, as shown in (a) in FIG. 16, the standard voltage is for example 0 V. Furthermore, since the operation is in the light-emitting mode immediately before the time t40, the source potential Vs of the drive transistor 214 in this steady state is assumed to be $V_{EL}$. Because of this and because the switching transistor 216 is in a conducting state due to the voltage level of the second control line 231(k, 1) being in a HIGH state, Vgs=$-V_{EL}$<VT (TFT) and the transistor 214 changes to the OFF state.

Subsequently, with the scanning/control line drive circuit 14 causing the voltage level of the second control line 231(k, 1) to change to LOW at a time t41, and thereafter causing the voltage level of the scanning line 233 to change from LOW to HIGH to LOW in pixel row sequence while maintaining the first signal line 251 at the standard voltage within the kth block, the organic EL elements 213 stop emitting light in pixel row sequence. In other words, the light emission of the pixels in the kth block ends in pixel row sequence. At the same time, the non-light-emitting period of the kth block begins in pixel row sequence.

Next, at a time t42, the scanning/control line drive circuit 14 causes the voltage level of the first control line 232(k) to change from LOW to HIGH, then causes the voltage level to change to LOW after a certain period of time has passed (S32 in FIG. 17). Furthermore, at this time, the voltage levels of the second control lines 231(k, 1) to 231(k, m) are maintained at HIGH. Here, for example, it is assumed that the switching transistor 215 is OFF, the first control line 232(k) is changed by the amount of ΔVreset (>0), the electrostatic capacitance of the electrostatic holding capacitor 218 is C2, and the electrostatic capacitance and threshold voltage of the organic EL element 213 are $C_{EL}$ and $V_T(EL)$, respectively. At this time, at the moment when the scanning/control line drive circuit 14 changes the voltage level of the first control line 232(k) from LOW to HIGH, the potential Vs of the source electrode S(M) of the drive transistor 214 is approximately equal to the sum of the voltage distributed between C2 and $C_{EL}$ and $V_T(EL)$, and is obtained as below.

[MATH. 11]

$$V_S = \frac{C_2}{C_2 + C_{EL}} \Delta V_{reset} + V_{T(EL)} \qquad \text{Expression 11}$$

Subsequently, as shown in (b) in FIG. 16, due to the self-discharging of the organic EL element 213, the aforementioned Vs becomes asymptotic to $V_T(EL)$, in the steady state.

Next, at a time t43, the scanning/control line drive circuit 14 causes the voltage levels of the scanning lines 233 (k, 1) to 233 (k, m) to concurrently change to HIGH.

Next, the scanning/control line drive circuit 14 causes the voltage level of the first control line 232(k) to change from HIGH to LOW, thereby Vs is biased, and is obtained as below.

[MATH. 12]

$$V_S = V_{T(EL)} - \frac{C_2}{C_1 + C_2 + C_{EL}} \Delta V_{reset} \qquad \text{Expression 12}$$

The changing of the voltage level of the first control line 232(k) from HIGH to LOW causes a voltage that is higher than the threshold voltage $V_{th}$ of the drive transistor 214 to be generated in Vgs which is the gate-source voltage of the drive transistor 214. Specifically, the potential difference generated in the electrostatic holding capacitor 217 is set to a potential difference which allows for the detection of threshold voltage of the drive transistor 214, thereby completing the preparation for the threshold voltage detection process. At the same time, as shown in (c) in FIG. 16, the drive transistor 214 turns ON and supplies the drain-source current to the electrostatic holding capacitors 217 and 218 and the organic EL element 213. At this time, VS defined in Expression 2 becomes asymptotic to $-V_{th}$. With this, $V_{th}$ of the drive transistor 214 is recorded in the electrostatic holding capacitors 217 and 218. It should be noted that, at this time, the current flowing to the organic EL element 213 is insufficient as a current for causing the organic EL element to emit light since the anode electrode potential is a potential lower than $-V_{th}$ and the cathode electrode potential is 0 V, and thus the organic EL element 213 is inversely-biased.

In the period from the time t43 to a time t44, the circuit of the pixel 21A becomes steady, and a voltage equivalent to the threshold voltage $V_{th}$ of the drive transistor 214 is held in the electrostatic holding capacitors 217 and 218. It should be noted that, since the flowing current for causing the voltage equivalent to the threshold voltage $V_{th}$ to be held in the electrostatic holding capacitors 217 and 218 is minute, reaching the steady state takes time. Therefore, the longer this period is, the more stable the voltage held in the electrostatic holding capacitor 217 becomes, and by ensuring that this period is sufficiently long, voltage compensation having high-precision is realized.

Next, at a time t44, the scanning/control line drive circuit 14 causes the voltage levels of the scanning lines 233 (k, 1) to 233 (k, m) to concurrently change from HIGH to LOW (S33 in FIG. 17). With this, the recording of the $V_{th}$ of the drive transistor 214 in the electrostatic holding capacitors 217 and 218 is completed. At this time, the voltage equivalent to the threshold voltage $V_{th}$ of the drive transistor 214 is simultaneously held in the respective electrostatic holding capacitors 217 and 218 included in all of the pixels 21A of the kth drive block. It should be noted that immediately before the time t44, the second control lines 231(k, 1) to 231(k, m) are concurrently changed to the LOW level, and the respective switching transistors 216 are OFF. With this, the leak current of the drive transistor 214 after $V_{th}$ detection flows to the electrostatic holding capacitors 217 and 218 and suppresses deviations in the value of threshold voltage $V_{th}$ of the drive transistor 214 recorded in the electrostatic holding capacitors 217 and 218.

As described thus far, in the period from the time t43 to the time t44, the correction of the threshold voltage $V_{th}$ of the drive transistor 214 is executed simultaneously in the kth drive block.

Meanwhile, in the period from the time t43 to the time t44, a signal voltage is applied to the second signal line 252 connected to the pixel 21B included in the (k+1)th drive block. Here, the first signal line 251 and the second signal line 252 are disposed, for every column that includes m pixels and corresponds to a different one of n columns, in the column direction and corresponding to m pixels 21A and 21B. The first signal line 251 is disposed on the left side of the switching transistor 215 included in the pixels 21A and 21B of the corresponding column, and the second signal line 252 is disposed on the right side of the switching transistor 215 included in the pixels 21A and 21B of the corresponding column. In addition, the first connecting line is disposed so as not to cross with the second signal line 252, and the second connecting line is disposed so as not to cross with the first signal line 251.

Accordingly, as in the display device 1 according to Embodiment 1, parasitic capacitance generated due to the crossing of signal lines is not generated in the display device according to this embodiment.

Therefore, in the period from the time t43 to the time t44, that is, in the threshold voltage detection period of the pixel 21A, the standard voltage supplied to the first signal line 251 is not affected by the signal voltage supplied to the second signal line 252, via the parasitic capacitance generated due to crossing of signal lines. Stated differently, fluctuation of the potential of the first signal line 251 which supplies the standard voltage for detecting the threshold voltage can be suppressed.

Therefore, the display device according to this embodiment is capable of improving threshold voltage detection precision in the same manner as the display device 1 according to Embodiment 1.

Next, in a period from the time t44 onward, the scanning/control line drive circuit 14 causes the voltage levels of the scanning lines 233 (k, 1) to 233 (k, m) to sequentially change from LOW to HIGH to LOW so as to sequentially turn ON the switching transistors 215 on a per pixel row basis. Furthermore, at this time, the signal line drive circuit 15 causes the voltage of the first signal line 251 to change to the signal voltage Vdata corresponding to the luminance value of the respective pixels (S34 in FIG. 17). With this, as shown in (d) in FIG. 16, the signal voltage Vdata is applied to the gate of the drive transistor 214. At this time, the potential $V_M$ at the connection point M between the electrostatic holding capacitors 217 and 218 becomes the sum of the voltage when Vdata is distributed between C1 and C2 and $-V_{th}$ which is the Vs potential at the time t44, and is obtained as below.

[MATH. 13]

$$V_M = \frac{C_1}{C_1 + C_2}\Delta V_{data} - V_{th} =$$

$$\frac{C_1}{C_1 + C_2}(V_{data} - 0) - V_{th} = \frac{C_1}{C_1 + C_2}V_{data} - V_{th}$$

Expression 13

In other words, the potential difference $V_{gM}$ held in the electrostatic holding capacitor 217 is the difference between Vdata and the potential defined in aforementioned Expression 13, and is obtained as below.

[MATH. 14]

$$V_{gM} = \frac{C_2}{C_1 + C_2}V_{data} + V_{th}$$

Expression 14

In other words, a summed voltage obtained by adding a voltage corresponding to this signal voltage Vdata and the voltage equivalent to the previously held threshold voltage $V_{th}$ of the drive transistor 214 is written into the electrostatic holding capacitor 217.

Furthermore, in a period from a time t46 onward, the scanning/control line drive circuit 14 causes the voltage levels of the second control lines 231(k, 1) to 231(k, m) to sequentially change from LOW to HIGH so as to sequentially turn ON the respective switching transistors 216 on a per pixel row basis (S35 in FIG. 17). With this, light emission corresponding to the threshold-corrected signal voltage is executed on a per pixel row basis through the application of the voltage defined in Expression 13 between the gate and source of the drive transistor 214, and the flowing of the drain current shown in (e) in FIG. 16.

As described thus far, in the period from the time t46 onward, the writing of the corrected signal voltage and light emission are sequentially executed in the kth drive block on a per pixel row basis.

Here, the drain current id flowing in the drive transistor 214 is expressed below by using a voltage value obtained by deducting the threshold voltage $V_{th}$ of the drive transistor 214 from the $V_{gM}$ defined in Expression 4.

[MATH. 15]

$$i_d = \frac{\beta}{2}\left(\frac{C_2}{C_1 + C_2} V_{data}\right) \quad \text{Expression 15}$$

Here, β is a characteristic parameter regarding mobility. It can be seen from Expression 15 that the drain current id for causing the organic EL element 213 to emit light is a current that is not dependent on the threshold voltage $V_{th}$ of the drive transistor 214 and, in addition, has no relationship with the capacitance element of the organic EL element 213.

As described thus far, grouping the pixel rows into drive blocks allows the compensation of the threshold voltage $V_{th}$ of the drive transistors 214 to be executed simultaneously in the respective drive blocks. With this, the control of the current path from the source of such drive current onward can be synchronized in the respective drive blocks. Therefore, the first control line 232 can be provided in common in each of the drive blocks.

Furthermore, although the scanning lines 233 (k, 1) to 233 (k, m) are separately connected to the scanning/control line drive circuit 14, the timing of the drive pulse in the threshold voltage correction period is the same. Therefore, the scanning/control line drive circuit 14 can suppress the rising of the frequency of the pulse signals to be outputted, and thus the output load on the drive circuit can be reduced.

From the same perspective as Embodiment 1, this embodiment also has the advantage that light emission duty can be secured longer compared to the conventional display device using two signal lines disclosed in PTL 1.

Therefore, it is possible to realize a display device that ensures sufficient light-emitting luminance and has long operational life due to reduced output load on drive circuits.

Furthermore, it can be seen that when the same light emission duty is set to the conventional display device using two signal lines and the display device combining block driving as in the present disclosure, the display device according to one or more exemplary embodiments ensures a longer threshold voltage detection period.

It should be noted that the operation of the (k+1)th block from a time t50 to a time 56 is the same as the above-described operation of the kth drive block, and thus description thereof shall be omitted.

The operations described thus far are also executed sequentially in the (k+2)th drive block onward in the display panel 10.

It should be noted that since the state transition diagram of drive blocks which emit light according to the driving method according this embodiment is the same as the state transition diagram shown in FIG. 12, description thereof shall be omitted.

Thus, the drive transistor 214 threshold voltage correction periods as well as the timings thereof can also be made uniform within the same drive block in Embodiment 3 through the pixel circuit provided with the switching transistor 216 and electrostatic holding capacitor 218, and through the disposition of control lines, scanning lines, and signal lines to the respective pixels that have been grouped into drive blocks. Therefore, the load on the scanning/control line drive circuit 14 which outputs signals for controlling current paths, and on the signal line drive circuit 15 which controls signal voltages is reduced. In addition, through the above-described grouping into drive blocks and the two signal lines arranged for every pixel column, the threshold voltage correction period of the drive transistor 214 can occupy a large part of a 1 frame period Tf which is the time in which all the pixels are refreshed. This is because the threshold voltage correction period is provided in the (k+1)th drive block in the period in which the luminance signal is sampled in the kth drive block. Therefore, the threshold voltage correction period is not divided on a per pixel row basis, but is divided on a per drive block basis. Therefore, as the display area is increased, a long relative threshold voltage correction period can be set with respect to 1 frame period, without allowing light emission duty to decrease with the increase in the display area. With this, a drive current based on a precisely corrected signal voltage flows to the light-emitting elements, and thus display quality improves.

For example, in the case where the display panel 10 is divided into N drive blocks, the threshold voltage correction period allocated to each pixel is at most Tf/N.

Furthermore, since parasitic capacitance generated due to the crossing of signal lines is likewise not generated, Embodiment 3 is also capable of suppressing unnecessary power consumption and realizing precise threshold voltage correction in the same manner as Embodiment 1.

Embodiment 4

Hereinafter, Embodiment 4 shall be described with reference to the Drawings.

The electrical configuration of the display device according to this embodiment is the same as the configuration shown in FIG. 1 except for the circuit configuration of the pixels. Specifically, the display device according to this embodiment includes the display panel 10, and a timing control circuit 20. The display panel 10 includes plural pixels 31A and 31B to be described later, the signal line group 12, the control line group 13, the scanning/control line drive circuit 14, the signal line drive circuit 15, and a selector circuit 16.

The control line group 13 includes scanning lines, control lines, and power source lines, with each of the scanning lines, each of the control lines, and each of the power source lines disposed on a per pixel basis.

The scanning/control line drive circuit 14 drives the circuit element of each pixel by outputting a scanning signal to the respective scanning lines, outputting a control signal to the respective control lines, and outputting a variable voltage to the respective power source lines of the control line group 13.

The pixels 31A and 31B are arranged in a matrix on the display panel 10. Here, the pixels 31A and 31B compose two or more drive blocks each of which is one drive block made up of plural pixel rows. The pixels 31A compose odd drive blocks and the pixels 31B compose even drive blocks.

Description of configurations overlapping with those in Embodiments 1 to 3 shall be omitted, and only those configurations related to the pixels 31A and 31B shall be described hereinafter.

Figure 18A:
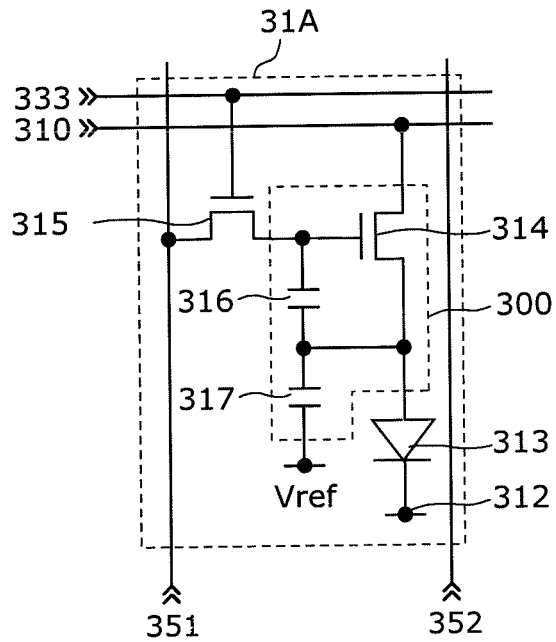
FIG. 18A is a specific circuit configuration diagram of a pixel in an odd drive block in a display device according to Embodiment 4.
Figure 18B:
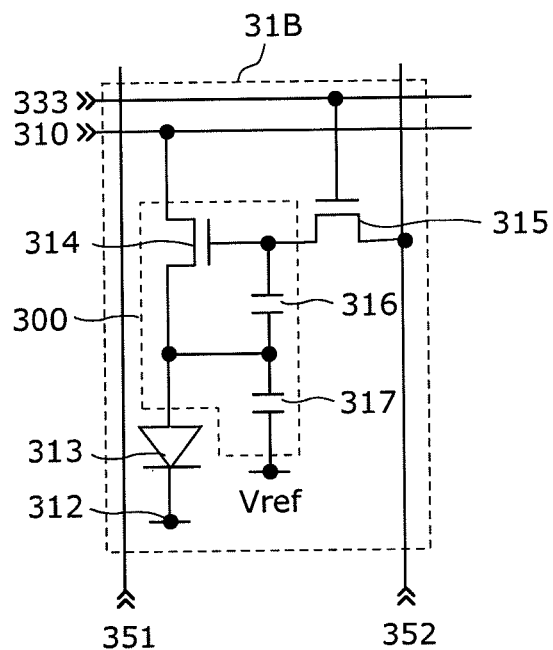
FIG. 18B is a specific circuit configuration diagram of a pixel in an even drive block in the display device according to Embodiment 4.

FIG. 18A is a specific circuit configuration diagram of a pixel of an odd drive block in the display device according to Embodiment 4, and FIG. 18B is a specific circuit configuration diagram of a pixel of an even drive block in the display device according to Embodiment 4. Each of the pixels 31A and 31B shown in FIG. 18A and FIG. 18B, respectively, include: an organic EL element 313; a drive transistor 314; a switching transistor 315; the electrostatic holding capacitors 316 and 317; a scanning line 333; a first signal line 351; and the second signal line 352. Here, the drive transistor 314 and the electrostatic capacitors 316 and 317 make up the current control unit 300. The current control unit 300 has a function of converting the signal voltage supplied from the first signal line 351 or the second signal line 352 into a signal current which is a drain current of the drive transistor 314. Compared with the pixel circuits in FIG. 2A and FIG. 2B, the pixels circuits respectively shown in FIG. 18A and FIG. 18B are different in that the switching transistor 116 is not provided. Hereinafter, description of points that overlap with the configuration of the display device shown in FIG. 2A and FIG. 2B shall be omitted.

The organic EL element 313 is, for example, a light-emitting element having a cathode connected to a power source line 312 which is a second power source line, and an anode connected to the source of the drive transistor 314. The organic EL element 313 emits light according to the flow of the drive current of the drive transistor 314.

The drive transistor 314 has a drain connected to a power source line 310 which is a first power source line, and a gate connected to the first electrode of the electrostatic holding capacitor 316. Through the application of a voltage corresponding to a signal voltage to the gate of the drive transistor 314, the drive transistor 314 converts such voltage to a corresponding drain current. Subsequently, this drain current is supplied as a drive current to the organic EL element 313. The drive transistor 314 is configured of, for example, an n-type thin film transistor (n-type TFT).

The switching transistor 315 has a gate connected to the scanning line 333, and one of a source and a drain connected to the gate of the drive transistor 314. Furthermore, the other of the source and the drain is connected to the first signal line 351 in the pixel 31A in the odd drive block, and is connected to the second signal line 352 in the pixel 31B in the even drive block. It should be noted that the switching transistor 315 included in the pixel 31A corresponds to the first switching transistor, and the switching transistor 315 included in the pixel 31B corresponds to the second switching transistor.

The electrostatic holding capacitor 316, which corresponds to the sixth capacitive element, has one of terminals connected to the gate of the drive transistor 314 and the other of the terminals connected to the source of the drive transistor 314. The electrostatic capacitor 316 holds a charge corresponding to a signal voltage supplied from the first signal line 351 or the second signal line 352, and has, for example, a function of controlling a drive current supplied from the drive transistor 314 to the organic EL element 313 after the switching transistor 315 turns OFF.

Furthermore, the electrostatic holding capacitor 316 is connected to the gate of the drive transistor 314 and to the switching transistor 315, and has a function of detecting the threshold voltage of the drive transistor 314.

The electrostatic holding capacitor 317 is a holding capacitive element connected between the other terminal of the electrostatic holding capacitor 316 and a reference voltage source (denoted as reference voltage $V_{ref}$ in FIG. 18A and FIG. 18B, but may also be the power source line 312). The electrostatic holding capacitor 317 first holds the source potential of the drive transistor 314 in the steady state. The information of such source potential remains in a node between the electrostatic holding capacitor 316 and the electrostatic holding capacitor 317 even when a signal voltage is applied from the switching transistor 315. It should be noted that the source potential at this timing is the threshold voltage of the drive transistor 314. Subsequently, even when the timing from the holding of the aforementioned threshold voltage to the emission of light is different for each of the pixel rows, the potential of the other of the terminals of the electrostatic holding capacitor 316 is fixed, and thus the gate voltage of the drive transistor 314 is fixed. Meanwhile, since the source potential of the drive transistor 314 is already steady, the electrostatic holding capacitor 317 consequently has a function of holding the source potential of the drive transistor 314.

It should be noted that, the electrostatic holding capacitor 317 does not necessarily need to be added as an independent circuit element, and may be the parasitic capacitance of the organic EL element 313.

The power source line 310 supplies a first voltage or a second voltage to the drain of the drive transistor 314. The first voltage is lower than a standard voltage provided through the first signal line 351 and the second signal line 352. Application of the first voltage to the drain of the drive transistor 314 can reset the source potential of the drive transistor 314. The second voltage is higher than the standard voltage. Application of the second voltage to the drain of the drive transistor 314 can cause the electrostatic holding capacitor 316 to hold a voltage corresponding to the threshold voltage or can provide a drive current corresponding to a signal voltage to cause the organic EL element 313 to emit light.

The control circuit 20 makes up, together with the scanning/control line drive circuit 14 and the signal line drive circuit 15, a control unit that controls the operation of the respective pixels. It should be noted that, compared with the control circuit 20 in Embodiments 1 to 3, the control circuit 20 in this embodiment controls, additionally, the supply timing for the first voltage and the second voltage. Specifically, the control circuit 20 in this embodiment includes the functions of the voltage control unit, controls the supply of the first voltage and the second voltage with the same timing in the threshold voltage detection period for all pixels included in the same drive block, and controls the supply of the first voltage and the second voltage with a different timing between different drive blocks.

Figure 19:
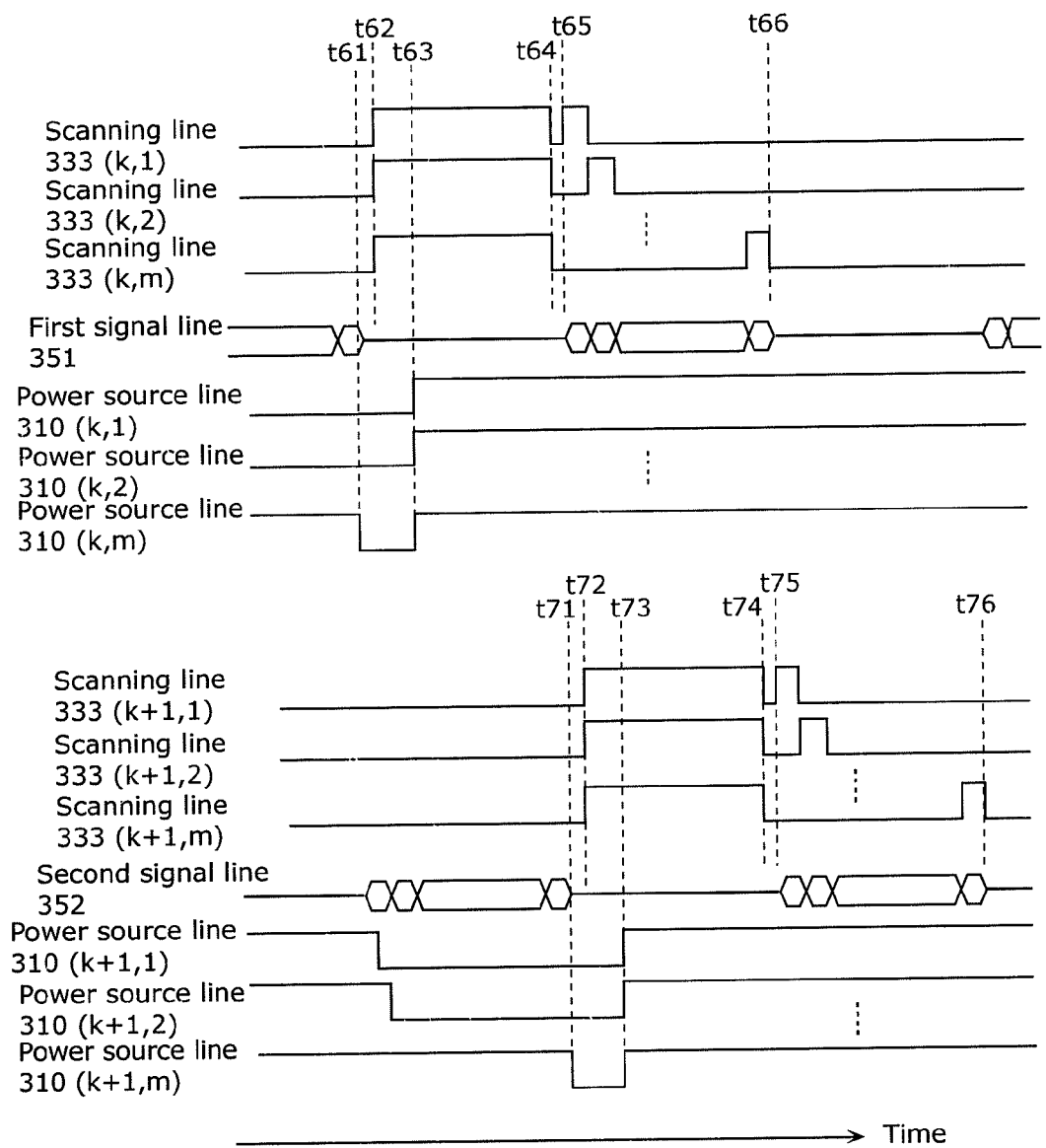
FIG. 19 is an operation timing chart for the driving method of the display device according to Embodiment 4.

Next, the driving method of the display device according to this embodiment shall be described using FIG. 19. It should be noted that, here, the driving method of the display device including the specific circuit configurations shown in FIG. 18A and FIG. 18B shall be described in detail. It should be noted that it is assumed that each drive block is made up of m rows of pixel rows.

FIG. 19 is an operation timing chart for the driving method of the display device according to Embodiment 4. In the figure, the horizontal axis denotes time. Furthermore, in the vertical direction, the waveform diagrams of the voltage generated in a scanning line 333($k$, 1) disposed in the first row of the kth drive block, a scanning line 333 ($k$, 2) disposed in the second row, and a scanning line 333 ($k$, $m$) disposed in the mth row, a first signal line 351, a power source line 310($k$, 1) disposed in the first row of the kth drive block, a power source line 310 ($k$, 2) disposed in the second row, and a power source line 310($k$, $m$) disposed in the mth row are shown in sequence from the top. Furthermore, continuing therefrom, the waveform diagrams of the voltage generated in a scanning line 333 ($k$+1, 1) disposed in the first row of the ($k$+1)th drive block, a scanning line 333 ($k$+1, 2) disposed in the second row, and a scanning line 333 (k+1, m) disposed in the mth row, a second signal line 352, a power source line 110 (k+1, 1) disposed in the first row of the (k+1)th drive block, a power source line 310 (k+1, 2) disposed in the second row, and a power source line 310(k+1, m) disposed in the mth row are shown. Furthermore, FIG. 20 is an operation flowchart for the display device according to the Embodiment 4.

Figure 20:
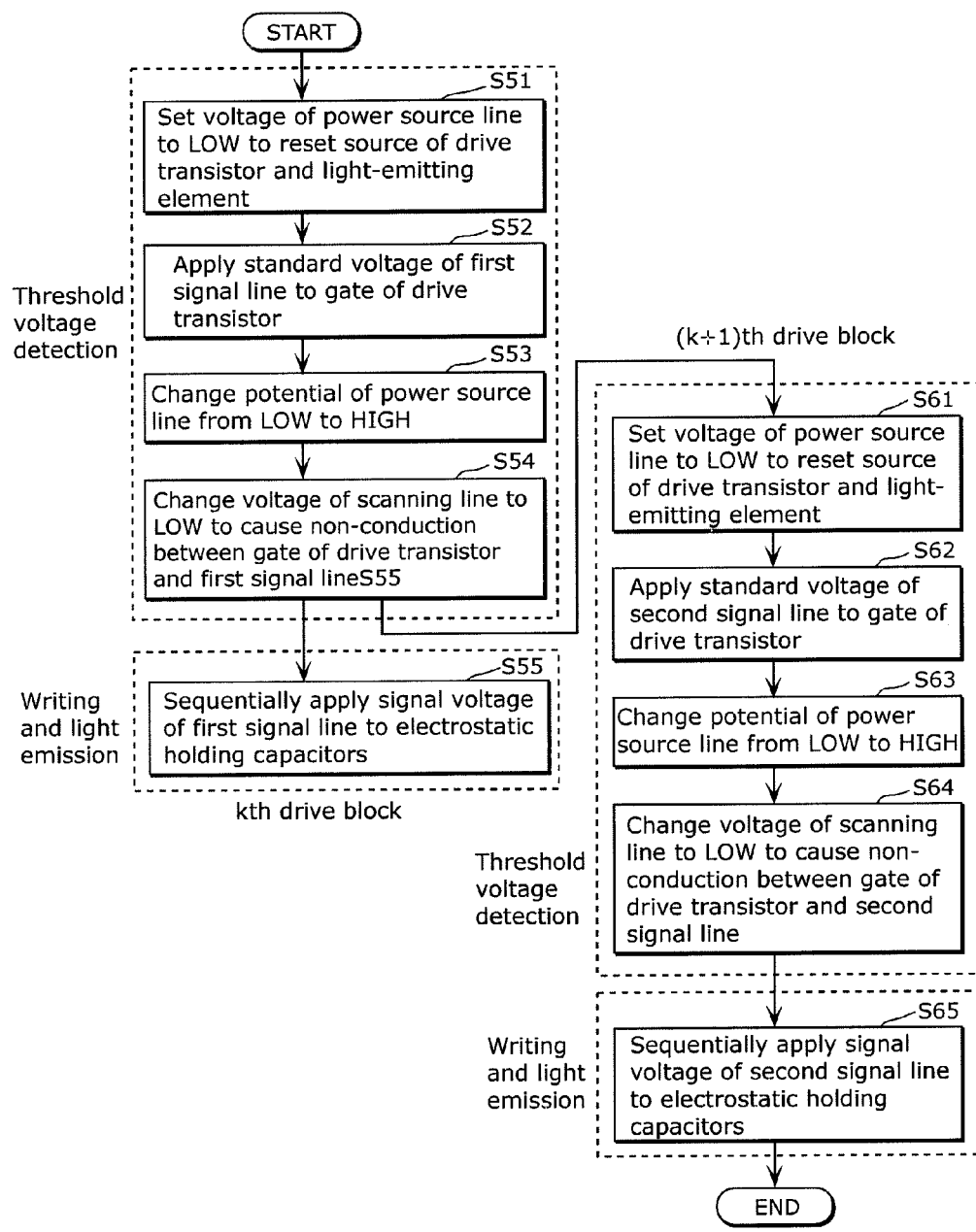
FIG. 20 is an operation flowchart for the display device according to the Embodiment 4.

First, by a time t61, the control circuit 20 sequentially sets the voltage level of the power source lines 310(k, 1) to 310 (k, m) to LOW, which is the first voltage lower than the standard voltage, to reset the source potential of the drive transistors 314 (S51 of FIG. 20). Here, the first voltage is for example −10 V, and the source potential of the drive transistor 314 is reset to −10 V.

Next, at the time t62, the control circuit 20 causes the voltage levels of the scanning lines 333 (k, 1) to 333 (k, m) to simultaneously change from LOW to HIGH so as to turn ON the switching transistor 315 (S52 in FIG. 20). Furthermore, at this time, the control circuit 20 has caused the voltage level of the first signal line 351 to change from the signal voltage to the standard voltage.

Accordingly, at the time t62 shown in FIG. 19, the standard voltage is applied to the gate of the respective transistors 314 of all of the pixels included in the kth drive block. At this time, the standard voltage is for example 0 V.

Next, at a time t63, the control circuit 20 causes the voltage levels of the power source lines 310 (k, 1) to 310 (k, m) to change from the first voltage to the second voltage which is higher than the standard voltage (S53 in FIG. 20). At this time, the second voltage is for example 10 V. With this, the preparation for the threshold voltage detection process is completed.

In the period from the time t63 to a time t64, the circuit of each pixel 31A is placed in a steady state, and a voltage equivalent to the threshold voltage $V_{th}$ of the drive transistor 314 is held in the electrostatic holding capacitor 316 by the time t64. It should be noted that since the flowing current for causing the voltage equivalent to the threshold voltage $V_{th}$ to be held in the electrostatic holding capacitor 316 is minute, reaching the steady state takes time. Therefore, the longer this period is, the more stable the voltage held in the electrostatic holding capacitor 316 becomes, and by ensuring that this period is sufficiently long, voltage compensation having high-precision is realized.

Meanwhile, in the period from the time t63 to the time t64, a signal voltage is applied to the second signal line 352 connected to the pixel 31B included in the (k+1)th drive block. Here, the first signal line 351 and the second signal line 352 are disposed, for every column that includes m pixels and corresponds to a different one of n columns, in the column direction and corresponding to m pixels 31A and 31B. The first signal line 351 is disposed on the left side of the switching transistor 315 included in the pixels 31A and 31B of the corresponding column, and the second signal line 352 is disposed on the right side of the switching transistor 315 included in the pixels 31A and 31B of the corresponding column. In addition, the first connecting line is disposed so as not to cross with the second signal line 352, and the second connecting line is disposed so as not to cross with the first signal line 351.

Accordingly, as in the display device 1 according to Embodiment 1, parasitic capacitance generated due to the crossing of signal lines is not generated in the display device according to this embodiment.

Therefore, in the period from the time t63 to the time t64, that is, in the threshold voltage detection period of the pixel 31A, the standard voltage supplied to the first signal line 351 is not affected by the signal voltage supplied to the second signal line 352, via the parasitic capacitance generated due to crossing of signal lines. Stated differently, fluctuation of the potential of the first signal line 351 which supplies the standard voltage for detecting the threshold voltage can be suppressed.

Therefore, the display device according to this embodiment is capable of improving threshold voltage detection precision in the same manner as the display device 1 according to Embodiment 1.

Next, at the time t64, the control circuit 20 causes the voltage levels of the scanning lines 333 (k, 1) to 333 (k, m) to simultaneously change from HIGH to LOW so as to turn OFF the switching transistor 315 (S54 in FIG. 20). With this, the application of the standard voltage to the drive transistor 314 is stopped. At this time, the voltage equivalent to the threshold voltage $V_{th}$ of the drive transistor 314 is simultaneously held in the respective electrostatic holding capacitors 316 included in all of the pixels 31A of the kth drive block, and the threshold voltage $V_{th}$ of the drive transistor 314 to be compensated is fixed.

As described thus far, in a period from the time t61 to the time t64, the correction of the threshold voltage $V_{th}$ of the drive transistor 314 is executed simultaneously in the kth drive block.

Next, at a time t65, the control circuit 20 causes the voltage level of the first signal line 351 to change from the standard voltage to the signal voltage.

Accordingly, at the time t64 shown in FIG. 19, the signal voltage is applied to the gate of the respective transistors 314 of all of the pixels included in the kth drive block. At this time, the signal voltage is for example 0 V to 5 V.

Furthermore, in a period from the time t65 to a time 66, the control circuit 20 causes the voltage levels of the scanning lines 333 (k, 1) to 333 (k, m) to sequentially change from LOW to HIGH to LOW so as to sequentially turn ON the switching transistors 315 on a per pixel row basis 5 (S55 in FIG. 20). With this, the signal voltage is applied to the gate of the drive transistor 314. At this time, a summed voltage obtained by adding a voltage corresponding to this signal voltage and the voltage equivalent to the previously held threshold voltage $V_{th}$ of the drive transistor 314 is written into the electrostatic holding capacitor 316. Furthermore, simultaneous to this, the drive current of the drive transistor 314 flows to the organic EL elements 313 and the organic EL elements 313 emit light in pixel row sequence.

As described thus far, in a period from the time t65 to the time 66, the writing of the precisely corrected luminance signal voltage and light emission is executed in the kth drive block in the pixel row sequence.

Furthermore, in the time 66 and onward, the control circuit 20 causes the voltage levels of the power source lines 310 (k, 1) to 310 (k, m) to change from the second voltage to the first voltage, in pixel row sequence, to thereby stop light emission in the pixel row sequence.

As described thus far, by grouping the pixel rows into drive blocks, the period for detecting the threshold voltage of the drive transistor 314 can be made uniform within a drive block, and thus a time period equal to 1 frame period divided by the number of drive blocks can be allocated as the threshold voltage detection period at the maximum. With this, a precisely corrected drive current flows to the organic EL elements 313, and thus image display quality can be improved. Furthermore, the control circuit 20 can perform simultaneous controlling within a drive block in the threshold voltage detection period, that is, output the same control signal to the same drive block.

It should be noted that the operation of the (k+1)th block from a time t71 to a time 76 is the same as the above-described operation of the kth drive block, and thus description thereof shall be omitted.

The operations described thus far are also executed sequentially in the (k+2)th drive block onward in the display panel 10.

It should be noted that since the state transition diagram of drive blocks which emit light according to the driving method according this embodiment is the same as the state transition diagram shown in FIG. 14, description thereof shall be omitted.

As described thus far, the drive transistor 314 threshold voltage correction periods as well as the timings thereof can also be made uniform within the same drive block in Embodiment 4 through the pixel circuit provided with the electrostatic holding capacitor 316, the disposition of scanning lines, power source lines, and signal lines to the respective pixels that have been grouped into drive blocks, and through the above-described driving method. Therefore, the load on the scanning/control line drive circuit 14 which outputs signals for controlling current paths, and on the signal line drive circuit 15 which controls signal voltages is reduced. In addition, through the above-described grouping into drive blocks and the two signal lines arranged for every pixel column, the threshold voltage correction period of the drive transistor 314 can occupy a large part of a 1 frame period Tf which is the time in which all the pixels are refreshed. This is because the threshold voltage correction period is provided in the (k+1)th drive block in the period in which the luminance signal is sampled in the kth drive block. Therefore, the threshold voltage correction period is not divided on a per pixel row basis, but is divided on a per drive block basis. Therefore, as the display area is increased, a long relative threshold voltage correction period can be set with respect to 1 frame period, without allowing light emission duty to decrease with the increase in the display area. With this, a drive current based on a precisely corrected signal voltage flows to the light-emitting elements, and thus display quality improves.

For example, in the case where the display panel 10 is divided into N drive blocks, the threshold voltage correction period allocated to each pixel is at most Tf/N.

Furthermore, since parasitic capacitance generated due to the crossing of signal lines is likewise not generated, Embodiment 4 is also capable of suppressing unnecessary power consumption and realizing precise threshold voltage correction in the same manner as Embodiment 1.

Embodiment 5

Hereinafter, Embodiment 5 shall be described with reference to the Drawings.

The electrical configuration of the display device according to this embodiment is the same as the configuration shown in FIG. 1 except for the circuit configuration of the pixels. Specifically, the display device according to this embodiment includes the display panel 10, and a timing control circuit 20. The display panel 10 includes plural pixels 41A and 41B which are to be described later, the signal line group 12, the control line group 13, the scanning/control line drive circuit 14, the signal line drive circuit 15, and the selector circuit 16.

Furthermore, in Embodiments 1 to 4, the threshold voltage detection period is provided in common for all pixels inside the same drive block and the threshold voltage detection periods are provided independently between different drive blocks. However, in this embodiment, an initialization period for initializing a current control unit is provided in common for all pixels inside the same drive block and the initialization periods are provided independently between different drive blocks.

It should be noted that providing the initialization period in common means that the period and the timing are shared in common, and provided independently means that the periods do not overlap. Stated differently, providing the initialization period in common means making the start time and end time of such period uniform for all pixels in the same one of the drive blocks. Furthermore, providing the initialization periods independently between different drive blocks means that the start time and end time of such period is different between the respective pixels of different drive blocks, and such period does not overlap between different drive blocks.

Description of configurations overlapping with those in Embodiments 1 to 3 shall be omitted, and only those configurations related to the pixels 41A and 41B shall be described hereinafter.

The pixels 41A and 41B are arranged in a matrix on the display panel 10. Here, the pixels 41A and 41B compose two or more drive blocks each of which is one drive block made up of plural pixel rows. The pixels 41A compose odd drive blocks and the pixels 41B compose even drive blocks.

Figure 21A:
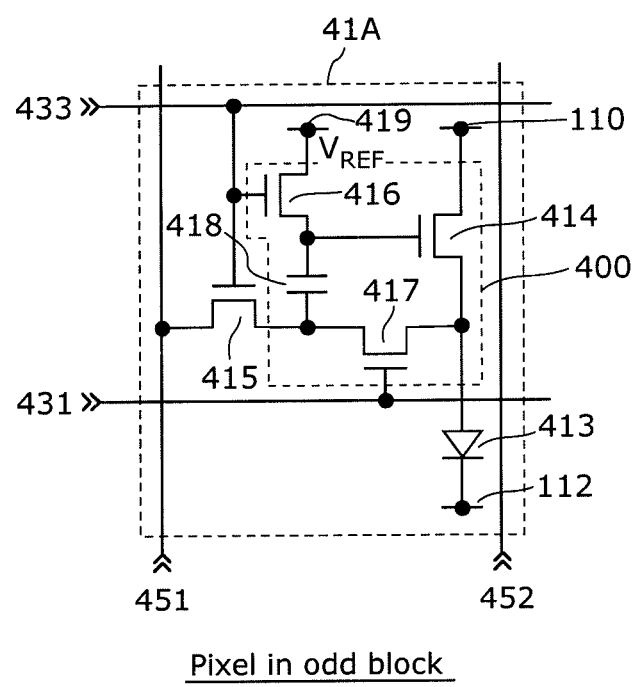
FIG. 21A is a specific circuit configuration diagram of a pixel of an odd drive block in a display device according to Embodiment 5.
Figure 21B:
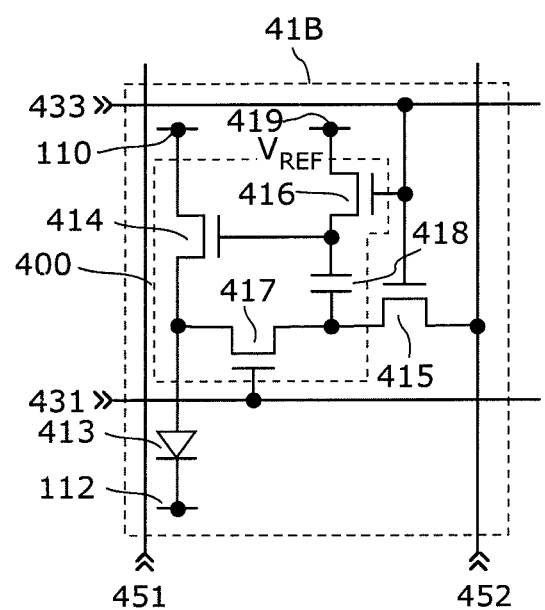
FIG. 21B is a specific circuit configuration diagram of a pixel of an even drive block in the display device according to Embodiment 5.

FIG. 21A is a specific circuit configuration diagram of a pixel of an odd drive block in the display device according to Embodiment 5, and FIG. 21B is a specific circuit configuration diagram of a pixel of an even drive block in the display device according to Embodiment 5. Each of the pixels 41A and 41B shown in FIG. 21A and FIG. 21B, respectively, include: an organic EL element 413; a drive transistor 414; switching transistors 415, 416, and 417; an electrostatic holding capacitor 418; a control line 431, a scanning line 433; a first signal line 451; and the second signal line 452. Here, the drive transistor 414, the switching transistors 415, 416 and 417, and the electrostatic holding capacitor 418 make up the current control unit 400. The current control unit 400 has a function of converting the signal voltage supplied from the first signal line 451 or the second signal line 452 into a signal current which is a drain current of the drive transistor 414.

In FIG. 21A and FIG. 21B, the switching transistor 416, which corresponds to the fifth switching transistor, has a gate connected to the scanning line 433, one of a source and a drain connected to the gate of the drive transistor 414 and a first electrode which is one of terminals of the electrostatic holding capacitor 418, and the other of the source and the drain connected to a reference power source line 419. The switching transistor 416 has a function of determining the timing for applying a reference voltage $V_{ref}$ of the reference power source line 419 to the gate of the drive transistor 414. It should be noted that the electrostatic holding capacitor 418 corresponds to the fifth capacitive element.

The switching transistor 417, which corresponds to the sixth switching transistor, has a gate connected to the control line 431, one of a source and a drain connected to the other of terminals of the electrostatic holding capacitor 418, and the other of the source and the drain connected to the source of the drive transistor 414. The switching transistor 417 turns OFF in the in the period for writing the signal voltage from the signal line, and thus leak current from the electrostatic holding capacitor 418 to the drive transistor 414 is not generated in such period. Therefore, the switching transistor 417 has a function of causing precise voltages corresponding to the signal voltage to be held in the electrostatic holding capacitor 418. On the other hand, the switching transistor 417 turns ON in the initialization period and thus has a function of setting the source of the drive transistor 414 to the initial potential, and is capable of instantaneously resetting the drive transistor 414 and the organic EL element 413. The switching transistors 415, 416, and 417 are each configured of, for example, an n-type thin film transistor (n-type TFT).

Here, the initialization period is a period for resetting the gate potential and source potential of the drive transistor 414 to the initial potential before a voltage corresponding to a signal voltage is written into the electrostatic holding capacitor 418. Furthermore, the initialization period is set before a threshold voltage detection period described in Embodiments 1 to 4 and consecutively with the threshold voltage detection period, or in place of the threshold voltage detection period.

The control line 431 is connected to the scanning/control line drive circuit 14, and is connected to the respective pixels belonging to the pixel row including the pixel 41A or 41B. With this, the control line 431 has a function of causing conduction or non-conduction between the source of the drive transistor 414 and the second electrode of the electrostatic holding capacitor 418.

Each of the first signal line 451 and the second signal line 452 is connected to the signal line drive circuit 15 and the respective pixels belonging to the pixel column including the pixel 41A or 41B, and has a function of supplying the standard voltage for resetting the drive transistor and the signal voltage which determines light-emitting intensity.

It should be noted that, although not shown in FIG. 21A and FIG. 21B, the power source line 110 and the power source line 112 are a positive power source line and a negative power source line, respectively, and each is also connected to other pixels and to a voltage source. Furthermore, the reference power source line 419 is also connected to the other pixels and is connected to the voltage source of a potential of $V_{ref}$.

Next, the inter-pixel connection relationship of the control line 431, the scanning line 433, the first signal line 451, and the second signal line 452 shall be described.

Figure 22:
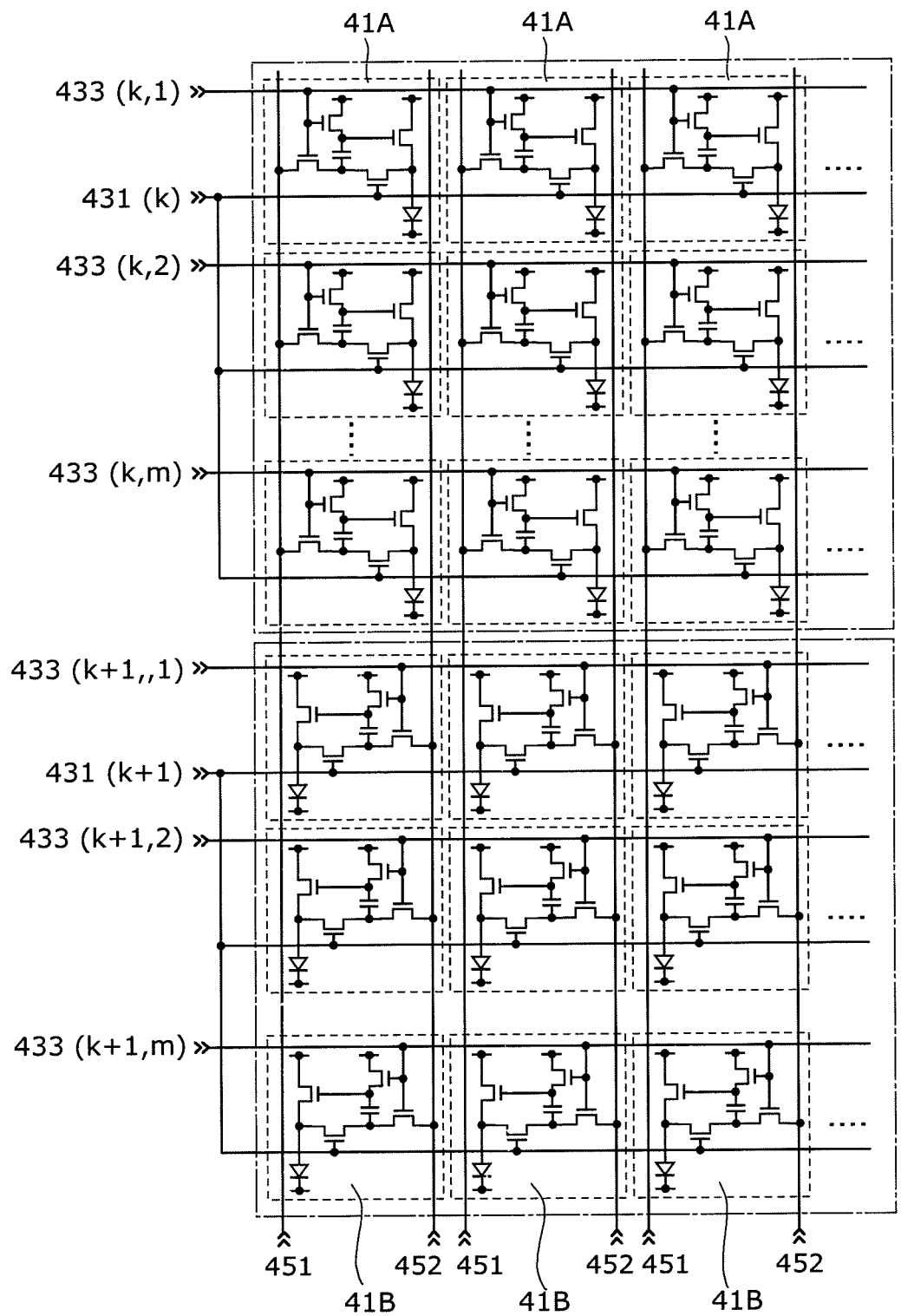
FIG. 22 is a circuit configuration diagram showing part of the display panel included in the display device according to Embodiment 5.

FIG. 22 is a circuit configuration diagram showing part of the display panel included in the display device according to Embodiment 5. The figure shows two adjacent drive blocks and respective control lines, respective scanning lines, and respective signal lines. In the figure and the subsequent description, the respective control lines, respective scanning lines, and respective signal lines shall be represented by "reference number (block number; row number of the block)" or "reference number (block number)".

As previously described, a drive block includes plural pixel rows, and there are two or more drive blocks within the display panel 10. For example, each of the drive blocks shown in FIG. 22 includes m rows of pixel rows.

In the kth drive block shown at the top stage of FIG. 22, the control line 431 (k) is connected in common to the gates of the respective switching transistors 417 included in all the pixels 41A in the drive block. On the other hand, each of the scanning lines 433 (k, 1) to 433 (k, m) are separately connected on a per pixel row basis.

Furthermore, the same connections as those in the kth drive block are also adopted for the (k+1)th drive block shown in the bottom stage of FIG. 22. However, the control line 431(k) connected to the kth drive block and the control line 431(k+1) connected to the (k+1)th drive block are different control lines, and separate control signals are outputted from the scanning/control line drive circuit 14.

Furthermore, in the kth drive block, the first signal line 451 is connected to the other of the source and drain of the respective switching transistors 415 included in all of the pixels 41A in the drive block. Meanwhile, in the (k+1)th drive block, the second signal line 452 is connected to the other of the source and drain of the respective switching transistors 415 included in all of the pixels 41B in the drive block.

With the above-described grouping into drive blocks, the number of control lines 431 for controlling the connection between the source of the respective drive transistors 414 and the second electrode of the respective electrostatic holding capacitors 418 is reduced. Therefore, the number of outputs of the scanning/control line drive circuit 14 which outputs drive signals to these control lines is reduced, thus allowing a reduction in circuit size.

Figure 23:
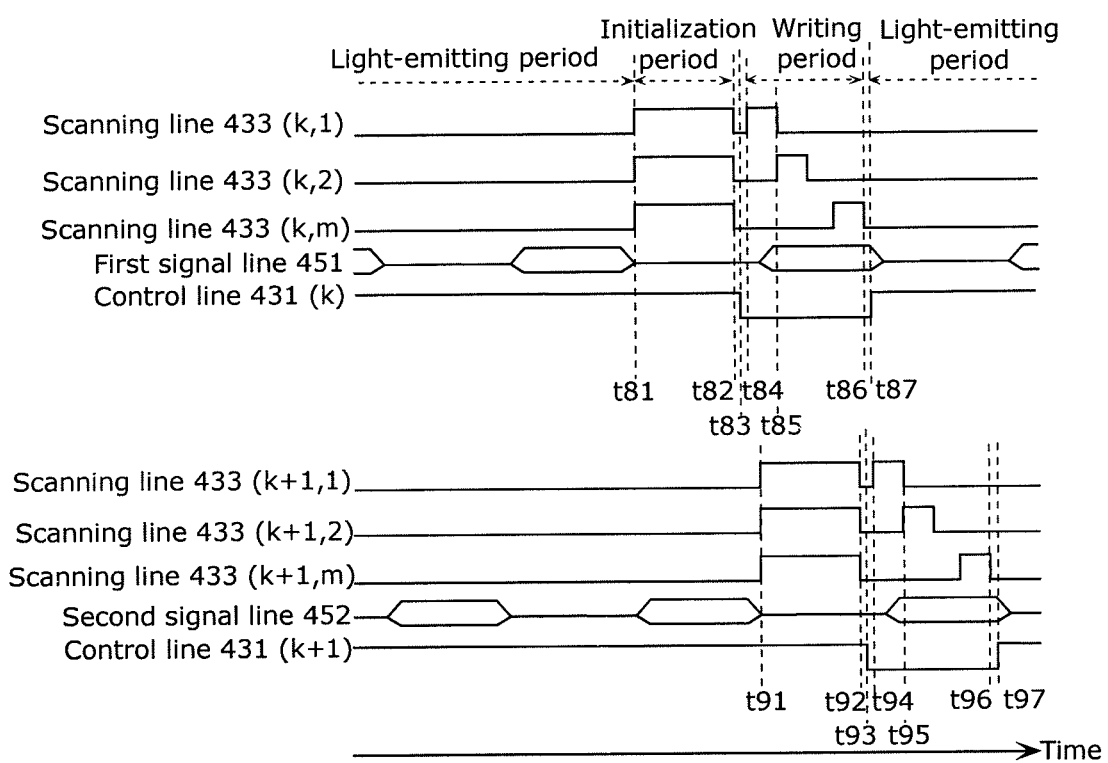
FIG. 23 is an operation timing chart for the driving method of the display device according to Embodiment 5.

Next, the driving method of the display device according to this embodiment shall be described using FIG. 23. It should be noted that, here, the driving method of the display device including the specific circuit configurations shown in FIG. 21A and FIG. 21B shall be described in detail.

Figure 24:
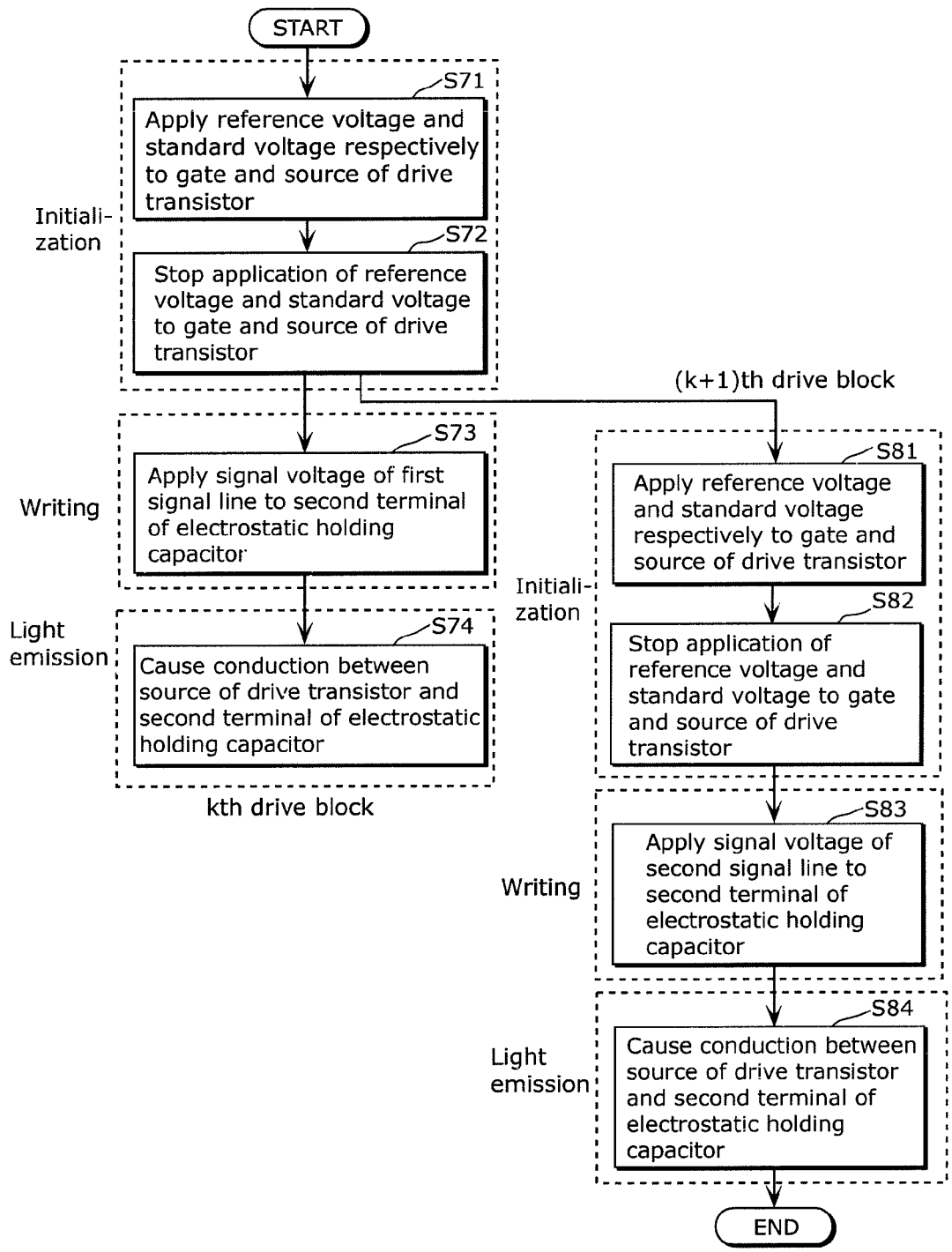
FIG. 24 is an operation flowchart for the display device according to Embodiment 5.

FIG. 23 is an operation timing chart for the driving method of the display device according to Embodiment 5. In the figure, the horizontal axis denotes time. Furthermore, in the vertical direction, the waveform diagrams of the voltage generated in the scanning lines 433 (k, 1), 433 (k, 2), and 433 (k, m), the first signal line 451, and the control line 431(k) of the kth drive block are shown in sequence from the top. Furthermore, continuing therefrom, the waveform diagrams of the voltage generated in the scanning lines 433 (k+1, 1), 433 (k+1, 2), and 433 (k+1, m), the second signal line 452, and the control line 431(k+1) of the (k+1)th drive block are shown. Furthermore, FIG. 24 is an operation flowchart for the display device according to this embodiment.

First, at a time t81, the scanning/control line drive circuit 14 causes the voltage levels of the scanning lines 433 (k, 1) to 433 (k, m) to simultaneously change from LOW to HIGH so as to turn ON the respective switching transistors 415 included in the pixels 41A belonging to the kth drive block. Furthermore, with the aforementioned change in the voltage levels of the scanning lines 433 (k, 1) to 433 (k, m), the respective switching transistors 416 simultaneously turn ON (S71 in FIG. 24). At this time, the voltage level of the control line 431 (k) is already at HIGH, and the switching transistor 417 is already ON. Furthermore, the signal line drive circuit 15 causes the voltage of the first signal line 451 to change from the signal voltage to a standard voltage VR1. With this, the reference voltage $V_{ref}$ of the reference power source 419 is applied to the gate of the drive transistor 414 and the first electrode of the electrostatic holding capacitor 418, and with the conduction of the switching transistor 417, the standard voltage VR1 of the first signal line 451 is applied to the source of the drive transistor 414, the second electrode of the electrostatic holding capacitor 418. In other words, the gate potential and the source potential of the drive transistor 414 are initialized to $V_{ref}$ and VR1, respectively.

Furthermore, since the light emission of the organic EL element 413 is stopped at the time t81, the reference voltage $V_{ref}$ and the standard voltage VR1 are set in advance to satisfy the relationship shown in Expression 16 and Expression 17, respectively.

[MATH. 16]

$$V_{ref} - V_{CAT} < V_{th} + Vt(EL) \qquad \text{Expression 16}$$

[MATH. 17]

$$VR1 - V_{CAT} < Vt(EL) \qquad \text{Expression 17}$$

A numerical example satisfying Expression 16 and Expression 17 is for example, $V_{ref} = V_{CAT} = VR1 = 0$ V.

Here, $V_{th}$ and Vt(EL) are the threshold voltages of the drive transistor 414 and the organic EL element 413 respectively, and $V_{CAT}$ is the cathode voltage of the organic EL element 413. Expression 16 represents a condition under which current does not flow through a current path from the reference power source 419 to the organic EL element 413 to the power source line 112 at the time t81. On the other hand, Expression 17 represents a condition under which current does not flow through a current path from the first signal line 451 to the switching transistor 415 to the switching transistor 417 to the organic EL element 413 to the power source line 112.

As described thus far, at the time t81, the light emission of the respective organic EL elements 413 in the pixels 41A belonging to the kth drive block stops, and the initialization operation for the drive transistors 414 starts.

Next, at a time t82, the scanning/control line drive circuit 14 causes the voltage levels of the scanning lines 433 (k, 1) to 433 (k, m) to simultaneously change from HIGH to LOW so as to turn OFF the respective switching transistors 415 included in the pixels 41A belonging to the kth drive block (S72 in FIG. 24). Furthermore, with the aforementioned change in the voltage levels of the scanning lines 433 (k, 1) to 433 (k, m), the respective switching transistors 416 simultaneously turn OFF. With this, the operation of resetting the drive transistor 414 started from the time t81 ends.

It should be noted that since the characteristics of the gate-source voltage applied to the drive transistor 414 and the drain current include hysteresis, it is necessary to secure the above-described initialization period sufficiently and precisely initialize the gate potential and the source potential. When the threshold voltage correction or writing operation is executed while the initialization period is still insufficient, the fluctuation histories of the threshold voltage or the mobility for each of the pixels remain for a long time due to hysteresis and so on, and thus image luminance unevenness is not sufficiently suppressed, and display deterioration such as after-images cannot be suppressed. Furthermore, by securing a sufficiently long initialization period, the gate potential and the source potential of the drive transistor 414 become steady, and thus a highly-precise resetting operation is realized.

As described thus far, in the period from the time t81 to the time t82, the initialization operation of the drive transistor 414 is performed simultaneously in the kth drive block, and $V_{ref}$ and VR1 which are steady reset voltages are set respectively to the gate and source of the respective drive transistors 414 of all the pixels 41BA in the kth drive block.

Meanwhile, in the period from the time t81 to the time t82, a signal voltage is applied to the second signal line 452 connected to the pixel 41B belonging to the (k+1)th drive block. Here, the first signal line 451 and the second signal line 452 are disposed, for every column that includes m pixels and corresponds to a different one of n columns, in the column direction and corresponding to m pixels 41A and 41B. The first signal line 451 is disposed on the left side of the switching transistor 415 included in the pixels 41A and 41B of the corresponding column, and the second signal line 452 is disposed on the right side of the switching transistor 415 included in the pixels 41A and 41B of the corresponding column. In addition, the first connecting line is disposed so as not to cross with the second signal line 452, and the second connecting line is disposed so as not to cross with the first signal line 451.

Accordingly, as in the display device 1 according to Embodiment 1, parasitic capacitance generated due to the crossing of signal lines is not generated in the display device according to this embodiment.

Therefore, in the period from the time t81 to the time t82, that is, in the threshold voltage detection period of the pixel 41A, the standard voltage supplied to the first signal line 451 is not affected by the signal voltage supplied to the second signal line 452, via the parasitic capacitance generated due to crossing of signal lines. Stated differently, fluctuation of the potential of the first signal line 451 which supplies the standard voltage to the source of the drive transistor 414 can be suppressed.

Therefore, in the display device in this embodiment, the gate potential and the source potential of the drive transistor 414 are not affected by the signal voltage supplied to the second signal line 452 and are thus stabilized, and thus a precise resetting operation can be realized.

Next, at a time t83, the scanning/control line drive circuit 14 causes the voltage level of the control line 431 (k) to change from HIGH to LOW so as to turn OFF the respective switching transistors 417 included in the pixels 41A belonging to the kth drive block. With this, the switching transistor 417 is placed in the non-conducting state in the signal voltage writing period which starts from the time t84, and thereby leak current from the electrostatic holding capacitor 418 to the source of the drive transistor 414 is not generated in such period, and thus a precise voltage corresponding to a signal voltage can be held in the electrostatic holding capacitor 418.

Next, between the time t84 and a time t85, the scanning/control line drive circuit 14 causes the voltage level of the scanning line 433 (k, 1) to change from LOW to HIGH to LOW so as to turn ON the respective switching transistors 415 included in the pixels in the first row (S73 in FIG. 24). Furthermore, with the aforementioned change in the voltage level of the scanning line 433 (k, 1), the respective switching transistors 416 simultaneously turn ON. Furthermore, at this time, the signal line drive circuit 15 causes the voltage of the first signal line 451 to change from the standard voltage to the signal voltage Vdata. With this, the signal voltage Vdata is applied to the second electrode of the electrostatic holding capacitor 418, and the reference voltage $V_{ref}$ of the reference power source line 419 is applied to the gate of the drive transistor 414. A numerical example of Vdata is, for example, Vdata=−5 V to 0 V.

It should be noted that from the time t84 to the time t85, the switching transistor 417 is in the non-conducting state, and the source potential of the drive transistor 414 is maintained at VR1 which is the potential during the initialization period, and thus current for light emission does not flow in the forward direction of the organic EL element 413.

Therefore, a voltage corresponding to the signal voltage Vdata is written into the electrostatic holding capacitor 418 after both electrodes are precisely reset.

Next, in the period up to the time t86, the writing operation from the time t84 to the time t85 is executed, row-by-row sequentially, in the pixels from the second row to the mth row in the kth drive block.

Next, at a time t87, the scanning/control line drive circuit 14 causes the voltage level of the control line 431 (k) to change from LOW to HIGH so as to turn ON the respective switching transistors 417 included in the pixels 41A belonging to the kth drive block (S74 in FIG. 24). At this time, the voltage levels of the scanning lines 433 (k, 1) to 433 (k, m) have already changed from HIGH to LOW, and thus the switching transistors 415 and 416 are in the non-conducting state. Therefore, the voltage held in the electrostatic holding capacitor 418 in the writing period from the time t84 to the time t86 becomes Vgs which is the gate-source voltage of the drive transistor 414, and is expressed using Expression 18.

[MATH. 18]

$$Vgs=(V_{ref}-Vdata) \qquad \text{Expression 18}$$

Here, Vgs is, for example, 0 V to 5 V, and thus the drive transistor 414 turns ON, drain current flows to the organic EL element 413, and the pixels 41A belonging to the kth drive block concurrently emit light according to the Vgs defined in Expression 18.

At this time, the source potential of the drive transistor 414 becomes a potential that is higher than the cathode potential $V_{CAT}$ of the organic EL element 413 by as much as Vt(EL), and is expressed using Expression 19.

[MATH. 19]

$$V_S = Vt(EL) + V_{CAT} \qquad \text{Expression 19}$$

Furthermore, from the Vgs defined in Expression 18 and the source potential defined in Expression 19, the gate potential of the drive transistor 414 is expressed using Expression 20.

[MATH. 20]

$$V_G = (V_{ref} - V\text{data}) + Vt(EL) + V_{CAT} \qquad \text{Expression 20}$$

As described thus far, grouping the pixel rows into drive blocks allows the operation of initializing the drive transistors 414 to be executed simultaneously in the respective drive blocks. Furthermore, grouping the pixel rows into drive blocks allows the control line 431 to be provided in common within the respective drive blocks.

Furthermore, although the scanning lines 433 (k, 1) to 433 (k, m) are separately connected to the scanning/control line drive circuit 14, the timing of the drive pulse in the initialization period is the same. Therefore, the scanning/control line drive circuit 14 can suppress the rising of the frequency of the pulse signals to be outputted, and thus the output load on the drive circuit can be reduced.

As described above, in each of the pixels 41A and 41B included in the display device according to the present disclosure, the switching transistor 416 is added between the gate of the drive transistor 414 and the reference power source line 419, and the switching transistor 417 is added between the source of the drive transistor 414 and the second electrode of the electrostatic holding capacitor 418. With this, the potential in the gate and source of the drive transistor 414 is stabilized, and thus the time from the completion of initialization to the writing of the signal voltage and the time from the writing up to the light emission can be arbitrarily set on a per pixel row basis. With to this circuit configuration, grouping into drive blocks becomes possible, and the threshold voltage correction periods as well as the light-emitting periods can be made uniform within the same drive block.

The comparison of light emission duty defined according to the threshold voltage detection period between the conventional display device using the two signal lines described in PTL 1 and the display device having the drive blocks according to the present disclosure, is performed in the same manner as in Embodiment 1.

The driving method of the display device 1 according to the present embodiment shall be described once again.

On the other hand, the initialization operation for the drive transistors 414 in the (k+1)th drive block is started immediately after the time t84 at which the initialization period for the drive transistors 414 in the kth drive block is completed and the writing period is started.

From the same perspective as Embodiment 1, this embodiment also has the advantage that light emission duty can be secured longer compared to the conventional display device using two signal lines disclosed in PTL 1.

Therefore, it is possible to realize a display device that ensures sufficient light-emitting luminance and has long operational life due to reduced output load on drive circuits.

Furthermore, it can be seen that when the same light emission duty is set to the conventional display device using two signal lines and the display device combining block driving as in the present disclosure, the display device according to one or more exemplary embodiments ensures a longer initialization period for initializing the gate potential and the source potential of the drive transistor 414.

It should be noted that the operation of the (k+1)th block from a time t91 to a time 96 is the same as the above-described operation of the kth drive block, and thus description thereof shall be omitted.

Furthermore, since parasitic capacitance generated due to the crossing of signal lines is likewise not generated, Embodiment 5 is also capable of suppressing unnecessary power consumption in the same manner as Embodiment 1. In addition, since the fluctuation of the standard voltage VR1 in the initialization period can be suppressed, the gate potential and source potential of the drive transistor 414 are not affected by the signal voltage supplied to the second signal line 452 and thus become stable, and a precise resetting operation is realized.

The operations described thus far are also executed sequentially in the (k+2)th drive block onward in the display panel 10.

It should be noted that since the state transition diagram of drive blocks which emit light according to the driving method according this embodiment is the same as the state transition diagram shown in FIG. 8, description thereof shall be omitted.

As described thus far, the drive transistor 414 initialization periods as well as the timings thereof can also be made uniform within the same drive block in Embodiment 5 through the pixel circuit provided with the switching transistors 416 and 417, the disposition of control lines, scanning lines, and signal lines to the respective pixels that have been grouped into drive blocks, and through the above-described driving method. Therefore, the load on the scanning/control line drive circuit 14 which outputs signals for controlling current paths, and on the signal line drive circuit 15 which controls signal voltages is reduced. In addition, through the above-described grouping into drive blocks and the two signal lines arranged for every pixel column, the initialization period of the drive transistor 414 can occupy a large part of a 1 frame period Tf which is the time in which all the pixels are refreshed. This is because the initialization period is provided in the (k+1)th drive block in the period in which the luminance signal is sampled in the kth drive block. Therefore, the initialization period is not divided on a per pixel row basis, but is divided on a per drive block basis. Thus, even when the display area is increased, a long relative threshold voltage correction period with respect to a 1 frame period can be set without a significant increase in the number of outputs of the scanning/control line drive circuit 14 and without reducing light emission duty. With this, a drive current based on a precisely corrected signal voltage flows to the light-emitting elements, and thus display quality improves.

For example, in the case where the display panel 10 is divided into N drive blocks, the initialization period allocated to each pixel is at most Tf/N. In contrast, in the case where the initialization period is set at a different timing for each of the pixel rows, and it is assumed that there are M rows of pixel rows (M>>N), the initialization period allocated to each pixel is at most Tf/M. Furthermore, even in the case where two signal lines are disposed for each pixel column as disclosed in PTL 1, the initialization period allocated to each pixel is at most 2 Tf/M.

Furthermore, with the above-described grouping into drive blocks, the control line for controlling the conduction between the source of the drive transistor 414 and the second electrode of the electrostatic holding capacitor 418 can be provided in common within the respective drive blocks. Therefore, the number of control lines outputted from the scanning/control line drive circuit 14 is reduced. Therefore, the load on the drive circuit is reduced.

For example, in the conventional display device 500 disclosed in PTL 1, two control lines (a power supply line and a scanning line) are disposed per pixel row. Assuming that the display device 500 includes M rows of pixel rows, the control lines would total 2M lines.

In contrast, in the display device 1 according to one or more exemplary embodiments, one scanning line per pixel row and one control line per drive block are outputted from the scanning/control line drive circuit 14. Therefore, assuming that the display device 1 includes M rows of pixel rows, the control lines (including scanning lines) would total (M+N) lines.

Since M>>N is realized in the case where surface area is enlarged and the number of pixel rows is large, in such case, the number of control lines in the display device 1 according to the embodiments can be reduced to approximately half compared to the number of control lines in the conventional display device 500.

Although Embodiments 1 to 5 have been described thus far, the display device according to one or more exemplary embodiments is not limited to the above-described embodiments. The present disclosure includes other embodiments implemented through a combination of arbitrary components of Embodiments 1 to 5, or modifications obtained through the application of various modifications to Embodiments 1 to 5 that may be conceived by a person of ordinary skill in the art, that do not depart from the essence of the present disclosure, or various devices in which the display device according to one or more exemplary embodiments is built into.

It should be noted that although the switching transistors in the above-described embodiments have been described as n-type transistors which turn ON when the voltage level of the gate of switching transistor is HIGH, grouping into drive blocks described in the embodiments can also be applied to pixels in which the switching transistors are configured of p-type transistors, and the same advantageous effects as those in the above-described embodiments are produced.

For example, in Embodiment 5, the drive transistor 414 and the switching transistors 415, 416, and 417 in the pixel 41A shown in FIG. 21A may be implemented by p-type transistors, the power source line 110 may be a negative-voltage power source line, the power source line 112 may be a positive-voltage power source line, and an organic EL element may be connected between the drain of the drive transistor and the power source line 110, in place of the organic EL element 413, so that the direction from the drive transistor toward the power source line 110 becomes the forward direction. The same applies to the pixel 41B shown FIG. 21B. Furthermore, in the operation timing chart in FIG. 23, the polarity of the scanning lines may be reversed. Such a display device produces the same advantageous effects as that of Embodiment 5.

For example, although the kth drive block corresponds to all of the odd drive blocks and the (k+1)th drive block corresponds to all of the even drive blocks in the respective embodiments described above, the configuration is not limited to such. For example, three drive blocks may form one set, and among the three drive blocks (for example, a (k−1)th drive block, a kth drive block, and a (k+1)th drive block), the (k−1)th drive block and the kth drive block may be composed of the pixels 11A described earlier, and the (k+1)th drive block may be composed of the pixels 11B described earlier. Furthermore, it is also acceptable to have only the pixels in a part of the display region being grouped into drive blocks.

Figure 25:
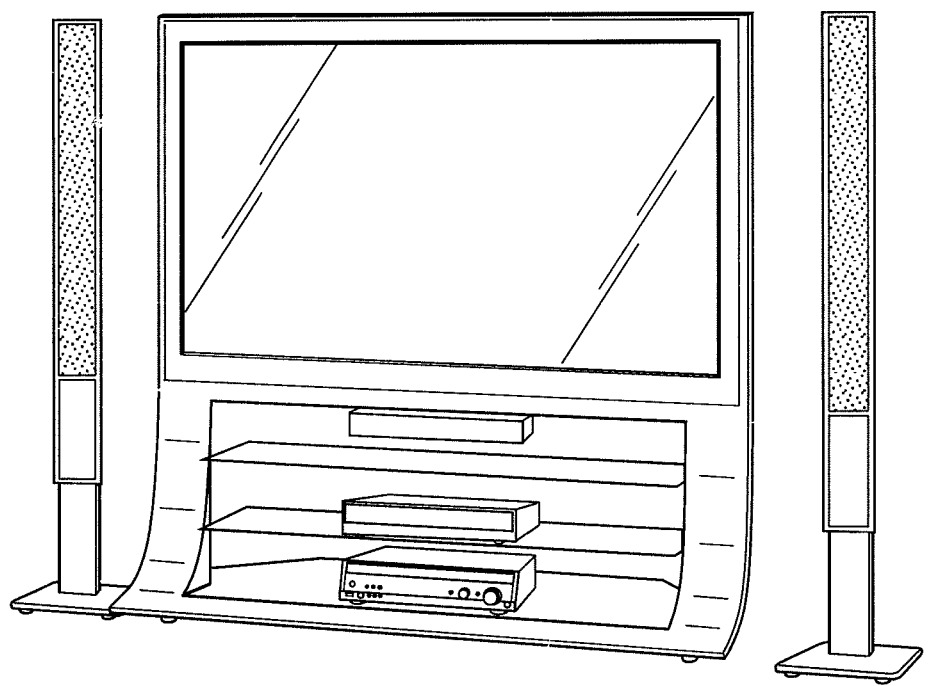
FIG. 25 is an outline view of a thin, flat TV in which a display device according to one or more exemplary embodiments is built into.

Furthermore, for example, a display device according to one or more exemplary embodiments is built into a thin flat-screen TV such as that shown in FIG. 25. A thin flat-screen TV capable of precise image display reflecting a video signal is implemented by having the display device according to one or more exemplary embodiments built into the TV.

Each of the structural elements in each of the above-described embodiments may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The display device and the method of controlling the same according to one or more exemplary embodiments disclosed herein are particularly useful as an active-type organic EL flat panel display which causes luminance to fluctuate by controlling pixel light-emitting intensity according to a pixel signal current, and as a method of controlling the active-type organic EL flat panel display.

The invention claimed is:

1. A display device including pixels arranged in a matrix having m rows and n columns, m being an integer greater than or equal to 4, and n being an integer greater than or equal to 1, the display device comprising:
a first signal line and a second signal line that are disposed, in a column direction, corresponding to every m pixels that correspond to the respective n columns in the matrix, the first signal line and the second signal line being for applying, to the pixels, a signal voltage which determines luminance of the pixels, and the m pixels being included in the pixels,
a first power source line and a second power source line; and
a scanning line disposed in each of the rows,
wherein the pixels compose at least two drive blocks each of which includes at least two of the rows,
each of the pixels includes:
a light-emitting element that includes terminals, one of the terminals being connected to the second power source line, and the light-emitting element emitting light according to a flow of a signal current corresponding to the signal voltage; and
a current control unit connected to the first power source line and the other of the terminals of the light-emitting element, and configured to convert the signal voltage into the signal current,
each of the pixels in a kth drive block of the drive blocks further includes a first switching transistor that includes a gate connected to the scanning line, one of a source and drain connected to the first signal line via a first connecting line, and the other of the source and the drain connected to the current control unit, the first switching transistor switchably interconnecting the first signal line and the current control unit, k being a positive integer, each of the pixels in a (k+1)th drive block of the drive blocks further includes a second switching transistor that includes a gate connected to the scanning line, one of a source and a drain connected to the second signal line via a second connecting line, and the other of the source and the drain connected to the current control unit, the second switching transistor switchably interconnecting the second signal line and the current control unit, the first signal line is disposed on one of the left side and the right side of the first switching transistor and the second switching transistor included in the pixels in the corresponding column, the second signal line is disposed on the other of the left side and the right side of the first switching transistor and the second switching transistor included in the pixels in the corresponding column, the first connecting line is disposed without crossing with the second signal line, the second connecting line is disposed without crossing with the first signal line, at least one of a threshold voltage detection period and an initialization period is provided in common for the pixels in a same one of the drive blocks, and at least one of the threshold voltage detection period and the initialization period provided in common in the same one of the drive blocks is provided independently for the pixels in different ones of the drive blocks, the threshold voltage detection period being a period during which a threshold voltage of the current control unit is detected, and the initialization period being a period during which the current control unit is initialized, in an ith column in the matrix, where i is an integer satisfying $1 \leq i \leq n-1$:

the first signal line is disposed on the one of the left side and the right side of the first switching transistor and the second switching transistor included in the pixels in the corresponding column; and the second signal line is disposed on the other of the left side and the right side of the first switching transistor and the second switching transistor included in the pixels in the corresponding column, and in an (i+1)th column in the matrix:

the first signal line is disposed on the other of the left side and the right side of the first switching transistor and the second switching transistor included in the pixels in the corresponding column; and the second signal line is disposed on the one of the left side and the right side of the first switching transistor and the second switching transistor included in the pixels in the corresponding column.

2. The display device according to claim 1, further comprising a first control line disposed in each of the rows, and connected to the current control unit, wherein the first control line is connected to the pixels in the same one of the drive blocks and not connected to the pixels in the different ones of the drive blocks.

3. The display device according to claim 2, further comprising a second control line disposed in each of the rows, and connected to the current control unit, wherein the current control unit includes:

a drive transistor that includes a gate, a source, and a drain, one of the source and the drain being connected to the other of the terminals of the light-emitting element, and the drive transistor converting the signal voltage applied between the gate and the source of the drive transistor into the signal current which is a drain current of the drive transistor;

a first capacitive element that includes terminals, one of the terminals being connected to the gate of the drive transistor, and the other of the terminals being connected to the source of the drive transistor;

a second capacitive element that includes terminals, one of the terminals being connected to the source of the drive transistor, and the other of the terminals being connected to the first control line; and a third switching transistor that includes a gate connected to the second control line, and a source and a drain that are inserted between and connected to the first power source line and the other of the terminals of the light-emitting element, and switches between ON and OFF states of the drain current of the drive transistor, the gate of the first switching transistor is connected to the scanning line, the one of the source and the drain of the first switching transistor is connected to the first signal line, and the other of the source and the drain of the first switching transistor is connected to the gate of the drive transistor, and the gate of the second switching transistor is connected to the scanning line, the one of the source and the drain of the second switching transistor is connected to the second signal line, and the other of the source and the drain of the second switching transistor is connected to the gate of the drive transistor.

4. The display device according to claim 3, wherein the second control line is connected to the pixels in the same one of the drive blocks and not connected to the pixels in the different ones of the drive blocks.

5. The display device according to claim 2, further comprising a second control line disposed in each of the rows, and connected to the current control unit, wherein the current control unit includes:

a drive transistor that includes a gate, a source, and a drain, one of the source and the drain being connected to the other of the terminals of the light-emitting element, and the drive transistor converting the signal voltage applied between the gate and the source of the drive transistor into the signal current which is a drain current of the drive transistor;

a third capacitive element that includes terminals, one of the terminals being connected to the gate of the drive transistor, and the other of the terminals being connected to the source of the drive transistor;

a fourth capacitive element that includes terminals, one of the terminals being connected to the source of the drive transistor, and the other of the terminals being connected to the first control line; and a fourth switching transistor that includes a gate connected to the second control line, one of a source and a drain connected to the other of the terminals of the third capacitive element, and the other of the source and drain connected to the source of the drive transistor, the gate of the first switching transistor is connected to the scanning line, the one of the source and the drain of the first switching transistor is connected to the first signal line, and the other of the source and the drain of the first switching transistor is connected to the gate of the drive transistor, and the gate of the second switching transistor is connected to the scanning line, the one of the source and the drain of the second switching transistor is connected to the second signal line, and the other of the source and the drain of the second switching transistor is connected to the gate of the drive transistor.

6. The display device according to claim 2, wherein the current control unit includes:

a drive transistor that includes a gate, a source, and a drain, one of the source and the drain being connected to the first power source line, the other of the source and the drain being connected to the other of the terminals of the light-emitting element, and the drive transistor converting the signal voltage applied between the gate and the source of the drive transistor into the signal current;

a fifth capacitive element that includes terminals, one of the terminals being connected to the gate of the drive transistor;

a fifth switching transistor that includes a gate connected to the scanning line, one of a source and a drain connected to the one of the terminals of the fifth capacitive element, and the other of the source and drain connected to a reference power source line; and a sixth switching transistor that includes a gate connected to the first control line, one of a source and a drain connected to the other of the terminals of the fifth capacitive element, and the other of the source and drain connected to the source of the drive transistor, the gate of the first switching transistor is connected to the scanning line, the one of the source and the drain of the first switching transistor is connected to the other of the terminals of the fifth capacitive element, and the other of the source and the drain of the first switching transistor is connected to the first signal line, and the gate of the second switching transistor is connected to the scanning line, the one of the source and the drain of the second switching transistor is connected to the other of the terminals of the fifth capacitive element, and the other of the source and the drain of the second switching transistor is connected to the second signal line.

7. The display device according to claim 1, wherein the first power source line is disposed in each of the rows, and applies a first voltage and a second voltage, the first voltage being a voltage lower than a standard voltage for initializing the current control unit, and the second voltage being a voltage higher than the standard voltage, the current control unit includes:

a drive transistor that includes a gate, a source, and a drain, one of the source and the drain being connected to the other of the terminals of the light-emitting element, the other of the source and the drain being connected to the first power source line, and the drive transistor converting the signal voltage applied between the gate and the source of the drive transistor into the signal current which is a drain current of the drive transistor;

a sixth capacitive element that includes terminals, one of the terminals being connected to the gate of the drive transistor, the other of the terminals being connected to the one of the source and the drain of the drive transistor, the sixth capacitive element holding at least a voltage corresponding to the signal voltage or the standard voltage, the gate of the first switching transistor is connected to the scanning line, the one of the source and the drain of the first switching transistor is connected to the first signal line, and the other of the source and the drain of the first switching transistor is connected to the gate of the drive transistor, the gate of the second switching transistor is connected to the scanning line, the one of the source and the drain of the second switching transistor is connected to the second signal line, and the other of the source and the drain of the second switching transistor is connected to the gate of the drive transistor, and the display device further comprises a voltage control unit configured to control application of the first voltage and the second voltage in at least one of the threshold voltage detection period and the initialization period with a first timing which is the same for the pixels in the same one of the drive blocks, and control the application of the first voltage and the second voltage with a second timing different from the first timing for the pixels in different ones of the drive blocks.

8. The display device according to claim 1, wherein the light-emitting element is an electroluminescence (EL) element that emits light according to the signal voltage.

\* \* \* \* \*